United States Patent
Feng et al.

(10) Patent No.: US 12,211,449 B2
(45) Date of Patent: Jan. 28, 2025

(54) DISPLAY PANEL AND DISPLAY APPARATUS

(71) Applicants: Hefei BOE Joint Technology Co.,Ltd., Anhui (CN); BOE TECHNOLOGY GROUP CO., LTD., Beijing (CN)

(72) Inventors: Xuehuan Feng, Beijing (CN); Yongqian Li, Beijing (CN); Pan Xu, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/802,580

(22) PCT Filed: Apr. 1, 2021

(86) PCT No.: PCT/CN2021/084866
§ 371 (c)(1),
(2) Date: Oct. 6, 2022

(87) PCT Pub. No.: WO2022/205285
PCT Pub. Date: Oct. 6, 2022

(65) Prior Publication Data
US 2024/0203357 A1    Jun. 20, 2024

(51) Int. Cl.
*G09G 3/3266* (2016.01)

(52) U.S. Cl.
CPC ... *G09G 3/3266* (2013.01); *G09G 2300/0426* (2013.01); *G09G 2300/0842* (2013.01); *G09G 2310/0286* (2013.01); *G09G 2310/08* (2013.01)

(58) Field of Classification Search
CPC . G09G 3/3266; G09G 2300/0426; G09G 3/32
See application file for complete search history.

(56) References Cited

U.S. PATENT DOCUMENTS

| | | |
|---|---|---|
| 2012/0176299 A1 | 7/2012 | Kang et al. |
| 2014/0117320 A1 | 5/2014 | Jung |

(Continued)

FOREIGN PATENT DOCUMENTS

| | | |
|---|---|---|
| CN | 103489879 A | 1/2014 |
| CN | 107065336 A | 8/2017 |

(Continued)

*Primary Examiner* — Xuemei Zheng
(74) *Attorney, Agent, or Firm* — Dority & Manning, P.A.

(57) ABSTRACT

A display panel has a display area and a fan-out region. The display panel includes: a substrate; a scan driving circuit including shift registers and clock signal lines, sub-pixels and signal transmission lines that are located in the display area; and a power supply voltage bus and connection lines that are located in the fan-out region. The sub-pixels are arranged in rows and columns, sub-pixels in a column are arranged along a second direction. A signal transmission line is electrically connected to column(s) of sub-pixels. The connection lines include first connection sub-lines, second connection sub-lines and third connection sub-lines that extend along the second direction and are located away from the sub-pixels. A first connection sub-line, a second connection sub-line and a third connection sub-line are electrically connected to the signal transmission line, the power supply voltage bus, and a clock signal line, respectively.

20 Claims, 16 Drawing Sheets

(56) References Cited

U.S. PATENT DOCUMENTS

| | | | |
|---|---|---|---|
| 2017/0287381 A1* | 10/2017 | Park | .................... G02F 1/13454 |
| 2020/0219962 A1 | 7/2020 | Park et al. | |
| 2020/0243021 A1 | 7/2020 | Li et al. | |
| 2021/0036067 A1* | 2/2021 | Kim | ..................... H10K 59/122 |
| 2021/0167094 A1* | 6/2021 | Liu | ........................ G11C 19/38 |
| 2021/0201837 A1* | 7/2021 | Kuo | ..................... G09G 3/3677 |
| 2021/0241698 A1 | 8/2021 | Kim et al. | |
| 2021/0327383 A1 | 10/2021 | He | |
| 2022/0102461 A1 | 3/2022 | Yuan et al. | |
| 2022/0406875 A1 | 12/2022 | Zhang et al. | |

FOREIGN PATENT DOCUMENTS

| | | |
|---|---|---|
| CN | 107331295 A | 11/2017 |
| CN | 110718577 A | 1/2020 |
| CN | 111243485 A | 6/2020 |

\* cited by examiner

DISPLAY PANEL AND DISPLAY APPARATUS

CROSS-REFERENCE TO RELATED APPLICATION

This application is a national phase entry under 35 USC 371 of International Patent Application No. PCT/CN2021/084866, filed on Apr. 1, 2021, which is incorporated herein by reference in its entirety.

TECHNICAL FIELD

The present disclosure relates to the field of display technologies, and in particular, to a display panel and a display apparatus.

BACKGROUND

A scan driving circuit is an important component of a display apparatus. The scan driving circuit may include a plurality of shift registers that are cascaded, and each shift register may be electrically connected to a wire in the display apparatus. The scan driving circuit may input scan signals to wires (e.g., gate lines or enable signal lines) in the display apparatus row by row, so that the display apparatus may display an image.

By arranging the scan driving circuit in the display apparatus, it may be possible to effectively reduce costs and improve a yield.

SUMMARY

In an aspect, a display panel is provided. The display panel has a display area and a fan-out region located on a side of the display area. The display panel includes: a substrate; a plurality of sub-pixels and a plurality of signal transmission lines located in the display area; a scan driving circuit; a power supply voltage bus located in the fan-out region; and a plurality of connection lines located in the fan-out region. The plurality of sub-pixels are arranged in a plurality of rows and a plurality of columns, sub-pixels in a row are arranged along a first direction, and sub-pixels in a column are arranged along a second direction. A signal transmission line is electrically connected to at least one column of sub-pixels. The scan driving circuit includes a plurality of shift registers and a plurality of clock signal lines that are located in the display area. The power supply voltage bus extends along the first direction. The plurality of connection lines, the plurality of sub-pixels, the plurality of signal transmission lines, the scan driving circuit and the power supply voltage bus are located on a same side of the substrate, and the plurality of connection lines extend along the second direction and are located closer to a side of the fan-out region away from the display area the power supply voltage bus. The plurality of connection lines include a plurality of first connection sub-lines, a plurality of second connection sub-lines and a plurality of third connection sub-lines. A first connection sub-line in the plurality of connection lines is electrically connected to the signal transmission line, a second connection sub-line in the plurality of second connection sub-lines is electrically connected to the power supply voltage bus, and a third connection sub-line in the plurality of third connection sub-lines is electrically connected to a clock signal line in the plurality of clock signal lines.

In some embodiments, the display panel includes: a first light-transmissive layer, a first metal layer, a second metal layer and a second light-transmissive layer that are stacked in sequence. The first light-transmissive layer includes first terminals of storage capacitors in the plurality of sub-pixels. The first metal layer includes: control electrodes of transistors in the plurality of sub-pixels, the power supply voltage bus, control electrodes of transistors in the plurality of shift registers, and at least one first connection sub-line in the plurality of first connection sub-lines. The second metal layer includes: first electrodes and second electrodes of the transistors in the plurality of sub-pixels, the plurality of signal transmission lines, first electrodes and second electrodes of the transistors in the plurality of shift registers, and another at least one first connection sub-line in the plurality of first connection sub-lines. The second light-transmissive layer includes anodes or cathodes of light-emitting devices in the plurality of sub-pixels.

In some embodiments, in a direction perpendicular to a thickness direction of the substrate and the second direction, at least a portion of the third connection sub-line is located in a gap between two adjacent first connection sub-lines.

In some embodiments, the first light-transmissive layer further includes at least one third connection sub-line in the plurality of third connection sub-lines, and the third connection sub-line is included in the at least one third connection sub-line.

In some embodiments, the portion of the third connection sub-line is located in the gap between the two adjacent first connection sub-lines; an orthographic projection of the third connection sub-line on the substrate partially overlaps with at least one orthographic projection of at least one first connection sub-line in the two adjacent first connection sub-lines on the substrate.

In some embodiments, a dimension of an overlapping portion, in the first direction, of the orthographic projection of the third connection sub-line on the substrate and an orthographic projection of one first connection sub-line of the two adjacent first connection sub-lines on the substrate is less than or equal to $\frac{1}{5}$ of a dimension of the orthographic projection, in the first direction, of the one first connection sub-line on the substrate.

In some embodiments, the second metal layer further includes at least one third connection sub-line in the plurality of third connection sub-lines, and the third connection sub-line is included in the at least one third connection sub-line. An orthographic projection of the third connection sub-line on the substrate and an orthographic projection of each of the two adjacent first connection sub-lines on the substrate do not overlap and have a distance therebetween.

In some embodiments, the two adjacent first connection sub-lines are respectively located in a first metal layer and the second metal layer; a distance between the orthographic projection of the third connection sub-line on the substrate and an orthographic projection of a first connection sub-line located in the second metal layer on the substrate is greater than a distance between the orthographic projection of the third connection sub-line on the substrate and an orthographic projection of a first connection sub-line located in the first metal layer on the substrate.

In some embodiments, the distance between the orthographic projection of the third connection sub-line on the substrate and the orthographic projection of the first connection sub-line located in the second metal layer on the substrate is greater than or equal to 4 µm. The distance between the orthographic projection of the third connection sub-line on the substrate and the orthographic projection of the first connection sub-line located in the first metal layer on the substrate is greater than or equal to 1 µm.

In some embodiments, a dimension of the second connection sub-line in the first direction is 1.5 times to 2.5 times a dimension of the first connection sub-line in the first direction.

In some embodiments, the second light-transmissive layer further includes at least one third connection sub-line in the plurality of third connection sub-lines. In a thickness direction of the substrate, a distance between the first light-transmissive layer and the second metal layer is less than a distance between the second metal layer and the second light-transmissive layer.

In some embodiments, the display panel further includes: a buffer layer and a gate insulating layer that are disposed between the first light-transmissive layer and the second metal layer and stacked in sequence; and a passivation layer and a planarization layer that are disposed between the second metal layer and the second light-transmissive layer. A sum of thicknesses of the buffer layer and the gate insulating layer is less than a sum of thicknesses of the passivation layer and the planarization layer.

In some embodiments, the sum of the thicknesses of the passivation layer and the planarization layer is greater than or equal to twice the sum of the thicknesses of the buffer layer and the gate insulating layer.

In some embodiments, a dimension of the second connection sub-line in the first direction is 3 times to 5 times a dimension of the first connection sub-line in the first direction.

In some embodiments, in the first direction, the at least one first connection sub-line located in the first metal layer and the at least one first connection sub-line located in the second metal layer are alternately arranged in sequence.

In some embodiments, orthographic projections of any two adjacent first connection sub-lines on the substrate do not overlap.

In some embodiments, the second metal layer further includes at least one second connection sub-line in the plurality of second connection sub-lines. At least one orthographic projection of the at least one second connection sub-line on the substrate and orthographic projections of the plurality of first connection sub-lines on the substrate do not overlap, and a distance exists between an orthographic projection of a second connection sub-line in the at least one second connection sub-line on the substrate and an orthographic projection of an adjacent first connection sub-line on the substrate.

In some embodiments, at least one third connection sub-line is not located in the second metal layer. An orthographic projection of a third connection sub-line in the at least one third connection sub-line on the substrate partially overlaps an orthographic projection of the second connection sub-line on the substrate.

In some embodiments, the plurality of signal transmission lines include a plurality of data lines and a plurality of sensing lines, and the plurality of first connection sub-lines include a plurality of data connection lines and a plurality of sensing connection lines. A data connection line in the plurality of data connection lines is electrically connected to a data line in the plurality of data lines, and a sensing connection line in the plurality of sensing connection lines is electrically connected to a sensing line in the plurality of sensing lines. At least two data connection lines in the plurality of data connection lines are disposed between any two adjacent sensing connection lines in the plurality of sensing connection lines.

In some embodiments, a shift register in the plurality of shift registers is electrically connected to at least one row of sub-pixels. The shift register includes a plurality of device groups, a device group in the plurality of device groups is located in a region between two adjacent sub-pixels in the at least one row of sub-pixels, and the device group includes at least one transistor and/or at least one capacitor. The clock signal line is electrically connected to at least one shift register, and the clock signal line is located between two adjacent columns of sub-pixels.

In another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, and are not limitations on actual sizes of products involved in the embodiments of the present disclosure.

DETAILED DESCRIPTION

Figure 1:
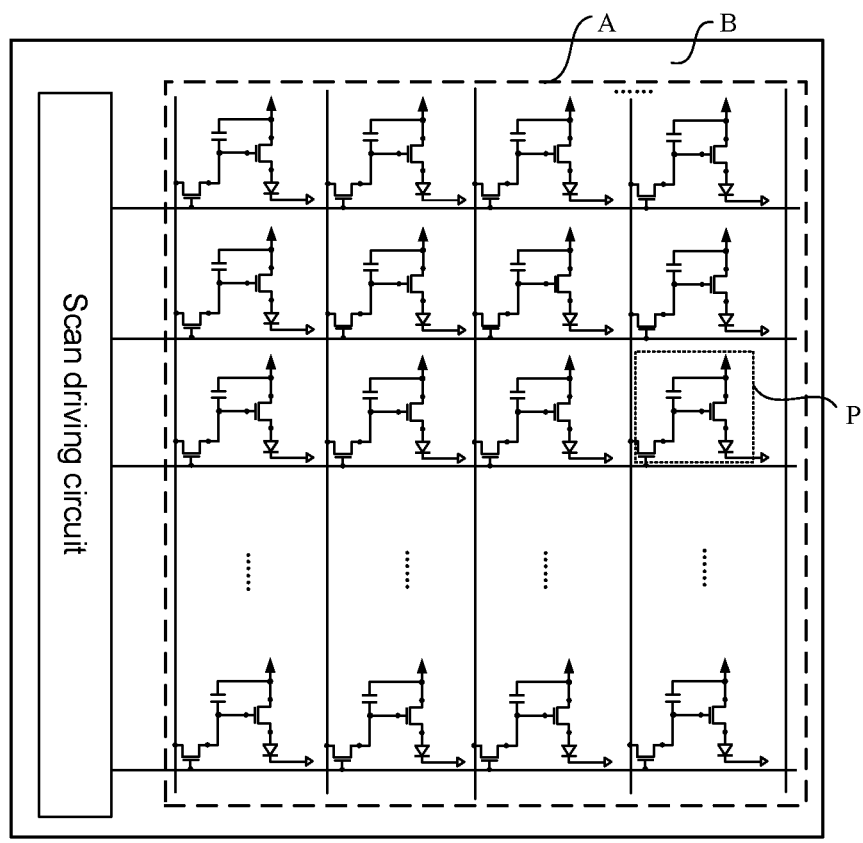
FIG. 1 is a structural diagram of a display panel, in accordance with an implementation.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

As used herein, the term "about" or "substantially" includes a stated value and an average value within an acceptable range of deviation of a particular value. The acceptable range of deviation is determined by a person of ordinary skill in the art in view of the measurement in question and the errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions of a device, and are not intended to limit the scope of the exemplary embodiments.

Transistors in circuits provided in the embodiments of the present disclosure may be thin film transistors, field effect transistors (e.g., oxide thin film transistors) or other switching devices with same properties, and the embodiments of the present disclosure are described by taking an example of the thin film transistors.

In some embodiments, a control electrode of each transistor in a shift register is a gate electrode of the transistor, a first electrode of the transistor is one of a source and a drain of the transistor, and a second electrode of the transistor is the other one of the source and the drain of the transistor. Since the source and the drain of the transistor may be symmetrical in structure, the source and the drain thereof may be indistinguishable in structure. That is, the first electrode and the second electrode of the transistor in the embodiments of the present disclosure may be indistinguishable in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided in embodiments of the present disclosure, nodes such as a pull-up node and a pull-down node do not represent real components, but rather represent junctions of related electrical connections in a circuit diagram. That is, these nodes are equivalent nodes of the junctions of the related electrical connections in the circuit diagram.

In the embodiments of the present disclosure, the term "pull-up" refers to charging a node or an electrode of a transistor, so that an absolute value of a level of the node or the electrode is increased; as a result, an operation (e.g., a turned-on operation) of a corresponding transistor is achieved. The term "pull-down" refers to discharging a node or an electrode of a transistor, so that an absolute value of a level of the node or the electrode is reduced; as a result, an operation (e.g., a turned-off operation) of a corresponding transistor is achieved.

The circuits provided in the embodiments of the present disclosure are described below by considering an example in which transistors are all N-type transistors.

Some embodiments of the present disclosure provide a display panel and a display apparatus, each of which is described below.

Figure 2:
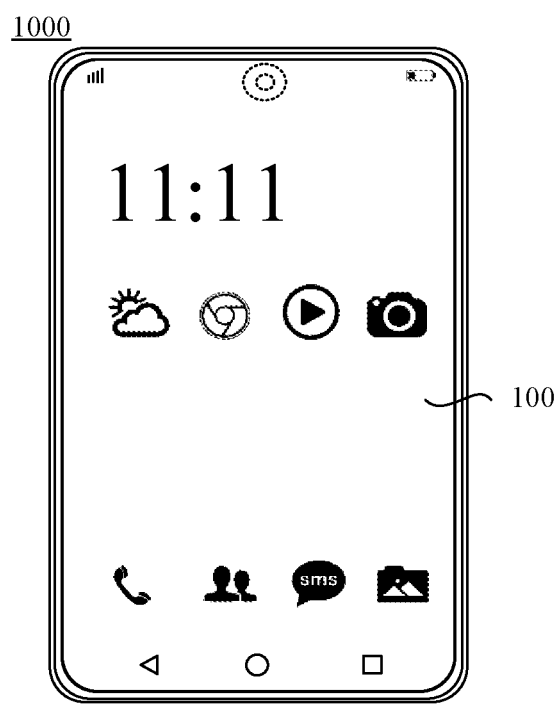
FIG. 2 is a structural diagram of a display apparatus, in accordance with some embodiments of the present disclosure.

As shown in FIG. 2, some embodiments of the present disclosure provide the display apparatus 1000. The display apparatus 1000 may be any apparatus that displays an image whether in motion (e.g., a video) or stationary (e.g., a still image), and whether literal or graphical. More specifically, it is anticipated that the embodiments may be implemented in or associated with a variety of electronic devices. The variety of electronic devices include (but not limit to), for example, mobile telephones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, automobile displays (such as odometer displays), navigators, cockpit controllers and/or displays, camera view displays (e.g., rear view camera displays in a vehicle), electronic photos, electronic billboards or signages, projectors, architectural structures, packaging and aesthetic structures (e.g., displays for displaying an image of a piece of jewelry).

In some examples, the display apparatus 1000 includes a frame, and a display panel 100, a circuit board, a display driver integrated circuit (IC) and other electronic accessories that are disposed in the frame.

The display panel 100 may be, for example, an organic light-emitting diode (OLED) display panel, a quantum dot light-emitting diode (QLED) display panel, a micro light-emitting diode (Micro LED) display panel or a mini light-emitting diode (Mini LED), which is not specifically limited in the present disclosure.

Some embodiments of the present disclosure are schematically described below by considering an example in which the display panel 100 is the OLED display panel.

Figure 3:
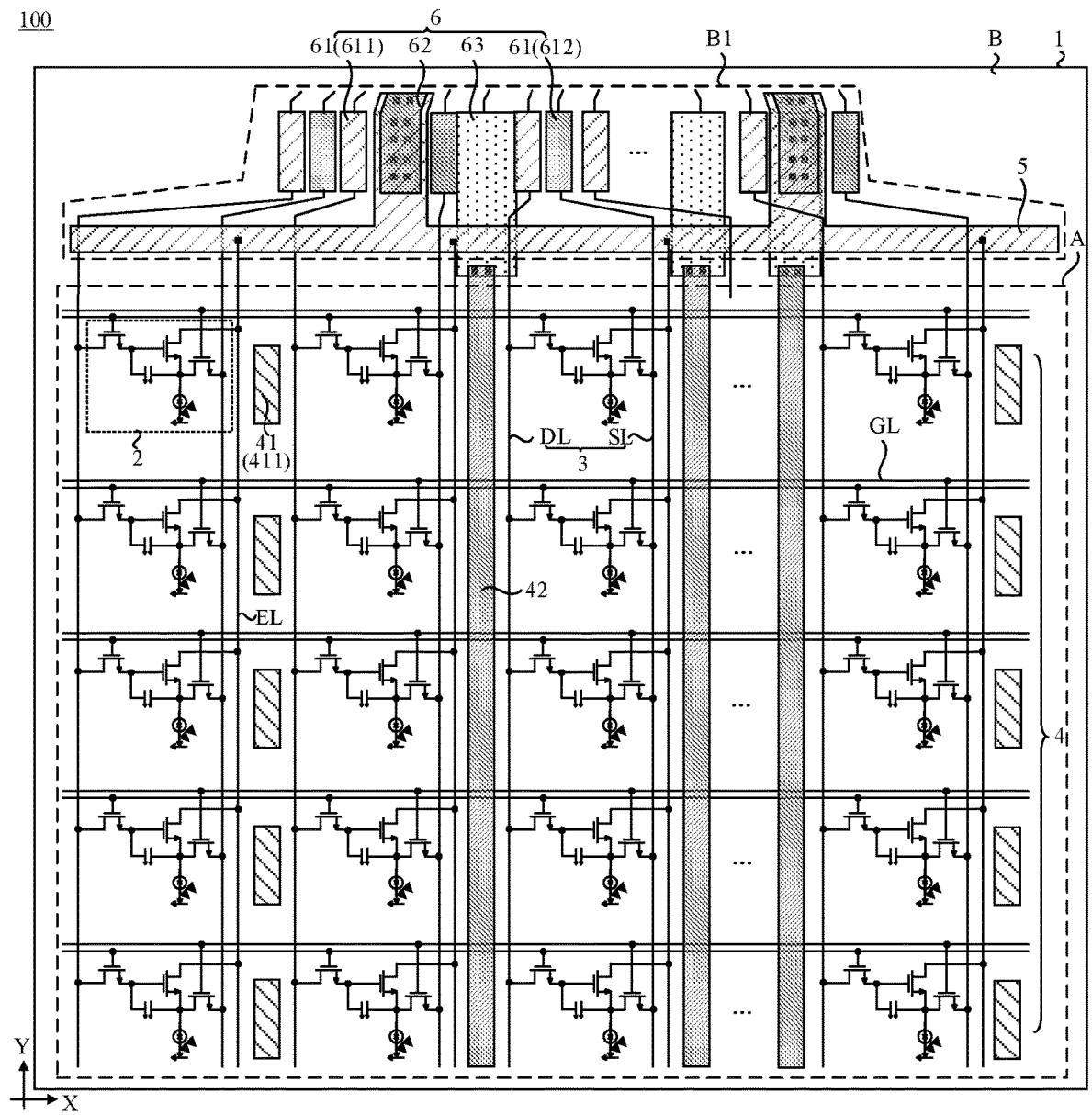
FIG. 3 is a structural diagram of a display panel, in accordance with some embodiments of the present disclosure.

In some examples, as shown in FIG. 3, the display panel 100 has a display area A. Of course, the display panel 100 may further have a bezel area B. The bezel area B may be located on side(s) of the display area A.

For example, the side(s) refer to one side, two sides, three sides or a peripheral side of the display area A. That is, the bezel area B may be located on one side, two sides or three sides of the display area A, or may be located on the peripheral side of the display area A to surround the display area A.

In some examples, as shown in FIG. 3, the display panel 100 may include: a substrate 1, a plurality of sub-pixels 2, a plurality of signal transmission lines 3 and a scan driving circuit 4.

The type of the substrate 1 may vary, which may be set according to actual needs.

For example, the substrate 1 may be a rigid substrate. The rigid substrate may be, for example, a glass substrate or a polymethyl methacrylate (PMMA) substrate.

For example, the substrate 1 may be a flexible substrate. The flexible substrate may be, for example, a polyethylene terephthalate (PET) substrate, a polyethylene naphthalate two formic acid glycol ester (PEN) substrate, or a polyimide (PI) substrate. In this case, the display panel 100 may be a flexible display panel.

In some examples, as shown in FIG. 3, the plurality of sub-pixels 2 are disposed on a side of the substrate 1 and located in the display area A. The plurality of sub-pixels 2 may be arranged in a plurality of rows and a plurality of columns, sub-pixels in a row are arranged along a first direction X, and sub-pixels in a column are arranged along a second direction Y. Each row of sub-pixels 2 may include sub-pixels 2, and each column of sub-pixels 2 may include sub-pixels 2. The number of sub-pixels 2 in a row and the number of sub-pixels 2 in a different row may be the same or different, and the number of sub-pixels 2 in a column and the number of sub-pixels 2 in a different column may be the same or different. The number of sub-pixels 2 in the row and the number of sub-pixels 2 in the different row, and the number of sub-pixels 2 in the column and the number of sub-pixels 2 in the different column may be set according to actual needs (e.g., a shape of the display panel 100).

Here, the first direction X and the second direction Y intersect each other. An included angle between the first direction X and the second direction Y may be set according to actual needs. For example, the included angle between the first direction X and the second direction Y may be 85°, 89°, 90°, 92° or 95°.

The plurality of sub-pixels 2 may be arranged in various manners, which may be set according to actual needs.

For example, as shown in FIG. 3, the plurality of sub-pixels 2 are uniformly arranged on the side of the substrate 1. A distance between any two adjacent sub-pixels 2 is equal or substantially equal.

Figure 11:
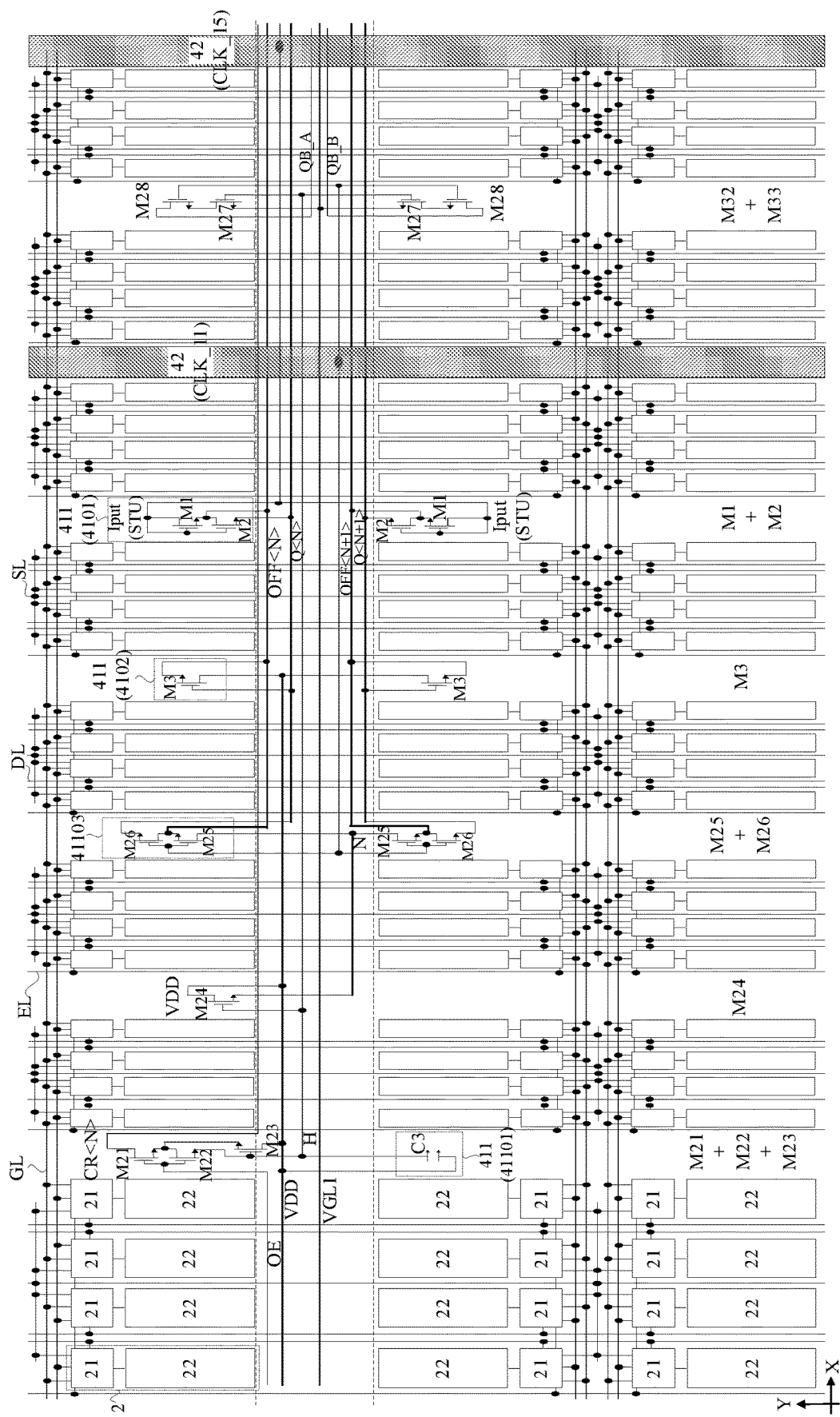
FIG. 11 is a partial structural diagram showing sub-pixels and a gate driving circuit, in accordance with some embodiments of the present disclosure.

As another example, at least two sub-pixels 2 constitute a group of sub-pixels. A plurality of groups of sub-pixels are arranged in rows and columns, groups of sub-pixels in a row are arranged along the first direction X, and groups of sub-pixels in a column are arranged in columns along the second direction Y. As shown in FIG. 11, four sub-pixels 2 constitute the group of sub-pixels, and the four sub-pixels 2 include, for example, a red sub-pixel, a green sub-pixel, a blue sub-pixel and a white sub-pixel.

Figure 4:
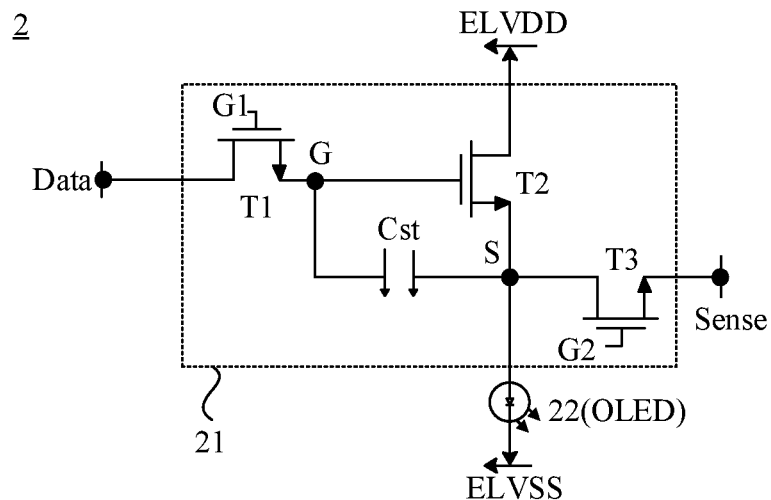
FIG. 4 is a structural diagram of a sub-pixel, in accordance with some embodiments of the present disclosure.

For example, as shown in FIGS. 4 and 11, each sub-pixel 2 in the plurality of sub-pixels 2 may include a pixel driving circuit 21 and a light-emitting device 22 electrically connected to the pixel driving circuit 21. In a thickness direction of the substrate 1, the light-emitting device 22 may, for example, be located on a side of the pixel driving circuit 21 away from the substrate 1. For example, an orthographic projection of the light-emitting device 22 on the substrate 1 may not overlap or partially overlap with an orthographic projection of the pixel driving circuit 21 on the substrate 1.

The structure of the light-emitting device 22 may vary, which may be set according to actual needs. For example, the light-emitting device 22 may include an anode, a light-emitting layer and a cathode that are sequentially stacked. In addition, the light-emitting device 22 may further include, for example, a hole injection layer disposed between the anode and the light-emitting layer, or a hole transport layer disposed between the anode and the light-emitting layer, or the hole injection layer and the hole transport layer that are disposed between the anode and the light-emitting layer. The light-emitting device 22 may further include, for example, an electron transport layer disposed between the light-emitting layer and the cathode, or an electron injection layer disposed between the light-emitting layer and the cathode, or the electron transport layer and the electron injection layer that are disposed between the light-emitting layer and the cathode. For example, the pixel driving circuit 21 is electrically connected to the anode of the light-emitting device 22.

For example, at least one of the anode and the cathode may be made of a conductive material with high light transmittance. The conductive material with high light transmittance may be indium tin oxide (ITO).

In a case where the anode is a light-transmissive layer, light emitted by the light-emitting device 22 may exit along a direction toward the substrate 1. In this case, the display panel 100 may be a bottom-emission display panel. In a case where the cathode is the light-transmissive layer, the light emitted by the light-emitting device 22 may exit along a direction facing away from the substrate 1. In this case, the display panel 100 may be a top-emission display panel. In a case where the anode and the cathode are both light-transmissive layers, the display panel 100 may emit light from both sides.

The structure of the pixel driving circuit 21 may vary, which may be set according to actual needs. For example, the structure of the pixel driving circuit 21 may be a structure of "2T1C", "3T1C", "6T1C", "7T1C", "6T2C", or "7T2C", etc. Here, "T" represents a thin film transistor, and the number before "T" represents the number of thin film transistors, "C" represents a storage capacitor, and the number before "C" represents the number of storage capacitors. For example, the pixel driving circuit 21 may include a switching transistor and a driving transistor.

In some examples, as shown in FIG. 3, the display panel 100 may further include a plurality of gate lines GL extending along the first direction X, and a plurality of data lines DL and a plurality of power supply voltage signal lines EL that extend along the second direction Y, all of which are disposed on the side of the substrate 1.

For example, the plurality of data lines DL may be located on a side of the plurality of gate lines GL away from the substrate 1, and the plurality of data lines DL and the plurality of gate lines GL are insulated from each other. The plurality of power supply voltage signal lines EL may be located on the side of the plurality of gate lines GL away from the substrate 1, and the plurality of power supply voltage signal lines EL and the plurality of gate lines GL are insulated from each other. The plurality of data lines DL and the plurality of power supply voltage signal lines EL may be disposed in a same layer and insulated from each other.

It will be noted that the "same layer" mentioned herein refers to a layer structure formed by forming a film layer for forming a specific pattern through the same film forming process and then performing a single patterning process using the same mask. Depending on the different specific patterns, the single patterning process may include multiple exposure, development or etching processes, and the specific patterns in the formed layer structure may be continuous or discontinuous, and these specific patterns may also be at different heights or have different thicknesses. In this way, the plurality of data lines DL and the plurality of power supply voltage signal lines EL may be manufactured simultaneously in a patterning process, which helps simplify a manufacturing process of the display panel 100.

Of course, the plurality of data lines DL and the plurality of power supply voltage signal lines EL may be located in different layers and insulated from each other. For example, the plurality of power supply voltage signal lines EL may be located on a side of the plurality of data lines DL away from the substrate 1.

By arranging the data lines DL and the power supply voltage signal lines EL in different layers, it helps increase a wiring space and reduce a wiring difficulty.

For example, as shown in FIGS. 3 and 11, the gate line GL may be electrically connected to pixel driving circuits 21 in at least one row of sub-pixels 2, the data line DL may be electrically connected to pixel driving circuits 21 in at least one column of sub-pixels 2, and the power supply voltage signal line EL may be electrically connected to pixel driving circuits 21 in at least one column of sub-pixels 2. The number of gate lines GL electrically connected to pixel driving circuits 21 in a same row of sub-pixels 2 may be set according to the structure of the pixel driving circuit 21.

For example, as shown in FIG. 11, the data line DL may be electrically connected to pixel driving circuits 21 in a column of sub-pixels 2, and the power supply voltage signal line EL may be electrically connected to pixel driving circuits 21 in four columns of sub-pixels 2.

Of course, for example, the display panel 100 may further include a plurality of enable signal lines disposed on the side of the substrate 1 and extending along the first direction X. For example, the plurality of enable signal lines may be disposed in a same layer as the plurality of gate lines GL. Alternatively, the plurality of enable signal lines and the plurality of gate lines GL may be located in different layers and insulated from each other.

For example, the enable signal line may be electrically connected to the pixel driving circuits 21 in the same row of sub-pixels 2. An arrangement of the enable signal lines may be determined according to the structure of the pixel driving circuit.

During a process where the display panel 100 performs display, the pixel driving circuit 21 may receive a scan signal from a corresponding gate line GL, a data signal from a corresponding data line DL and a power supply voltage signal from the power supply voltage signal line EL, so as to generate a driving current; and the driving current is transmitted to the light-emitting device 22, so that the light-emitting device 22 is driven to emit light. Alternatively, the pixel driving circuit 21 may receive the scan signal from the corresponding gate line GL, the data signal from the corresponding data line DL, the power supply voltage signal from the power supply voltage signal line EL and an enable signal from a corresponding enable signal line, so as to generate the driving current; and the driving current is transmitted to the light-emitting device 22, so that the light-emitting device 22 is driven to emit light. Light-emitting devices 22 of the plurality of sub-pixels cooperate to enable the display panel 100 to display the image.

The structure of the scan driving circuit 4 may vary, which may be set according to actual needs.

For example, the scan driving circuit 4 may be a light-emitting control circuit. In a case where the pixel driving circuit 21 is further electrically connected to the enable signal line, the light-emitting control circuit may be electrically connected to the plurality of enable signal lines, so as to provide the enable signals to respective pixel driving circuits 21 through the enable signal lines.

For example, the scan driving circuit 4 may be a gate driving circuit. The gate driving circuit may be electrically connected to the plurality of gate lines GL, so as to provide the scan signals to respective pixel driving circuits through the gate lines GL.

Here, during the use of the display panel 100, stabilities of the transistor in the pixel driving circuit 21 and the light-emitting device 22 may decrease (for example, a threshold voltage of the driving transistor drifts), which affects a display effect of the display panel 100. Therefore, the sub-pixel 2 needs to be compensated.

There are various manners to compensate the sub-pixel 2, which may be set according to actual needs. For example, a pixel compensation circuit may be provided in the sub-pixel 2, so that the pixel compensation circuit may be used to perform internal compensation for the sub-pixel 2. As another example, the driving transistor or the light-emitting device 22 may be sensed by a transistor in the sub-pixel 2, and sensed data is transmitted to an external sensing circuit, so that the external sensing circuit is used to calculate a driving voltage value that needs to be compensated and give feedback. As a result, external compensation for the sub-pixel 2 is achieved.

A structure and a working process of the sub-pixel 2 will be schematically described by considering an example in which the scan driving circuit 4 is the gate driving circuit, an external compensation manner (in which the driving transistor is sensed) is adopt to compensate the sub-pixel 2, and the pixel driving circuit 21 is of the structure of 3T1C.

For example, as shown in FIG. 4, the pixel driving circuit 21 may include: a switching transistor T1, a driving transistor T2, a sensing transistor T3 and the storage capacitor Cst.

As shown in FIG. 4, a control electrode of the switching transistor T1 is electrically connected to a first scan signal terminal G1, a first electrode of the switching transistor T1 is electrically connected to a data signal terminal Data, and a second electrode of the switching transistor T1 is electrically connected to a first node G. The switching transistor T1 is configured to transmit a data signal received at the data signal terminal Data to the first node G in response to a first scan signal received at the first scan signal terminal G1.

Here, the data signal is, for example, a detection data signal or a display data signal.

As shown in FIG. 4, a control electrode of the driving transistor T2 is electrically connected to the first node G, a first electrode of the driving transistor T2 is electrically connected to a power supply voltage signal terminal ELVDD, and a second electrode of the driving transistor T2 is electrically connected to a second node S. The driving transistor T2 is configured to transmit the power supply voltage signal received at the power supply voltage signal terminal ELVDD to the second node S under control of a voltage of the first node G.

As shown in FIG. 4, a first terminal of the storage capacitor Cst is electrically connected to the first node G, and a second terminal of the storage capacitor Cst is electrically connected to the second node S. The switching transistor T1 charges the storage capacitor Cst while charging the first node G.

As shown in FIG. 4, the anode of the light-emitting device 22 is electrically connected to the second node S, and the cathode of the light-emitting device 22 is electrically connected to a first voltage signal terminal ELVSS. The light-emitting device 22 is configured to emit light under a cooperation of the power supply voltage signal at the second node S and a first voltage signal transmitted by the first voltage signal terminal ELVSS.

As shown in FIG. 4, a control electrode of the sensing transistor T3 is electrically connected to a second scan signal terminal G2, a first electrode of the sensing transistor T3 is electrically connected to the second node S, and a second electrode of the sensing transistor T3 is electrically connected to a sensing signal terminal Sense. The sensing transistor T3 is configured to, in response to a second scan signal received at the second scan signal terminal G2, detect an electrical property of the driving transistor T2, so as to achieve the external compensation. The electrical property includes, for example, the threshold voltage of the driving transistor T2 and/or a carrier mobility of the driving transistor T2.

Here, the sensing signal terminal Sense may transmit a reset signal or obtain a sensing signal. The reset signal is used for resetting the second node S. The obtained sensing signal is used for obtaining the threshold voltage of the driving transistor T2.

In this example, a frame display phase may include a display period and a blanking period that are performed in sequence.

In the display period of the frame display phase, the working process of the sub-pixel 2 may include, for example, a reset period, a data writing period, and a light-emitting period.

In the reset period, the second scan signal transmitted by the second gate signal terminal G2 is at a high level, and the reset signal transmitted by the sensing signal terminal Sense is at a low level. The sensing transistor T3 is turned on under control of the second scan signal, receives the reset signal, and transmits the reset signal to the second node S to reset the second node S.

In the data writing period, the first scan signal transmitted by the first scan signal terminal G1 is at a high level, and the display data signal transmitted by the data signal terminal Data is at a high level. The switching transistor T1 is turned on under control of the first scan signal, receives the display data signal, and transmits the display data signal to the first node G and charges the storage capacitor Cst at the same time.

In the light-emitting period, the first scan signal transmitted by the first scan signal terminal G1 is at a low level, the second scan signal transmitted by the second scan signal terminal G2 is at a low level, and the power supply voltage signal transmitted by the power supply voltage signal terminal ELVDD is at a high level. The switching transistor T1 is turned off under control of the first scan signal, and the sensing transistor T3 is turned off under control of the second scan signal. The storage capacitor Cst starts to discharge, so that the voltage of the first node G remains at a high level. The driving transistor T2 is turned on under the control of the voltage of the first node G, receives the power supply voltage signal, and transmits the power supply voltage signal to the second node S, so that the light-emitting device 22 emits light under the cooperation of the power supply voltage signal and the first voltage signal transmitted by the first voltage signal terminal ELVSS.

In the blanking period of the frame display phase, the working process of the sub-pixel 2 may include, for example, a first period and a second period.

In the first period, the first scan signal transmitted by the first scan signal terminal G1 and the second scan signal transmitted by the second scan signal terminal G2 are both at high levels, and the detection data signal transmitted by the data signal terminal Data is at a high level. The switching transistor T1 is turned on under the control of the first scan signal, receives the detection data signal, and transmits the detection data signal to the first node G to charge the first node G. The sensing transistor T3 is turned on under the control of the second scan signal, receives the reset signal transmitted by the sensing signal terminal Sense, and transmits the reset signal to the second node S.

In the second period, the sensing signal terminal Sense is in a floating state. The driving transistor T2 is turned on under the control of the voltage of the first node G, receives the power supply voltage signal transmitted by the power supply voltage signal terminal ELVDD, and transmits the power supply voltage signal to the second node S to charge the second node S, so that a voltage of the second node S is increased until the driving transistor T2 is turned off. In this case, a voltage difference Vgs between the first node G and the second node S is equal to the threshold voltage Vth of the driving transistor T2.

Since the sensing transistor T3 is in a turned-on state and the sensing signal terminal Sense is in the floating state, the sensing signal terminal Sense is charged while the driving transistor T2 charges the second node S. By sampling a voltage of the sensing signal terminal Sense (i.e., obtaining the sensing signal), the threshold voltage Vth of the driving transistor T2 may be calculated according to a relationship between the voltage of the sensing signal terminal Sense and a voltage of the detection data signal.

After the threshold voltage Vth of the driving transistor T2 is calculated, the threshold voltage Vth may be compensated into a display data signal in a display period of a next-frame display phase, so that the external compensation for the sub-pixel 2 is achieved.

Based on the structure of the pixel driving circuit 21, the pixel driving circuits 21 in the same row of sub-pixels 2 may be electrically connected to two gate lines GL (i.e., a first gate line and a second gate line). For example, first scan signal terminals G1 electrically connected to the pixel driving circuits 21 in the same row of sub-pixels 2 may be electrically connected to the first gate line and receive the first scan signal transmitted by the first gate line; and second scan signal terminals G2 electrically connected to the pixel driving circuits 21 in the same row of sub-pixels 2 may be electrically connected to the second gate line and receive the second scan signal transmitted by the second gate line. In addition, data signal terminals Data electrically connected to the pixel driving circuits 21 in the same column of sub-pixels 2 may be electrically connected to a corresponding data line DL and receives the data signal transmitted by the data line DL; and power supply voltage signal terminals ELVDD electrically connected to the pixel driving circuits 21 in the same column of sub-pixels 2 may be electrically connected to a corresponding power supply voltage signal line EL and receives the power supply voltage signal transmitted by the power supply voltage signal line EL.

In addition, for example, as shown in FIGS. 3 and 11, the display panel 100 may further include a plurality of sensing lines SL disposed on the side of the substrate 1 and extending along the second direction Y. The plurality of sensing lines SL may be located on the side of the plurality of gate lines GL away from the substrate 1 and insulated from the plurality of gate lines GL. For example, the plurality of sensing lines SL may be disposed in a same layer as at least one of the plurality of power supply voltage signal lines EL and the plurality of data lines DL.

A sensing line SL in the plurality of sensing lines SL may be electrically connected to the pixel driving circuits 21 in the at least one column of sub-pixels 2. For example, as shown in FIG. 11, the sensing line SL may be electrically connected to pixel driving circuits 21 in four columns of sub-pixels 2. In the case where the data line DL is electrically connected to the pixel driving circuits 21 in the column of sub-pixels 2, four data lines DL may be disposed between every two adjacent sensing lines SL.

As shown in FIGS. 3 and 4, each sensing signal terminal Sense may be electrically connected to a corresponding sensing line SL, and receive the reset signal transmitted by the sensing line SL or transmits the sensing signal to the sensing line SL.

Here, it will be noted that, the data lines DL and the sensing lines SL all extend along the second direction Y, the data line DL is electrically connected to the at least one column of sub-pixels 2, and the sensing line SL is electrically connected to at least one column of sub-pixels 2. Therefore, in some embodiments of the present disclosure, in order to describe the structure of the display panel 100 more clearly and briefly, the data lines DL and the sensing lines SL are collectively referred to as the plurality of signal transmission lines 3.

In some examples, as shown in FIG. 3, the scan driving circuit 4 may be located on the same side of the substrate 1 as the plurality of sub-pixels 2 and the plurality of signal transmission lines 3. The scan driving circuit 4 may include a plurality of shift registers 41, and the plurality of shift registers 41 are arranged in cascade. A shift register 41 may be electrically connected to the pixel driving circuits 21 in at least one row of sub-pixels 2.

It will be noted that, in the frame display phase, both the first scan signal transmitted by the first scan signal terminal G1 and the second scan signal transmitted by the second scan signal terminal G2 are provided by the scan driving circuit 4. That is, each shift register 41 in the scan driving circuit 4 may be electrically connected to the first scan signal terminal G1 through the first gate line, so as to transmit the first scan signal to the first scan signal terminal G1 through the first gate line; and each shift register 41 in the scan driving circuit 4 may be electrically connected to the second scan signal terminal G2 through the second gate line, so as to transmit the second scan signal to the second scan signal terminal G2 through the second gate line.

The structure of the shift register 41 may vary, which may be set according to actual needs. Structures of four types of shift registers 41 will be schematically described below, but the embodiments of the present disclosure are not limited to these four types of shift registers 41.

In some examples, the shift register 41 may be electrically connected to the pixel driving circuits 21 in one row of sub-pixels 2.

Figure 5:
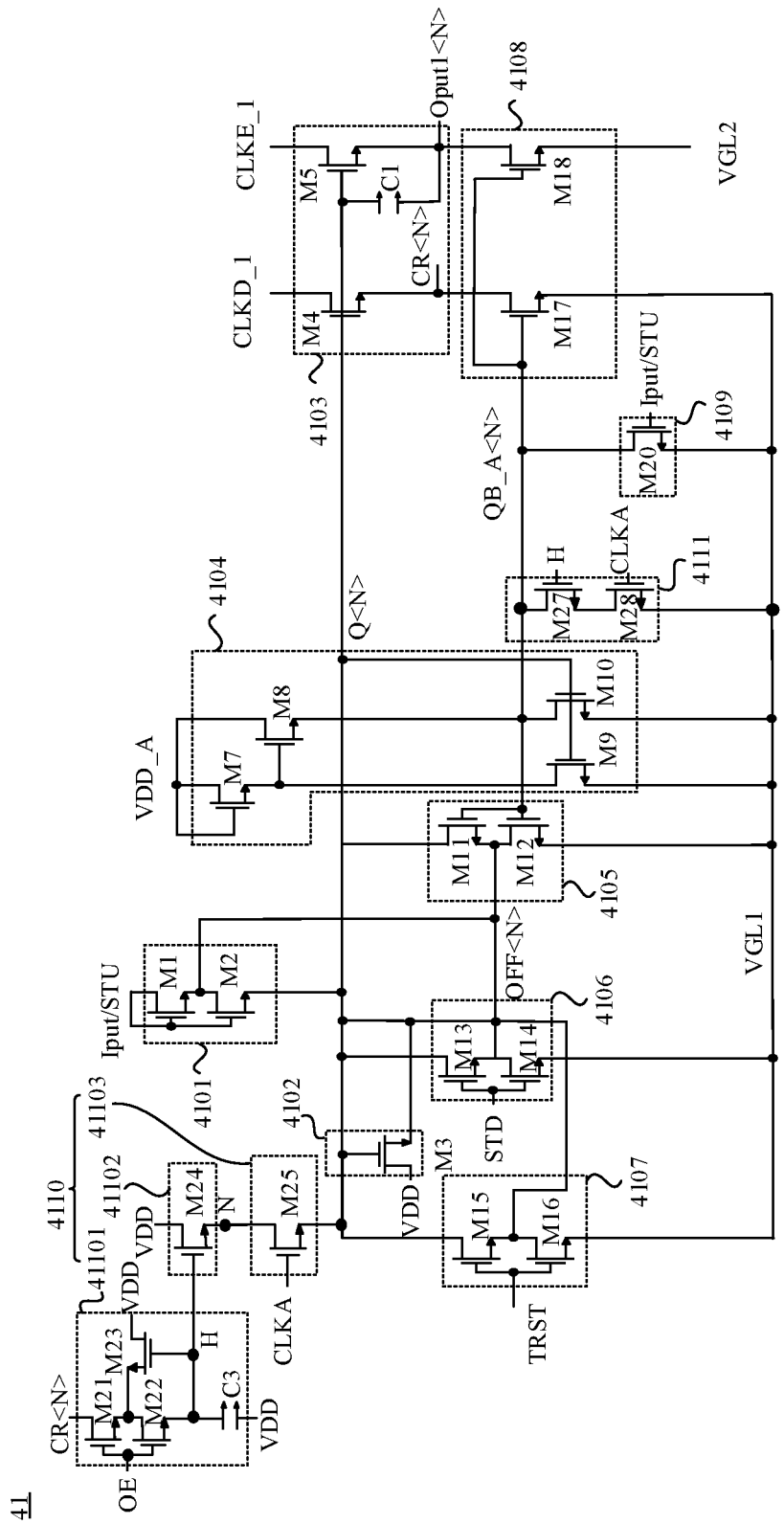
FIG. 5 is a circuit diagram of a shift register, in accordance with some embodiments of the present disclosure.

As shown in FIG. 5, the shift register 41 may include, for example, a first input circuit 4101, a leakage prevention circuit 4102, an output circuit 4103, a control circuit 4104, a first reset circuit 4105, a second reset circuit 4106, a third reset circuit 4107, a fourth reset circuit 4108, a fifth reset circuit 4109, a blanking circuit 4110 and a sixth reset circuit 4111. Of course, the shift register 41 may include only some of the circuits, as long as the sub-pixel 2 may achieve the above working process.

For example, as shown in FIG. 5, the first input circuit 4101 is electrically connected to an input signal terminal Input (which is abbreviated as Iput in the drawings and following content), a pull-up node Q<N> and a leakage prevention node OFF<N>. The first input circuit 4101 is configured to, in response to an input signal received at the input signal terminal Iput, transmit the input signal to the pull-up node Q<N> and the leakage prevention node OFF<N> in the display period of the frame display phase. N is a positive integer that represents a serial number of a row of sub-pixels electrically connected to the shift register 41.

For example, in the display period of the frame display phase, in a case where the input signal is at a high level, the first input circuit 4101 may be turned on due to an action of the input signal, and transmit the input signal to the pull-up node Q<N> to charge the pull-up node Q<N>, so that a voltage of the pull-up node Q<N> is raised.

Optionally, as shown in FIG. 5, the first input circuit 4101 may include a first transistor M1 and a second transistor M2.

For example, as shown in FIG. 5, a control electrode of the first transistor M1 is electrically connected to the input signal terminal Iput, a first electrode of the first transistor M1 is electrically connected to the input signal terminal Iput, and a second electrode of the first transistor M1 is electrically connected to a first electrode of the second transistor M2 and the leakage prevention node OFF<N>. A control electrode of the second transistor M2 is electrically connected to the input signal terminal Iput, and a second electrode of the second transistor M2 is electrically connected to the pull-up node Q<N>.

Here, in the display period of the frame display phase, in the case where the input signal transmitted by the input signal terminal Iput is at the high level, the first transistor M1 and the second transistor M2 may be both turned on due to the action of the input signal. The first transistor M1 may receive the input signal transmitted by the input signal terminal Iput, and transmit the received input signal to the first electrode of the second transistor M2 and the leakage prevention node OFF<N>. The second transistor M2 may transmit the input signal from the first transistor M1 to the pull-up node Q<N> to charge the pull-up node Q<N>, so that the voltage of the pull-up node Q<N> is raised.

For example, as shown in FIG. 5, the leakage prevention circuit 4102 is electrically connected to the pull-up node Q<N>, a second voltage signal terminal VDD and the leakage prevention node OFF<N>. The leakage prevention circuit 4102 is configured to transmit a second voltage signal received at the second voltage signal terminal VDD to the leakage prevention node OFF<N> under control of the voltage of the pull-up node Q<N>, so as to prevent the pull-up node Q<N> from leakage. The second voltage signal is, for example, a constant high voltage signal.

For example, in a case where the voltage of the pull-up node Q<N> is at a high level, the leakage prevention circuit 4102 may be turned on under control of the voltage of the pull-up node Q<N>, receive the second voltage signal, and transmit the second voltage signal to the leakage prevention node OFF<N>, so that a voltage of the leakage prevention node OFF<N> is raised.

Optionally, as shown in FIG. 5, the leakage prevention circuit 4102 may include a third transistor M3.

For example, as shown in FIG. 5, a control electrode of the third transistor M3 is electrically connected to the pull-up node Q<N>, a first electrode of the third transistor M3 is electrically connected to the second voltage signal terminal VDD, and a second electrode of the third transistor M3 is electrically connected to the leakage prevention node OFF<N>.

Here, in the case where the voltage of the pull-up node Q<N> is at the high level, the third transistor M3 may be turned on under the control of the voltage of the pull-up node Q<N>, receive the second voltage signal, and transmit the second voltage signal to the leakage prevention node OFF<N>, so that the voltage of the leakage prevention node OFF<N> is raised. In addition, a voltage difference between the control electrode and the first electrode of the second transistor M2 is less than zero, which ensures that the second transistor M2 is completely or relatively completely turned off. In this way, it may be possible to avoid the leakage of the pull-up node Q<N> through the first input circuit 4101, so that the pull-up node Q<N> can be maintained at the relatively high and stable voltage.

For example, as shown in FIG. 5, the output circuit 4103 is electrically connected to the pull-up node Q<N>, a first clock signal terminal CLKD_1, a shift signal terminal CR<N>, a second clock signal terminal CLKE_1 and a first output signal terminal Output1<N> (which is abbreviated as Oput1<N> in the drawings and following content). The output circuit 4103 is configured to: in the display period of the frame display phase, transmit a first clock signal received at the first clock signal terminal CLKD_1 to the shift signal terminal CR<N> and transmit a second clock signal received at the second clock signal terminal CLKE_1 to the first output signal terminal Oput1<N> under control of the voltage of the pull-up node Q<N>; and in the blanking period of the frame display phase, transmit another second clock signal received at the second clock signal terminal CLKE_1 to the first output signal terminal Oput1<N> under control of the voltage of the pull-up node Q<N>.

For example, in the display period of the frame display phase, in the case where the voltage of the pull-up node Q<N> is raised, the output circuit 4103 may be turned on under the control of the voltage of the pull-up node Q<N>, output the first clock signal received at the first clock signal terminal CLKD_1 as a shift signal from the shift signal terminal CR<N>, and output the second clock signal received at the second clock signal terminal CLKE_1 as a first output signal (i.e., the first scan signal received by the pixel driving circuit 21) from the first output signal terminal Oput1<N>. In the blanking period of the frame display phase, in the case where the voltage of the pull-up node Q<N> is raised, the output circuit 4103 may be turned on under the control of the voltage of the pull-up node Q<N>, output the another second clock signal received at the second clock signal terminal CLKE_1 as another first output signal (i.e., the second scan signal received by the pixel driving circuit 21) from the first output signal terminal Oput1<N>.

In this example, the first output signal terminal Oput1<N> of the shift register 41 may be electrically connected to both the first gate line and the second gate line, so that in the display period of the frame display phase, the first output signal output from the first output signal terminal Oput1<N> of the shift register 41 may be transmitted as the first scan signal to the corresponding pixel driving circuit 21 through the first gate line and the first scan signal terminal G1 in sequence; and in the blanking period of the frame display phase, the another first output signal output from the first output signal terminal Oput1<N> of the shift register 41 may be transmitted as the second scan signal to the corresponding pixel driving circuit 21 through the second gate line and the second scan signal terminal G2 in sequence. As another example, the first output signal terminal Oput1<N> of the shift register 41 may be electrically connected to the first scan signal terminal G1 and the second scan signal terminal G2 through a single gate line, so that in the display period of the frame display phase, the first output signal terminal Oput1<N> of the shift register 41 may transmit the first scan signal to the pixel driving circuit 21 through the gate line and the first scan signal terminal G1 in sequence, and in the blanking period of the frame display phase, the first output signal terminal Oput1<N> of the shift register 41 may transmit the second scan signal to the pixel driving circuit 21 through the gate line and the second scan signal terminal G2 in sequence.

Optionally, as shown in FIG. 5, the output circuit 4103 may include: a fourth transistor M4, a fifth transistor M5 and a first capacitor C1.

For example, as shown in FIG. 5, a control electrode of the fourth transistor M4 is electrically connected to the pull-up node Q<N>, a first electrode of the fourth transistor M4 is electrically connected to the first clock signal terminal CLKD_1, and a second electrode of the fourth transistor M4 is electrically connected to the shift signal terminal CR<N>.

In the display period of the frame display phase, in a case where the first input circuit 4101 is turned on, and the voltage of the pull-up node Q<N> is raised, the fourth transistor M4 may be turned on under the control of the high voltage of the pull-up node Q<N>, receive the first clock signal, and transmit the first clock signal to the shift signal terminal CR<N>, so that the first clock signal is output from the shift signal terminal CR<N> as the shift signal.

For example, as shown in FIG. 5, a control electrode of the fifth transistor M5 is electrically connected to the pull-up node Q<N>, a first electrode of the fifth transistor M5 is electrically connected to the second clock signal terminal CLKE_1, and a second electrode of the fifth transistor M5 is electrically connected to the first output signal terminal Oput1<N>. A first terminal of the first capacitor C1 is electrically connected to the pull-up node Q<N>, and a second terminal of the first capacitor C1 is electrically connected to the first output signal terminal Oput1<N>.

In the display period of the frame display phase, the first capacitor C1 is charged while the first input circuit 4101 is turned on and the voltage of the pull-up node Q<N> is raised. In a case where the first input circuit 4101 is turned off, the first capacitor C1 may discharge, so that the pull-up node Q<N> is maintained at the high level. As a result, the fifth transistor M5 may remain in a turned-on state, receive the second clock signal, and transmit the second clock signal to the first output signal terminal Oput1<N>, so that the second clock signal is output from the first output signal terminal Oput1<N> as the first output signal (i.e., the first scan signal received by the pixel driving circuit 21).

In the blanking period of the frame display phase, the first capacitor C1 is charged while the voltage of the pull-up node Q<N> is raised. In a corresponding period, the first capacitor C1 may discharge, so that the pull-up node Q<N> is maintained at the high level. As a result, the fifth transistor M5 may remain in the turned-on state to transmit the another second clock signal to the first output signal terminal Oput1<N>, so that the another second clock signal is output from the first output signal terminal Oput1<N> as the another first output signal (i.e., the second scan signal received by the pixel driving circuit 21).

Here, after the plurality of shift registers 41 are cascaded to constitute the scan driving circuit 4, the shift signal terminal CR<N> of an N-th shift register 41 may be, for example, electrically connected to the input signal terminal Iput of an (N+1)-th shift register 41. As a result, the shift signal output from the shift signal terminal CR<N> of the N-th shift register 41 may be used as the input signal of the (N+1)-th shift register 41. Of course, a cascaded relationship of the plurality of shift registers 41 is not limited thereto.

In addition, input signal terminals Iput of part of the shift registers 41 may be electrically connected to a start signal terminal STU, so as to receive a start signal transmitted by the start signal terminal STU as the input signal. The part of the shift registers 41 may be, for example, a first shift register 41 in the scan driving circuit 4. Alternatively, the part of the shift registers 41 may be, for example, the first shift register 41 and a second shift register 41.

Here, the number of shift registers 41 electrically connected to the start signal terminal STU is not limited, which may be set according to actual needs.

For example, as shown in FIG. 5, the control circuit 4104 is electrically connected to the pull-up node Q<N>, a third voltage signal terminal VDD_A, the pull-down node QB_A<N> and a fourth voltage signal terminal VGL1. The control circuit 4104 is configured to, under control of the voltage of the pull-up node Q<N> and a third voltage signal transmitted by the third voltage signal terminal VDD_A, control a voltage of the pull-down node QB_A<N> according to the third voltage signal transmitted by the third voltage signal terminal VDD_A or a fourth voltage signal transmitted by the fourth voltage signal terminal VGL1. For example, a level of the third voltage signal may not change in the frame display phase. The fourth voltage signal terminal VGL1 may be configured to transmit a direct current low-level signal (e.g., a level of the direct current low-level signal is lower than or equal to a low level of the clock signal). For example, the fourth voltage signal terminal VGL1 may be grounded.

For example, the third voltage signal is at a high level in the frame display phase. In the case where the voltage of the pull-up node Q<N> is raised, the control circuit 4104 may transmit the fourth voltage signal that is transmitted by the fourth voltage signal terminal VGL1 to the pull-down node QB_A<N>, so as to pull down the voltage of the pull-down node QB_A<N> to be at a low level. In the case where the voltage of the pull-up node Q<N> is at a low level, the control circuit 4104 may transmit the third voltage signal that is transmitted by the third voltage signal terminal VDD_A to the pull-down node QB_A<N>, so as to pull up the voltage of the pull-down node QB_A<N> to be at a high level.

Optionally, as shown in FIG. 5, the control circuit 4104 may include: a seventh transistor M7, an eighth transistor M8, a ninth transistor M9 and a tenth transistor M10.

For example, as shown in FIG. 5, a control electrode of the seventh transistor M7 is electrically connected to the third voltage signal terminal VDD_A, a first electrode of the seventh transistor M7 is electrically connected to the third voltage signal terminal VDD_A, and a second electrode of the seventh transistor M7 is electrically connected to a control electrode of the eighth transistor M8 and a first electrode of the ninth transistor M9. A first electrode of the eighth transistor M8 is electrically connected to the third voltage signal terminal VDD_A, and a second electrode of the eighth transistor M8 is electrically connected to the pull-down node QB_A<N> and a first electrode of the tenth transistor M10. A control electrode of the ninth transistor M9 is electrically connected to the pull-up node Q<N>, and a second electrode of the ninth transistor M9 is electrically connected to the fourth voltage signal terminal VGL1. A control electrode of the tenth transistor M10 is electrically connected to the pull-up node Q<N>, and a second electrode of the tenth transistor M10 is electrically connected to the fourth voltage signal terminal VGL1.

In a case where the third voltage signal transmitted by the third voltage signal terminal VDD_A is at a high level, the seventh transistor M7 may be turned on due to an action of the third voltage signal, receive the third voltage signal, and transmit the third voltage signal to the control electrode of the eight transistors M8 and the first electrode of the ninth transistor M9. The eighth transistor M8 may be turned on due to the action of the third voltage signal, receive the third voltage signal, and transmit the third voltage signal to the pull-down node QB_A<N> and the first electrode of the tenth transistor M10.

In the case where the voltage of the pull-up node Q<N> is at the high level, the ninth transistor M9 and the tenth transistor M10 may be turned on under the control of the voltage of the pull-up node Q<N>. The ninth transistor M9 may transmit the fourth voltage signal that is transmitted by the fourth voltage signal terminal VGL1 to the control electrode of the eighth transistor M8, so as to turn off the eighth transistor M8. The tenth transistor M10 may transmit the fourth voltage signal to the pull-down node QB_A<N>, so as to pull down the voltage of the pull-down node QB_A<N> to be at the low level.

In the case where the voltage of the pull-up node Q<N> is at the low level, the ninth transistor M9 and the tenth transistor M10 may be turned off under the control of the voltage of the pull-up node Q<N>, and the eighth transistor M8 may transmit the received third voltage signal to the pull-down node QB_A<N>, so as to pull up the voltage of the pull-down node QB_A<N> to be at the high level.

For example, as shown in FIG. 5, the first reset circuit 4105 is electrically connected to the pull-down node QB_A<N>, the pull-up node Q<N>, the fourth voltage signal terminal VGL1 and the leakage prevention node OFF<N>. The first reset circuit 4105 is configured to, under control of the voltage of the pull-down node QB_A<N>, reset the pull-up node Q<N> and the leakage prevention node OFF<N> according to the fourth voltage signal transmitted by the fourth voltage signal terminal VGL1.

For example, in the case where the voltage of the pull-down node QB_A<N> is at the high level, the first reset circuit 4105 may be turned on due to an action of the voltage of the pull-down node QB_A<N>, and transmit the fourth voltage signal that is transmitted by the fourth voltage signal terminal VGL1 to the pull-up node Q<N>, so as to reset the pull-up node Q<N>.

Optionally, as shown in FIG. 5, the first reset circuit 4105 may include an eleventh transistor M11 and a twelfth transistor M12.

For example, as shown in FIG. 5, a control electrode of the eleventh transistor M11 is electrically connected to the pull-down node QB_A<N>, a first electrode of the eleventh transistor M11 is electrically connected to the pull-up node Q<N>, and a second electrode of the eleventh transistor M11 is electrically connected to a first electrode of the twelfth transistor M12 and the leakage prevention node OFF<N>. A control electrode of the twelfth transistor M12 is electrically connected to the pull-down node QB_A<N>, and a second electrode of the twelfth transistor M12 is electrically connected to the fourth voltage signal terminal VGL1.

In the case where the voltage of the pull-down node QB_A<N> is at the high level, the eleventh transistor M11 and the twelfth transistor M12 may be simultaneously turned on due to the action of the voltage of the pull-down node QB_A<N>. The twelfth transistor M12 may transmit the fourth voltage signal that is transmitted by the fourth voltage signal terminal VGL1 to the leakage prevention node OFF<N>, and the eleventh transistor M11 may transmit the fourth voltage signal from the leakage prevention node OFF<N> to the pull-up node Q<N> to reset the pull-up node Q<N>.

Here, in a case where the pull-up node Q<N> is at the high voltage and the first reset circuit 4105 is in a non-working state, the third transistor M3 may be turned on under the control of the voltage of the pull-up node Q<N>, and transmit the second voltage signal to the leakage prevention node OFF<N>, so that the voltage of the leakage prevention node OFF<N> is raised. As a result, a voltage difference between the control electrode and the second electrode of the eleventh transistor M11 is less than zero, which ensures that the eleventh transistor M11 is completely or relatively completely turned off. In this way, it may be possible to avoid the leakage of the pull-up node Q<N> through the first reset circuit 4105, so that the pull-up node Q<N> can be maintained at the relatively high and stable voltage.

For example, as shown in FIG. 5, the second reset circuit 4106 is electrically connected to a display reset signal terminal STD, the pull-up node Q<N>, the fourth voltage signal terminal VGL1 and the leakage prevention node OFF<N>. The second reset circuit 4106 is configured to, under control of a display reset signal transmitted by the display reset signal terminal STD, reset the pull-up node Q<N> and the leakage prevention node OFF<N> according to the fourth voltage signal transmitted by the fourth voltage signal terminal VGL1.

For example, in a case where the display reset signal is at a high level, the second reset circuit 4106 may be turned on due to an action of the display reset signal, and transmit the fourth voltage signal that is transmitted by the fourth voltage signal terminal VGL1 to the pull-up node Q<N>, so as to reset the pull-up node Q<N>.

Optionally, as shown in FIG. 5, the second reset circuit 4106 may include a thirteenth transistor M13 and a fourteenth transistor M14.

For example, as shown in FIG. 5, a control electrode of the thirteenth transistor M13 is electrically connected to the display reset signal terminal STD, a first electrode of the thirteenth transistor M13 is electrically connected to the pull-up node Q<N>, and a second electrode of the thirteenth transistor M13 is electrically connected to a first electrode of the fourteenth transistor M14 and the leakage prevention node OFF<N>. A control electrode of the fourteenth transistor M14 is electrically connected to the display reset signal terminal STD, and a second electrode of the fourteenth transistor M14 is electrically connected to the fourth voltage signal terminal VGL1.

In the case where the voltage of the display reset signal is at the high level, the thirteenth transistor M13 and the fourteenth transistor M14 may be simultaneously turned on due to the action of the display reset signal. The fourteenth transistor M14 may transmit the fourth voltage signal that is transmitted by the fourth voltage signal terminal VGL1 to the leakage prevention node OFF<N>, and the thirteenth transistor M13 may transmit the fourth voltage signal from the leakage prevention node OFF<N> to the pull-up node Q<N>, so as to reset the pull-up node Q<N>.

Here, in a case where the pull-up node Q<N> is at the high voltage and the second reset circuit 4106 is in a non-working state, the third transistor M3 may be turned on under the control of the voltage of the pull-up node Q<N>, and transmits the second voltage signal to the leakage prevention node OFF<N>, so that the voltage of the leakage prevention node OFF<N> is raised. As a result, a voltage difference between the control electrode and the second electrode of the thirteenth transistor M13 is less than zero, which ensures that the thirteenth transistor M13 is completely or relatively completely turned off. In this way, it may be possible to avoid the leakage of the pull-up node Q<N> through the second reset circuit 4106, so that the pull-up node Q<N> can be maintained at the relatively high and stable voltage.

Here, after the plurality of shift registers 41 are cascaded to constitute the scan driving circuit 4, the display reset signal terminal STD of the N-th shift register 41 may be, for example, electrically connected to the shift signal terminal CR<N+1> of the (N+1)-th shift register 41. As a result, the shift signal output from the shift signal terminal CR<N+1> of the (N+1)-th shift register 41 may be used as the display reset signal of the N-th shift register 41.

Of course, the cascaded relationship of the plurality of shift registers 41 is not limited thereto. For example, the display reset signal terminal STD of the N-th shift register 41 may be electrically connected to the shift signal terminal CR<N+4> of an (N+4)-th shift register 41, so that the shift signal output from the shift signal terminal CR<N+4> of the (N+4)-th shift register 41 may be used as the display reset signal of the N-th shift register 41.

For example, as shown in FIG. 5, the third reset circuit 4107 is electrically connected to a global reset signal terminal TRST, the pull-up node Q<N>, the fourth voltage signal terminal VGL1 and the leakage prevention node OFF<N>. The third reset circuit 4107 is configured to, under control of a global reset signal transmitted by the global reset signal terminal TRST, reset the pull-up node Q<N> and the leakage prevention node OFF<N> according to the fourth voltage signal transmitted by the fourth voltage signal terminal VGL1.

For example, in a case where the global reset signal is at a high level, the third reset circuit 4107 may be turned on due to an action of the global reset signal, and transmit the fourth voltage signal that is transmitted by the fourth voltage signal terminal VGL1 to the pull-up node Q<N>, so as to pull down the pull-up node Q<N> and reset the pull-up node Q<N>.

Optionally, as shown in FIG. 5, the third reset circuit 4107 may include a fifteenth transistor M15 and a sixteenth transistor M16.

For example, as shown in FIG. 5, a control electrode of the fifteenth transistor M15 is electrically connected to the global reset signal terminal TRST, a first electrode of the fifteenth transistor M15 is electrically connected to the pull-up node Q<N>, and a second electrode of the fifteenth transistor M15 is electrically connected to a first electrode of the sixteenth transistor M16 and the leakage prevention node OFF<N>. A control electrode of the sixteenth transistor M16 is electrically connected to the global reset signal terminal TRST, and a second electrode of the sixteenth transistor M16 is electrically connected to the fourth voltage signal terminal VGL1.

In the case where the voltage of the global reset signal is at the high level, the fifteenth transistor M15 and the sixteenth transistor M16 may be simultaneously turned on due to the action of the global reset signal. The sixteenth transistor M16 may transmit the fourth voltage signal that is transmitted by the fourth voltage signal terminal VGL1 to the leakage prevention node OFF<N>, and the fifteenth transistor M15 may transmit the fourth voltage signal from the leakage prevention node OFF<N> to the pull-up node Q<N>, so as to reset the pull-up node Q<N>.

Here, in a case where the pull-up node Q<N> is at the high voltage and the third reset circuit 4107 is in a non-working state, the third transistor M3 may be turned on under the control of the voltage of the pull-up node Q<N>, and transmit the second voltage signal to the leakage prevention node OFF<N>, so that the voltage of the leakage prevention node OFF<N> is raised. As a result, a voltage difference between the control electrode and the second electrode of the fifteenth transistor M15 is less than zero, which ensures that the fifteenth transistor M15 is completely or relatively completely turned off. In this way, it may be possible to avoid the leakage of the pull-up node Q<N> through the third reset circuit 4107, so that the pull-up node Q<N> can be maintained at the relatively high and stable voltage.

For example, as shown in FIG. 5, the fourth reset circuit 4108 is electrically connected to the pull-down node QB_A<N>, the shift signal terminal CR<N>, the first output signal terminal Oput1<N>, the fourth voltage signal terminal VGL1 and a fifth voltage signal terminal VGL2. The fourth reset circuit 4108 is configured to, under the control of the voltage of the pull-down node QB_A<N>, reset the shift signal terminal CR<N> according to the fourth voltage signal transmitted by the fourth voltage signal terminal VGL1, and reset the first output signal terminal Oput1<N> according to a fifth voltage signal transmitted by the fifth voltage signal terminal VGL2. The fifth voltage signal terminal VGL2 is configured to transmit a direct current low-level signal (e.g., a level of the direct current low-level signal is lower than or equal to the low level of the clock signal). For example, the fifth voltage signal terminal VGL2 may be grounded. Low-level signals transmitted by the fourth voltage signal terminal VGL1 and the fifth voltage signal terminal VGL2 may be the same or different.

For example, in the case where the voltage of the pull-down node QB_A<N> is at the high level, the fourth reset circuit 4108 may be turned on due to the action of the voltage of the pull-down node QB_A<N>, and transmit the fourth voltage signal that is transmitted by the fourth voltage signal terminal VGL1 to the shift signal terminal CR<N>, so as to pull down the shift signal terminal CR<N> and reset the shift signal terminal CR<N>, and transmit the fifth voltage signal that is transmitted by the fifth voltage signal terminal VGL2 to the first output signal terminal Oput1<N>, so as to pull down the first output signal terminal Oput1<N> and reset the first output signal terminal Oput1<N>.

Optionally, as shown in FIG. 5, the fourth reset circuit 4108 may include a seventeenth transistor M17 and an eighteenth transistor M18.

For example, as shown in FIG. 5, a control electrode of the seventeenth transistor M17 is electrically connected to the pull-down node QB_A<N>, a first electrode of the seventeenth transistor M17 is electrically connected to the shift signal terminal CR<N>, and a second electrode of the seventeenth transistor M17 is electrically connected to the fourth voltage signal terminal VGL1.

In the case where the voltage of the pull-down node QB_A<N> is at the high level, the seventeenth transistor M17 may be turned on due to the action of the voltage of the pull-down node QB_A<N>, and transmit the fourth voltage signal that is transmitted by the fourth voltage signal terminal VGL1 to the shift signal terminal CR<N>, so as to pull down the shift signal terminal CR<N> and reset the shift signal terminal CR<N>.

For example, as shown in FIG. 5, a control electrode of the eighteenth transistor M18 is electrically connected to the pull-down node QB_A<N>, a first electrode of the eighteenth transistor M18 is electrically connected to the first output signal terminal Oput1<N>, and a second electrode of the eighteenth transistor M18 is electrically connected to the fifth voltage signal terminal VGL2.

In the case where the voltage of the pull-down node QB_A<N> is at the high level, the eighteenth transistor M18 may be turned on due to the action of the voltage of the pull-down node QB_A<N>, and transmit the fifth voltage signal that is transmitted by the fifth voltage signal terminal VGL2 to the first output signal terminal Oput1<N>, so as to pull down the first output signal terminal Oput1<N> and reset the first output signal terminal Oput1<N>.

For example, as shown in FIG. 5, the fifth reset circuit 4109 is electrically connected to the input signal terminal Iput, the pull-down node QB_A<N> and the fourth voltage signal terminal VGL1. The fifth reset circuit 4109 is configured to, under control of the input signal transmitted by the input signal terminal Iput, reset the pull-down node QB_A<N> according to the fourth voltage signal transmitted by the fourth voltage signal terminal VGL1.

For example, in the case where the input signal is at the high level, the fifth reset circuit 4109 may be turned on due to an action of the input signal, and transmit the fourth voltage signal that is transmitted by the fourth voltage signal terminal VGL1 to the pull-down node QB_A<N>, so as to pull down the pull-down node QB_A<N> and reset the pull-down node QB_A<N>.

Optionally, as shown in FIG. 5, the fifth reset circuit 4109 may include a twentieth transistor M20.

For example, as shown in FIG. 5, a control electrode of the twentieth transistor M20 is electrically connected to the input signal terminal Iput, a first electrode of the twentieth transistor M20 is electrically connected to the pull-down node QB_A<N>, and a second electrode of the twentieth transistor M20 is electrically connected to the fourth voltage signal terminal VGL1.

In the case where the input signal is at the high level, the twentieth transistor M20 may be turned on due to the action of the input signal, and transmit the fourth voltage signal that is transmitted by the fourth voltage signal terminal VGL1 to the pull-down node QB_A<N>, so as to pull down the pull-down node QB_A<N> and reset the pull-down node QB_A<N>.

It will be noted that the blanking circuit 4110 is configured to control a corresponding shift register 41 to input a blanking control signal (i.e., the second scan signal) to pixel driving circuits 21 in a corresponding row in the blanking period of the frame display phase, so that the pixel driving circuits 21 obtain sensing signals.

A structure of the blanking circuit 4110 may be set according to actual needs. For example, as shown in FIG. 5, the blanking circuit 4110 may include: a selection control circuit 41101, a second input circuit 41102 and a transmission circuit 41103.

For example, as shown in FIG. 5, the selection control circuit 41101 is electrically connected to a selection control signal terminal OE, the shift signal terminal CR<N>, the second voltage signal terminal VDD and a first blanking node H. The selection control circuit 41101 is configured to transmit the shift signal received at the shift signal terminal CR<N> that is electrically connected to the selection control circuit 41101 to the first blanking node H under control of a selection control signal transmitted by the selection control signal terminal OE. The selection control circuit 41101 is further configured to maintain a voltage of the first blanking node H according to the second voltage signal transmitted by the second voltage signal terminal VDD.

For example, in a case where the selection control signal is at a high level, the selection control circuit 41101 may be turned on under the control of the selection control signal, and transmit the received shift signal to the first blanking node H to charge the first blanking node H, so that the voltage of the first blanking node H is raised.

In the blanking period of the frame display phase, in a case where the sensing signal is needed to be obtained, a waveform timing of the selection control signal and a waveform timing of the input signal may be the same, so that the selection control circuit 41101 is turned on.

Optionally, as shown in FIG. 5, the selection control circuit 41101 may include: a twenty-first transistor M21, a twenty-second transistor M22 and a third capacitor C3.

For example, as shown in FIG. 5, a control electrode of the twenty-first transistor M21 is electrically connected to the selection control signal terminal OE, a first electrode of the twenty-first transistor M21 is electrically connected to the shift signal terminal CR<N>, and a second electrode of the twenty-first transistor M21 is electrically connected to a first electrode of the twenty-second transistor M22. A control electrode of the twenty-second transistor M22 is electrically connected to the selection control signal terminal OE, and a second electrode of the twenty-second transistor M22 is electrically connected to the first blanking node H.

In a case where the selection control signal transmitted by the selection control signal terminal OE is at the high level, the twenty-first transistor M21 and the twenty-second transistor M22 may be simultaneously turned on due to an action of the selection control signal. The twenty-first transistor M21 may transmit the shift signal that is transmitted by the shift signal terminal CR<N> to the first electrode of the twenty-second transistor M22, and the twenty-second transistor M22 may receive the shift signal and transmit the shift signal to the first blanking node H to charge the first blanking node H.

For example, as shown in FIG. 5, a first terminal of the third capacitor C3 is electrically connected to the first blanking node H, and a second terminal of the third capacitor C3 is electrically connected to the second voltage signal terminal VDD.

In a process where the selection control circuit 41101 charges the first blanking node H, the third capacitor C3 is also charged. In this way, in a case where the selection control circuit 41101 is turned off, the third capacitor C3 may discharge, so that the first blanking node H is maintained at the high voltage.

In addition, as shown in FIG. 5, the selection control circuit 41101 may further include, for example, a twenty-third transistor M23. A control electrode of the twenty-third transistor M23 is electrically connected to the first blanking node H, a first electrode of the twenty-third transistor M23 is electrically connected to the second voltage signal terminal VDD, and a second electrode of the twenty-third transistor M23 is electrically connected to the first electrode of the twenty-second transistor M22.

In a case where the voltage of the first blanking node H is at the high level, and the twenty-first transistor M21 and the twenty-second transistor M22 do not work, the twenty-third transistor M23 may be turned on under control of the voltage of the first blanking node H, and transmit the second voltage signal that is transmitted by the second voltage signal terminal VDD to the first electrode of the twenty-second transistor M22, so that a voltage of the first electrode of the twenty-second transistor M22 is raised. As a result, a voltage difference between the control electrode and the first electrode of the twenty-second transistor M22 is less than zero, which ensures that the twenty-second transistor M22 is completely or relatively completely turned off. In this way, it may be possible to avoid the leakage of the first blanking node H through the twenty-second transistor M22, so that the first blanking node H can be maintained at the relatively high and stable voltage.

For example, as shown in FIG. 5, the second input circuit 41102 is electrically connected to the first blanking node H, a second blanking node N and the second voltage signal terminal VDD. The second input circuit 41102 is configured to transmit the second voltage signal received at the second voltage signal terminal VDD to the second blanking node N under the control of the voltage of the first blanking node H.

For example, in a case where the selection control circuit 41101 is turned on, and the voltage of the first blanking node H is raised, the second input circuit 41102 may be turned on under the control of the voltage of the first blanking node H, receive the second voltage signal transmitted by the second voltage signal terminal VDD, and transmit the second voltage signal to the second blanking node N.

Optionally, as shown in FIG. 5, the second input circuit 41102 may include a twenty-fourth transistor M24.

For example, as shown in FIG. 5, a control electrode of the twenty-fourth transistor M24 is electrically connected to the first blanking node H, a first electrode of the twenty-fourth transistor M24 is electrically connected to the second voltage signal terminal VDD, and a second electrode of the twenty-fourth transistor M24 is electrically connected to the second blanking node N.

In the case where the voltage of the first blanking node H is at the high level, the twenty-fourth transistor M24 may be turned on under the control of the voltage of the first blanking node H, and transmit the second voltage signal received at the second voltage signal terminal VDD to the second blanking node N.

For example, as shown in FIG. 5, the transmission circuit 41103 is electrically connected to the second blanking node N, a third clock signal terminal CLKA and the pull-up node Q<N>. The transmission circuit 41103 is configured to transmit the second voltage signal received at the second blanking node N to the pull-up node Q<N> under control of a third clock signal transmitted by the third clock signal terminal CLKA.

For example, in a case where the third clock signal transmitted by the third clock signal terminal CLKA is at a high level, the transmission circuit 41103 may be turned on under the control of the third clock signal, receive the second voltage signal from the second blanking node N, and transmit the received second voltage signal to the pull-up node Q<N>, so that the voltage of the pull-up node Q<N> is raised. As a result, the output circuit 4103 may be turned on, and thus the first output signal terminal Oput1<N> of the output circuit 4103 outputs the another second clock signal received at the second clock signal terminal CLKE_1 as the another first output signal (i.e., the second scan signal received by the pixel driving circuit 21).

Optionally, as shown in FIG. 5, the transmission circuit 41103 may include a twenty-fifth transistor M25.

For example, as shown in FIG. 5, a control electrode of the twenty-fifth transistor M25 is electrically connected to the third clock signal terminal CLKA, a first electrode of the twenty-fifth transistor M25 is electrically connected to the second blanking node N, and a second electrode of the twenty-fifth transistor M25 is electrically connected to the pull-up node Q<N>.

In the case where the third clock signal transmitted by the third clock signal terminal CLKA is at the high level, the twenty-fifth transistor M25 may be turned on due to an action of the third clock signal, and the twenty-fifth transistor M25 may transmit the second voltage signal from the second blanking node N to the pull-up node Q<N> to charge the pull-up node Q<N>. The fifth transistor M5 in the output circuit 4103 may be turned on under the control of the voltage of the pull-up node Q<N>, receive the another second clock signal, and output the another second clock signal as the another first output signal from the first output signal terminal Oput1<N>.

Figure 7:
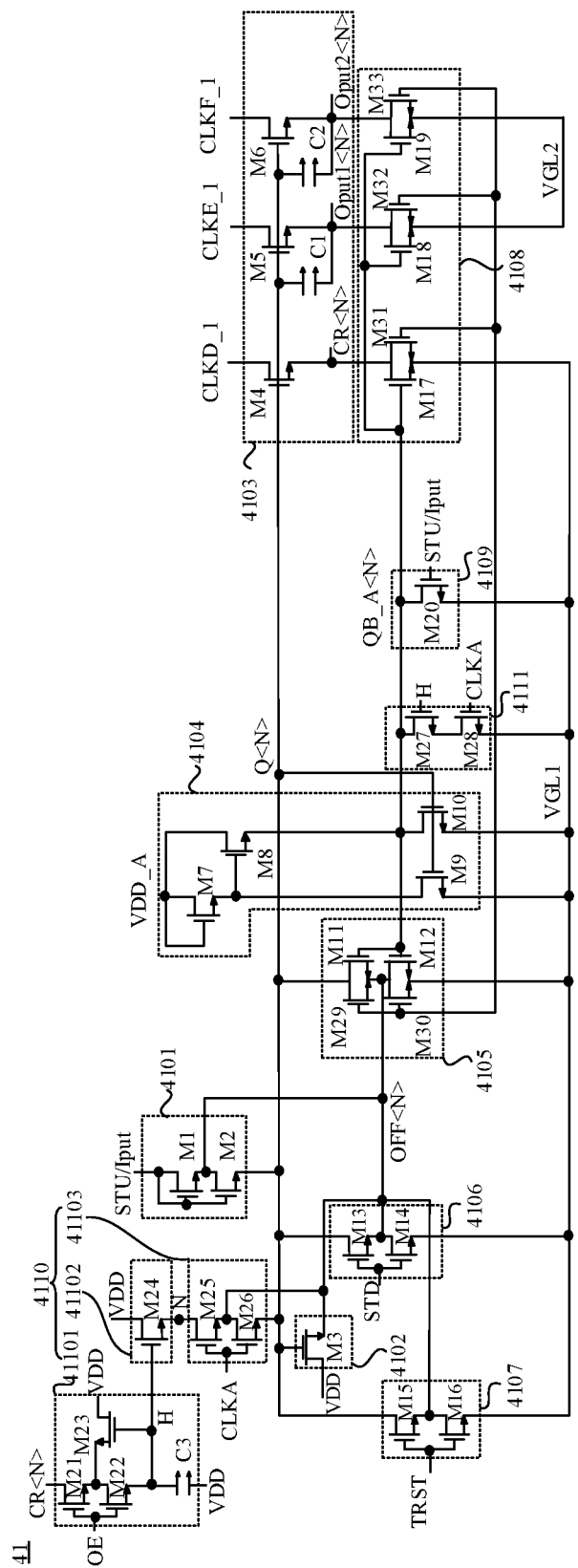
FIG. 7 is a circuit diagram of yet another shift register, in accordance with some embodiments of the present disclosure.

In addition, as shown in FIG. 7, the transmission circuit 41103 may further include a twenty-sixth transistor M26.

For example, as shown in FIG. 7, a control electrode of the twenty-sixth transistor M26 is electrically connected to the third clock signal terminal CLKA, a first electrode of the twenty-sixth transistor M26 is electrically connected to the second electrode of the twenty-fifth transistor M25, and a second electrode of the twenty-sixth transistor M26 is electrically connected to the pull-up node Q<N>. That is, the twenty-fifth transistor M25 is electrically connected to the pull-up node Q<N> through the twenty-sixth transistor M26.

In the case where the third clock signal transmitted by the third clock signal terminal CLKA is at the high level, the twenty-fifth transistor M25 and the twenty-sixth transistor M26 may be simultaneously turned on due to the action of the third clock signal. The twenty-fifth transistor M25 may transmit the second voltage signal from the second blanking node N to the first electrode of the twenty-sixth transistor M26, and the twenty-sixth transistor M26 may receive the second voltage signal and transmit the second voltage signal to the pull-up node Q<N> to charge the pull-up node Q<N>.

In a case where the transmission circuit 41103 is further electrically connected to the leakage prevention node OFF<N>, as shown in FIG. 7, the first electrode of the twenty-sixth transistor M26 may be electrically connected to the leakage prevention node OFF<N>.

Here, in a case where the pull-up node Q<N> is at the high voltage and the transmission circuit 41103 is in a non-working state, the third transistor M3 may be turned on under the control of the voltage of the pull-up node Q<N>, and transmit the second voltage signal to the leakage prevention node OFF<N>, so that the voltage of the leakage prevention node OFF<N> is raised. As a result, a voltage difference between the control electrode and the first electrode of the twenty-sixth transistor M26 is less than zero, which ensures that the twenty-sixth transistor M26 is completely or relatively completely turned off. In this way, it may be possible to avoid the leakage of the pull-up node Q<N> through the transmission circuit 41103, so that the pull-up node Q<N> can be maintained at the relatively high and stable voltage.

For example, as shown in FIG. 5, the sixth reset circuit 4111 is electrically connected to the third clock signal terminal CLKA, the first blanking node H, the pull-down node QB_A<N> and the fourth voltage signal terminal VGL1. The sixth reset circuit 4111 is configured to, under control of both the third clock signal transmitted by the third clock signal terminal CLKA and the voltage of the first blanking node H, reset the pull-down node QB_A<N> according to the fourth voltage signal transmitted by the fourth voltage signal terminal VGL1 in the blanking period of the frame display phase.

For example, in the blanking period of the frame display phase, in a case where the third clock signal is at the high level and the voltage of the first blanking node H is at the high level, the sixth reset circuit 4111 may be turned on under the control of both the third clock signal and the voltage of the first blanking node H, and transmit the fourth voltage signal that is transmitted by the fourth voltage signal terminal VGL1 to the pull-down node QB_A<N>, so as to pull down the pull-down node QB_A<N> and reset the pull-down node QB_A<N>.

Optionally, as shown in FIG. 5, the sixth reset circuit 4111 may include a twenty-seventh transistor M27 and a twenty-eighth transistor M28.

For example, as shown in FIG. 5, a control electrode of the twenty-seventh transistor M27 is electrically connected to the first blanking node H, a first electrode of the twenty-seventh transistor M27 is electrically connected to the pull-down node QB_A<N>, and a second electrode of the twenty-seventh transistor M27 is electrically connected to a first electrode of the twenty-eighth transistor M28. A control electrode of the twenty-eighth transistor M28 is electrically connected to the third clock signal terminal CLKA, and a second electrode of the twenty-eighth transistor M28 is electrically connected to the fourth voltage signal terminal VGL1.

In the case where the third clock signal is at the high level and the voltage of the first blanking node H is at the high level, the twenty-eighth transistor M28 may be turned on under control of the third clock signal, and transmit the fourth voltage signal to the first electrode of the twenty-eighth transistor M28; the twenty-seventh transistor M27 may be turned on under the control of the voltage of the first blanking node H, and transmit the fourth voltage signal from the first electrode of the twenty-eighth transistor M28 to the pull-down node QB_A<N>, so as to pull down the pull-down node QB_A<N> and reset the pull-down node QB_A<N>.

Figure 6:
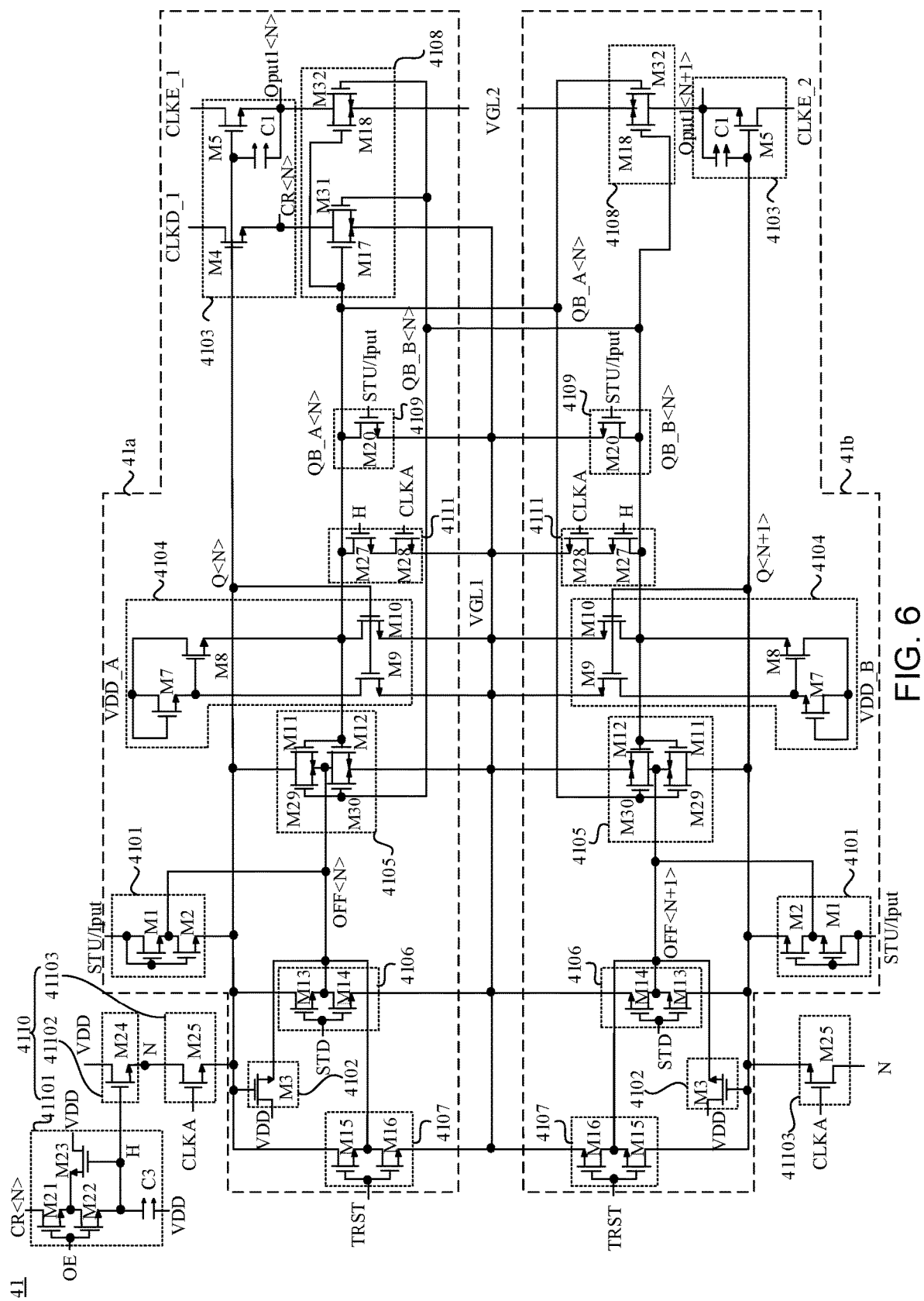
FIG. 6 is a circuit diagram of another shift register, in accordance with some embodiments of the present disclosure.

In some other examples, as shown in FIG. 6, at least two shift registers 41 may share a same blanking circuit 4110. In this case, the at least two shift registers 41 sharing the same blanking circuit 4110 may be collectively referred to as a shift register group, and other circuits except the blanking circuit 4110 in the shift register group may be referred to as scan units.

As shown in FIG. 6, in an example where two adjacent stages shift registers 41 share one blanking circuit 4110, all of which constitute the shift register group. The shift register group may include a first scan unit 41a and a second scan unit 41b. For example, the first scan unit 41a may be electrically connected to pixel driving circuits 21 in a row of sub-pixels 2, and the second scan unit 41b may be electrically connected to pixel driving circuits 21 in another row of sub-pixels 2.

For example, as shown in FIG. 6, the first scan unit 41a and the second scan unit 41b each may include: the first input circuit 4101, the leakage prevention circuit 4102, the output circuit 4103, the control circuit 4104, the first reset circuit 4105, the second reset circuit 4106, the third reset circuit 4107, the fourth reset circuit 4108, the fifth reset circuit 4109 and the sixth reset circuit 4111.

First input circuits 4101 in the first scan unit 41a and the second scan unit 41b may have the same structure and function as the first input circuit 4101 in some of the above examples. Leakage prevention circuits 4102 in the first scan unit 41a and the second scan unit 41b may have the same structure and function as the leakage prevention circuit 4102 in some of the above examples. The output circuit 4103 in the first scan unit 41a may have the same structure and function as the output circuit 4103 in some of the above examples. The control circuit 4104 in the first scan unit 41a may have the same structure and function as the control circuit 4104 in some of the above examples. First reset circuits 4105 in the first scan unit 41a and the second scan unit 41b may have the same structure and function as the first reset circuit 4105 in some of the above examples. Second reset circuits 4106 in the first scan unit 41a and the second scan unit 41b may have the same structure and function as the second reset circuit 4106 in some of the above examples. Third reset circuits 4107 in the first scan unit 41a and the second scan unit 41b may have the same structure and function as the third reset circuit 4107 in some of the above examples. The fourth reset circuit 4108 in the first scan unit 41a may have the same structure and function as the fourth reset circuit 4108 in some of the above examples. Fifth reset circuits 4109 in the first scan unit 41a and the second scan unit 41b may have the same structure and function as the fifth reset circuit 4109 in some of the above examples. Sixth reset circuits 4111 in the first scan unit 41a and the second scan unit 41b may have the same structure and function as the sixth reset circuit 4111 in some of the above examples. The structure and function of the same circuit will not be repeated here.

For example, as shown in FIG. 6, compared with the output circuit 4103 in the first scan unit 41a, the output circuit 4103 in the second scan unit 41b may not be provided with the fourth transistor M4 therein, and may not be electrically connected to the shift signal terminal CR<N> and the first clock signal terminal CLKD_1.

For example, as shown in FIG. 6, the control circuit 4104 in the second scan unit 41b may be electrically connected to a sixth voltage signal terminal VDD_B, which replaces the third voltage signal terminal VDD_A. In the frame display phase, the third voltage signal transmitted by the third voltage signal terminal VDD_A and a sixth voltage signal transmitted by the sixth voltage signal terminal VDD_B are inverted signals.

For example, as shown in FIG. 6, compared with the fourth reset circuit 4108 in first scan unit 41a, the fourth reset circuit 4108 in the second scan unit 41b may not be provided with the seventeenth transistor M17 therein.

Based on this, in order to describe the structure of the shift register group more clearly, the pull-up node Q<N> in the first scan unit 41a may be referred to as a first pull-up node Q<N>, and the pull-up node Q<N> in the second scan unit 41b may be referred to as a second pull-up node Q<N+1>. The pull-down node QB_A<N> in the first scan unit 41a may be referred to as a first pull-down node QB_A<N>, and the pull-down node QB_A<N> in the second scan unit 41b may be referred to as a second pull-down node QB_B<N>. The leakage prevention node OFF<N> in the first scan unit 41a may be referred to as a first leakage prevention node OFF<N>, and the leakage prevention node OFF<N> in the second scan unit 41b may be referred to as a second leakage prevention node OFF<N+1>. The second clock signal terminal CLKE_1 in the second scan unit 41b may be referred to as a fourth clock signal terminal CLKE_2. The first output signal terminal Oput1<N> in the first scan unit 41a may be referred to as a first output signal sub-terminal Oput1<N>, and the first output signal terminal Oput1<N> in the second scan unit 41b may be referred to as a second output signal sub-terminal Oput1<N+1>.

For example, as shown in FIG. 6, the first pull-down node QB_A<N> in the first scan unit 41a may be electrically connected to the second scan unit 41b, and the second pull-down node QB_B<N> in the second scan unit 41b may be electrically connected to the first scan unit 41a.

Based on this, for example, as shown in FIG. 6, the first reset circuit 4105 in the first scan unit 41a may further be electrically connected to the second pull-down node QB_B<N>, and the first reset circuit 4105 is further configured to, under control of a voltage of the second pull-down node QB_B<N>, reset the first pull-up node Q<N>.

For example, in a case where the voltage of the second pull-down node QB_B<N> is at a high level, the first reset circuit 4105 in the first scan unit 41*a* may be turned on due to an action of the voltage of the second pull-down node QB_B<N>, and transmit the fourth voltage signal that is transmitted by the fourth voltage signal terminal VGL1 to the first pull-up node Q<N>, so as to pull down the first pull-up node Q<N> and reset the first pull-up node Q<N>.

Optionally, as shown in FIG. 6, the first reset circuit 4105 in the first scan unit 41*a* may further include a twenty-ninth transistor M29 and a thirtieth transistor M30.

For example, as shown in FIG. 6, in the first scan unit 41*a*, a control electrode of the twenty-ninth transistor M29 is electrically connected to the second pull-down node QB_B<N>, a first electrode of the twenty-ninth transistor M29 is electrically connected to the first pull-up node Q<N>, and a second electrode of the twenty-ninth transistor M29 is electrically connected to a first electrode of the thirtieth transistor M30 and the first leakage prevention node OFF<N>. A control electrode of the thirtieth transistor M30 is electrically connected to the second pull-down node QB_B<N>, and a second electrode of the thirtieth transistor M30 is electrically connected to the fourth voltage signal terminal VGL1.

In the case where the voltage of the second pull-down node QB_B<N> is at the high level, the twenty-ninth transistor M29 and the thirtieth transistor M30 may be simultaneously turned on due to the action of the voltage of the second pull-down node QB_B<N>. The thirtieth transistor M30 may transmit the fourth voltage signal that is transmitted by the fourth voltage signal terminal VGL1 to the first leakage prevention node OFF<N>, and the twenty-ninth transistor M29 may transmit the fourth voltage signal from the first leakage prevention node OFF<N> to the first pull-up node Q<N> to reset the first pull-up node Q<N>.

For example, as shown in FIG. 6, the first reset circuit 4105 in the second scan unit 41*b* may further be electrically connected to the first pull-down node QB_A<N>, and the first reset circuit 4105 is further configured to, under control of a voltage of the first pull-down node QB_A<N>, reset the second pull-up node Q<N+1>.

For example, in a case where the voltage of the first pull-down node QB_A<N> is at a high level, the first reset circuit 4105 in the second scan unit 41*b* may be turned on due to an action of the voltage of the first pull-down node QB_A<N>, and transmit the fourth voltage signal that is transmitted by the fourth voltage signal terminal VGL1 to the second pull-up node Q<N+1>, so as to pull down the second pull-up node Q<N+1> and reset the second pull-up node Q<N+1>.

Optionally, as shown in FIG. 6, the first reset circuit 4105 in the second scan unit 41*b* may further include a twenty-ninth transistor M29 and a thirtieth transistor M30.

For example, as shown in FIG. 6, in the second scan unit 41*b*, a control electrode of the twenty-ninth transistor M29 is electrically connected to the first pull-down node QB_A<N>, a first electrode of the twenty-ninth transistor M29 is electrically connected to the second pull-up node Q<N+1>, and a second electrode of the twenty-ninth transistor M29 is electrically connected to a first electrode of the thirtieth transistor M30 and the second leakage prevention node OFF<N+1>; a control electrode of the thirtieth transistor M30 is electrically connected to the first pull-down node QB_A<N>, and a second electrode of the thirtieth transistor M30 is electrically connected to the fourth voltage signal terminal VGL1.

In the case where the voltage of the first pull-down node QB_A<N> is at the high level, the twenty-ninth transistor M29 and the thirtieth transistor M30 may be simultaneously turned on due to the action of the voltage of the first pull-down node QB_A<N>. The thirtieth transistor M30 may transmit the fourth voltage signal that is transmitted by the fourth voltage signal terminal VGL1 to the second leakage prevention node OFF<N+1>, and the twenty-ninth transistor M29 may transmit the fourth voltage signal from the second leakage prevention node OFF<N+1> to the second pull-up node Q<N+1> to reset the second pull-up node Q<N+1>.

For example, as shown in FIG. 6, the fourth reset circuit 4108 in the first scan unit 41*a* may further be electrically connected to the second pull-down node QB_B<N>, and the fourth reset circuit 4108 is further configured to, under control of the voltage of the second pull-down node QB_B<N>, reset the shift signal terminal CR<N> and the first output signal sub-terminal Oput1<N>.

For example, in the case where the voltage of the second pull-down node QB_B<N> is at the high level, the fourth reset circuit 4108 in the first scan unit 41*a* may be turned on due to the action of the voltage of the second pull-down node QB_B<N>, transmit the fourth voltage signal that is transmitted by the fourth voltage signal terminal VGL1 to the shift signal terminal CR<N>, so as to pull down the shift signal terminal CR<N> and reset the shift signal terminal CR<N>, and transmit the fifth voltage signal that is transmitted by the fifth voltage signal terminal VGL2 to the first output signal sub-terminal Oput1<N>, so as to pull down the first output signal sub-terminal Oput1<N> and reset the first output signal sub-terminal Oput1<N>.

Optionally, as shown in FIG. 6, the fourth reset circuit 4108 in the first scan unit 41*a* may further include a thirty-first transistor M31 and a thirty-second transistor M32.

For example, as shown in FIG. 6, a control electrode of the thirty-first transistor M31 is electrically connected to the second pull-down node QB_B<N>, a first electrode of the thirty-first transistor M31 is electrically connected to the shift signal terminal CR<N>, and a second electrode of the thirty-first transistor M31 is electrically connected to the fourth voltage signal terminal VGL1.

In the case where the voltage of the second pull-down node QB_B<N> is at the high level, the thirty-first transistor M31 may be turned on due to the action of the voltage of the second pull-down node QB_B<N>, and transmit the fourth voltage signal that is transmitted by the fourth voltage signal terminal VGL1 to the shift signal terminal CR<N>, so as to pull down the shift signal terminal CR<N> and reset the shift signal terminal CR<N>.

For example, as shown in FIG. 6, a control electrode of the thirty-second transistor M32 is electrically connected to the second pull-down node QB_B<N>, a first electrode of the thirty-second transistor M32 is electrically connected to the first output signal sub-terminal Oput1<N>, and a second electrode of the thirty-second transistor M32 is electrically connected to the fifth voltage signal terminal VGL2.

In the case where the voltage of the second pull-down node QB_B<N> is at the high level, the thirty-second transistor M32 may be turned on due to the action of the voltage of the second pull-down node QB_B<N>, and transmit the fifth voltage signal that is transmitted by the fifth voltage signal terminal VGL2 to the first output signal sub-terminal Oput1<N>, so as to pull down the first output signal sub-terminal Oput1<N> and reset the first output signal sub-terminal Oput1<N>.

For example, as shown in FIG. 6, the fourth reset circuit 4108 in the second scan unit 41b may further be electrically connected to the first pull-down node QB_A<N>, and the fourth reset circuit 4108 is further configured to, under control of the voltage of the first pull-down node QB_A<N>, reset the second output signal sub-terminal Oput1<N+1>.

For example, in the case where the voltage of the first pull-down node QB_A<N> is at the high level, the fourth reset circuit 4108 in the second scan unit 41b may be turned on due to the action of the voltage of the first pull-down node QB_A<N>, and transmit the fifth voltage signal that is transmitted by the fifth voltage signal terminal VGL2 to the second output signal sub-terminal Oput1<N+1>, so as to pull down the second output signal sub-terminal Oput1<N+1> and reset the second output signal sub-terminal Oput1<N+1>.

Optionally, as shown in FIG. 6, the fourth reset circuit 4108 in the second scan unit 41b may further include a thirty-second transistor M32.

For example, as shown in FIG. 6, a control electrode of the thirty-second transistor M32 is electrically connected to the first pull-down node QB_A<N>, a first electrode of the thirty-second transistor M32 is electrically connected to the second output signal sub-terminal Oput1<N+1>, and a second electrode of the thirty-second transistor M32 is electrically connected to the fifth voltage signal terminal VGL2.

In the case where the voltage of the first pull-down node QB_A<N> is at the high level, the thirty-second transistor M32 may be turned on due to the action of the voltage of the first pull-down node QB_A<N>, and transmit the fifth voltage signal that is transmitted by the fifth voltage signal terminal VGL2 to the second output signal sub-terminal Oput1<N+1>, so as to pull down the second output signal sub-terminal Oput1<N+1> and reset the second output signal sub-terminal Oput1<N+1>.

In this example, the shift signal terminal CR<N> in an M-th shift register group may be, for example, electrically connected to input signal terminals Iput of the first scan unit 41a and the second scan unit 41b in an (M+1)-th shift register group, and thus the shift signal output from the shift signal terminal CR<N> of the N-th shift register 41 may be used as an input signal of the first scan unit 41a and the second scan unit 41b in the (M+1)-th shift register group. Display reset signal terminals STD of the first scan unit 41a and the second scan unit 41b in the M-th shift register group may be, for example, electrically connected to the shift signal terminal CR<N+2> of the (N+2)-th shift register 41 corresponding to the (M+1)-th shift register group, and thus the shift signal output from the shift signal terminal CR<N+2> of the (N+2)-th shift register 41 is used as a display reset signal of the first scan unit 41a and the second scan unit 41b in the M-th shift register group. Of course, the cascaded relationship of the plurality of shift registers 41 is not limited thereto.

For example, the shift signal terminal CR<1> of the first shift register 41 may be electrically connected to input signal terminals Iput of a third shift register 41 and a fourth shift register 41. The shift signal terminal CR<5> of a fifth shift register 41 may be electrically connected to display reset signal terminals STD of the first shift register 41 and the second shift register 41.

In this way, it helps simplify the structure of the scan driving circuit 4 and reduce space occupied by the scan driving circuit 4 in the display panel 100.

In yet some other examples, the shift register 41 may be electrically connected to pixel driving circuits 21 in a row of sub-pixels 2.

As shown in FIG. 7, for example, the shift register 41 may include: the first input circuit 4101, the leakage prevention circuit 4102, the output circuit 4103, the control circuit 4104, the first reset circuit 4105, the second reset circuit 4106, the third reset circuit 4107, the fourth reset circuit 4108, the fifth reset circuit 4109, the blanking circuit 4110 and the sixth reset circuit 4111. Of course, the shift register 41 may include only some of the circuits, as long as the sub-pixel 2 may achieve the above working process.

For example, the first input circuit 4101 in this example may have the same structure and function as the first input circuit 4101 in the examples shown in FIG. 5. The leakage prevention circuit 4102 in this example may have the same structure and function as the leakage prevention circuit 4102 in the examples shown in FIG. 5. The control circuit 4104 in this example may have the same structure and function as the control circuit 4104 in the examples shown in FIG. 5. The first reset circuit 4105 in this example may have the same structure and function as the first reset circuit 4105 in the examples shown in FIG. 5. The second reset circuit 4106 in this example may have the same structure and function as the second reset circuit 4106 in the examples shown in FIG. 5. The third reset circuit 4107 in this example may have the same structure and function as the third reset circuit 4107 in the examples shown in FIG. 5. The fifth reset circuit 4109 in this example may have the same structure and function as the fifth reset circuit 4109 in the examples shown in FIG. 5. The blanking circuit 4110 in this example may have the same structure and function as the blanking circuit 4110 in the examples shown in FIG. 5. The sixth reset circuit 4111 in this example may have the same structure and function as the sixth reset circuit 4111 in the examples shown in FIG. 5. The structure and function of the same circuit will not be repeated here.

For example, as shown in FIG. 7, the output circuit 4103 is electrically connected to the pull-up node Q<N>, the first clock signal terminal CLKD_1, the shift signal terminal CR<N>, the second clock signal terminal CLKE_1, the first output signal terminal Oput1<N>, a fifth clock signal terminal CLKF_1 and a second output signal terminal (which is abbreviated as Oput2<N> in the drawings and following content) Output2<N>. The output circuit 4103 is configured to: under the control of the voltage of the pull-up node Q<N>, transmit the first clock signal received at the first clock signal terminal CLKD_1 to the shift signal terminal CR<N> and transmit the second clock signal received at the second clock signal terminal CLKE_1 to the first output signal terminal Oput1<N> in the display period of the frame display phase; and under the control of the voltage of the pull-up node Q<N>, transmit a fifth clock signal received at the fifth clock signal terminal CLKF_1 to the second output signal terminal Oput2<N> in the blanking period of the frame display phase.

For example, in the display period of the frame display phase, in the case where the voltage of the pull-up node Q<N> is raised, the output circuit 4103 may be turned on under the control of the voltage of the pull-up node Q<N>, output the first clock signal received at the first clock signal terminal CLKD_1 as the shift signal from the shift signal terminal CR<N>, and output the second clock signal received at the second clock signal terminal CLKE_1 as the first output signal (i.e., the first scan signal received by the pixel driving circuit 21) from the first output signal terminal Oput1<N>. In the blanking period of the frame display phase, in the case where the voltage of the pull-up node Q<N> is raised, the output circuit 4103 may be turned on under the control of the voltage of the pull-up node Q<N>, and output the fifth clock signal received at the fifth clock signal terminal CLKF_1 as the second output signal (i.e., the second scan signal received by the pixel driving circuit 21) from the second output signal terminal Oput2<N>.

In this example, the first output signal terminal Oput1<N> may be electrically connected to the first gate line, and the first output signal output from the first output signal terminal Oput1<N> may be used as the first scan signal and transmitted to a corresponding pixel driving circuit 21 through the first gate line and the first scan signal terminal G1 in sequence. The second output signal terminal Oput2<N> may be electrically connected to the second gate line, and the second output signal output from the second output signal terminal Oput2<N> may be used as the second scan signal and transmitted to a corresponding pixel driving circuit 21 through the second gate line and the second scan signal terminal G2 in sequence.

Optionally, as shown in FIG. 7, the output circuit 4103 may include: a fourth transistor M4, a fifth transistor M5, a sixth transistor M6, a first capacitor C1 and a second capacitor C2.

For example, as shown in FIG. 7, a control electrode of the fourth transistor M4 is electrically connected to the pull-up node Q<N>, a first electrode of the fourth transistor M4 is electrically connected to the first clock signal terminal CLKD_1, and a second electrode of the fourth transistor M4 is electrically connected to the shift signal terminal CR<N>.

In the display period of the frame display phase, in a case where the first input circuit 4101 is turned on, and the voltage of the pull-up node Q<N> is raised, the fourth transistor M4 may be turned on under the control of the high voltage of the pull-up node Q<N>, receive the first clock signal and transmit the first clock signal to the shift signal terminal CR<N>, and output the first clock signal as the shift signal from the shift signal terminal CR<N>.

For example, as shown in FIG. 7, a control electrode of the fifth transistor M5 is electrically connected to the pull-up node Q<N>, a first electrode of the fifth transistor M5 is electrically connected to the second clock signal terminal CLKE_1, and a second electrode of the fifth transistor M5 is electrically connected to the first output signal terminal Oput1<N>. A first terminal of the first capacitor C1 is electrically connected to the pull-up node Q<N>, and a second terminal of the first capacitor C1 is electrically connected to the first output signal terminal Oput1<N>.

In the display period of the frame display phase, the first capacitor C1 is charged while the first input circuit 4101 is turned on and the voltage of the pull-up node Q<N> is raised. In a case where the first input circuit 4101 is turned off, the first capacitor C1 may discharge, so that the pull-up node Q<N> is maintained at a high level. As a result, the fifth transistor M5 may remain in a turned-on state, receive the second clock signal and transmit the second clock signal to the first output signal terminal Oput1<N>, and output the second clock signal as the first output signal (i.e., the first scan signal received by the pixel driving circuit 21) from the first output signal terminal Oput1<N>.

For example, as shown in FIG. 7, a control electrode of the sixth transistor M6 is electrically connected to the pull-up node Q<N>, a first electrode of the sixth transistor M6 is electrically connected to the fifth clock signal terminal CLKF_1, and a second electrode of the sixth transistor M6 is electrically connected to the second output signal terminal Oput2<N>. A first terminal of the second capacitor C2 is electrically connected to the pull-up node Q<N>, and a second terminal of the second capacitor C2 is electrically connected to the second output signal terminal Oput2<N>.

In the blanking period of the frame display phase, the second capacitor C2 is charged while the voltage of the pull-up node Q<N> is raised. In a corresponding period, the second capacitor C2 may discharge, so that the pull-up node Q<N> is maintained at the high level. As a result, the sixth transistor M6 may remain in a turned-on state, transmit the fifth clock signal to the second output signal terminal Oput2<N>, and output the fifth clock signal as the second output signal from the second output signal terminal Oput2<N>.

For example, as shown in FIG. 7, the fourth reset circuit 4108 is electrically connected to the pull-down node QB_A<N>, the shift signal terminal CR<N>, the first output signal terminal Oput1<N>, the second output signal terminal Oput2<N>, the fourth voltage signal terminal VGL1 and the fifth voltage signal terminal VGL2. The fourth reset circuit 4108 is configured to, under the control of the voltage of the pull-down node QB_A<N>, reset the shift signal terminal CR<N> according to the fourth voltage signal transmitted by the fourth voltage signal terminal VGL1, and reset the first output signal terminal Oput1<N> and the second output signal terminal Oput2<N> according to the fifth voltage signal transmitted by the fifth voltage signal terminal VGL2.

For example, in the case where the voltage of the pull-down node QB_A<N> is at the high level, the fourth reset circuit 4108 may be turned on due to the action of the voltage of the pull-down node QB_A<N>, transmit the fourth voltage signal that is transmitted by the fourth voltage signal terminal VGL1 to the shift signal terminal CR<N> to pull down the shift signal terminal CR<N> and reset the shift signal terminal CR<N>, transmit the fifth voltage signal that is transmitted by the fifth voltage signal terminal VGL2 to the first output signal terminal Oput1<N> to pull down the first output signal terminal Oput1<N> and reset the first output signal terminal Oput1<N>, and transmit the fifth voltage signal that is transmitted by the fifth voltage signal terminal VGL2 to the second output signal terminal Oput2<N> to pull down the second output signal terminal Oput2<N> and reset the second output signal terminal Oput2<N>.

Optionally, as shown in FIG. 7, the fourth reset circuit 4108 may include a seventeenth transistor M17, an eighteenth transistor M18 and a nineteenth transistor M19.

For example, as shown in FIG. 7, a control electrode of the seventeenth transistor M17 is electrically connected to the pull-down node QB_A<N>, a first electrode of the seventeenth transistor M17 is electrically connected to the shift signal terminal CR<N>, and a second electrode of the seventeenth transistor M17 is electrically connected to the fourth voltage signal terminal VGL1.

In the case where the voltage of the pull-down node QB_A<N> is at the high level, the seventeenth transistor M17 may be turned on due to the action of the voltage of the pull-down node QB_A<N>, and transmit the fourth voltage signal that is transmitted by the fourth voltage signal terminal VGL1 to the shift signal terminal CR<N>, so as to pull down the shift signal terminal CR<N> and reset the shift signal terminal CR<N>.

For example, as shown in FIG. 7, a control electrode of the eighteenth transistor M18 is electrically connected to the pull-down node QB_A<N>, a first electrode of the eighteenth transistor M18 is electrically connected to the first output signal terminal Oput1<N>, and a second electrode of the eighteenth transistor M18 is electrically connected to the fifth voltage signal terminal VGL2.

In the case where the voltage of the pull-down node QB_A<N> is at the high level, the eighteenth transistor M18 may be turned on due to the action of the voltage of the pull-down node QB_A<N>, and transmit the fifth voltage signal that is transmitted by the fifth voltage signal terminal VGL2 to the first output signal terminal Oput1<N>, so as to pull down the first output signal terminal Oput1<N> and reset the first output signal terminal Oput1<N>.

For example, as shown in FIG. 7, a control electrode of the nineteenth transistor M19 is electrically connected to the pull-down node QB_A<N>, a first electrode of the nineteenth transistor M19 is electrically connected to the second output signal terminal Oput2<N>, and a second electrode of the nineteenth transistor M19 is electrically connected to the fifth voltage signal terminal VGL2.

In the case where the voltage of the pull-down node QB_A<N> is at the high level, the nineteenth transistor M19 may be turned on due to the action of the voltage of the pull-down node QB_A<N>, and transmit the fifth voltage signal that is transmitted by the fifth voltage signal terminal VGL2 to the second output signal terminal Oput2<N>, so as to pull down the second output signal terminal Oput2<N> and reset the second output signal terminal Oput2<N>.

Figure 8:
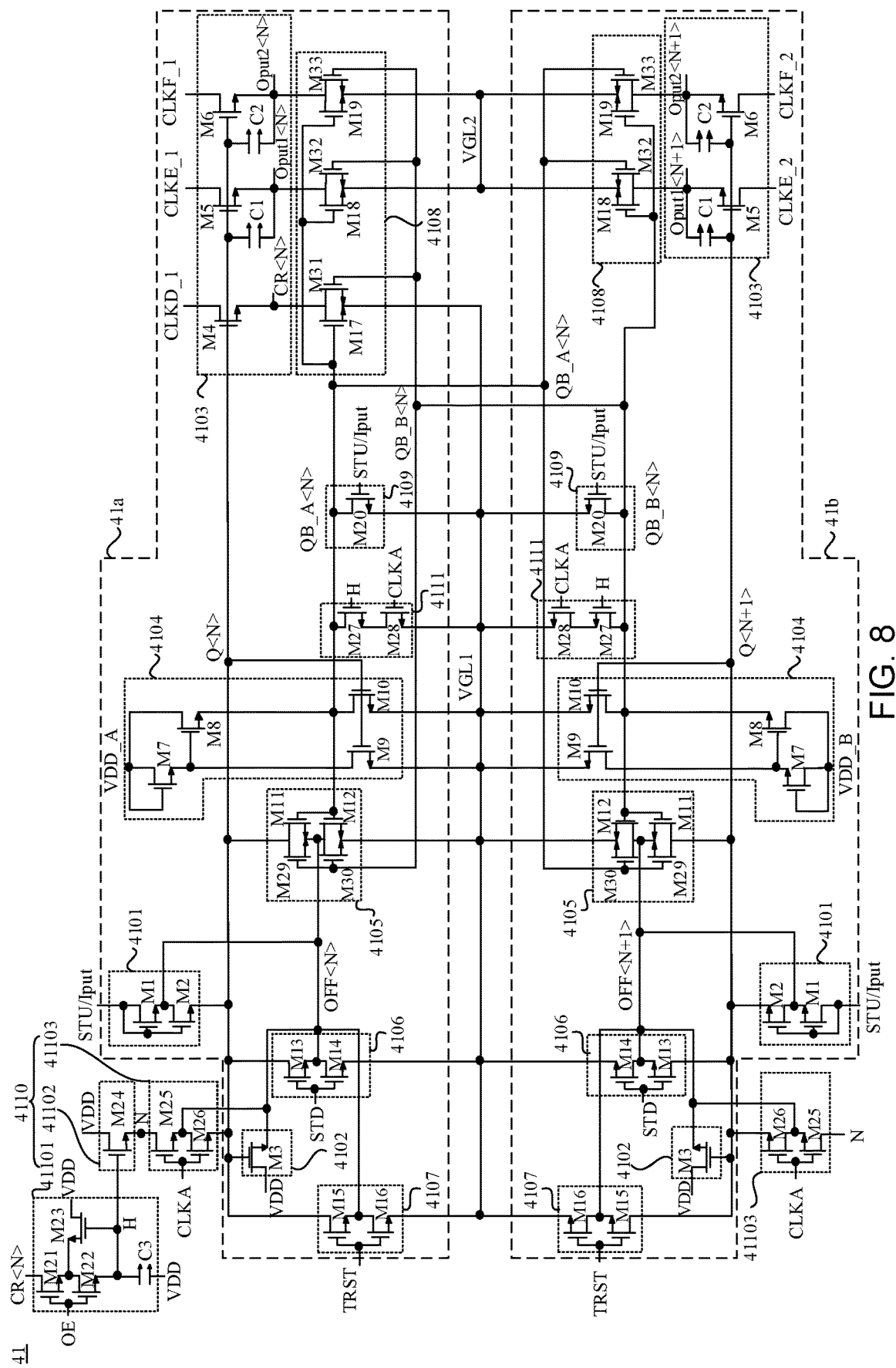
FIG. 8 is a circuit diagram of yet another shift register, in accordance with some embodiments of the present disclosure.

In yet other examples, as shown in FIG. 8, at least two shift registers 41 in the examples shown in FIG. 7 may share a same blanking circuit 4110. In this case, the at least two shift registers 41 sharing the same blanking circuit 4110 may be collectively referred to as a shift register group, and other circuits except the blanking circuit 4110 in the shift register group may be referred to as scan units.

As shown in FIG. 8, in an example where two adjacent stages shift registers 41 share one blanking circuit 4110, all of which constitute the shift register group. The shift register group may include a first scan unit 41a and a second scan unit 41b. For example, the first scan unit 41a may be electrically connected to pixel driving circuits 21 in a row of sub-pixels 2, and the second scan unit 41b may be electrically connected to pixel driving circuits 21 in another row of sub-pixels 2.

For example, as shown in FIG. 8, the first scan unit 41a and the second scan unit 41b each may include: the first input circuit 4101, the leakage prevention circuit 4102, the output circuit 4103, the control circuit 4104, the first reset circuit 4105, the second reset circuit 4106, the third reset circuit 4107, the fourth reset circuit 4108, the fifth reset circuit 4109 and the sixth reset circuit 4111.

First input circuits 4101 in the first scan unit 41a and the second scan unit 41b may have the same structure and function as the first input circuit 4101 in some of the above examples. Leakage prevention circuits 4102 in the first scan unit 41a and the second scan unit 41b may have the same structure and function as the leakage prevention circuit 4102 in some of the above examples. The output circuit 4103 in the first scan unit 41a may have the same structure and function as the output circuit 4103 in some of the above examples. The control circuit 4104 in the first scan unit 41a may have the same structure and function as the control circuit 4104 in some of the above examples. First reset circuits 4105 in the first scan unit 41a and the second scan unit 41b may have the same structure and function as the first reset circuit 4105 in some of the above examples. Second reset circuits 4106 in the first scan unit 41a and the second scan unit 41b may have the same structure and function as the second reset circuit 4106 in some of the above examples. Third reset circuits 4107 in the first scan unit 41a and the second scan unit 41b may have the same structure and function as the third reset circuit 4107 in some of the above examples. The fourth reset circuit 4108 in the first scan unit 41a may have the same structure and function as the fourth reset circuit 4108 in some of the above examples. Fifth reset circuits 4109 in the first scan unit 41a and the second scan unit 41b may have the same structure and function as the fifth reset circuit 4109 in some of the above examples. Sixth reset circuits 4111 in the first scan unit 41a and the second scan unit 41b may have the same structure and function as the sixth reset circuit 4111 in some of the above examples. The structure and function of the same circuit will not be repeated here.

For example, as shown in FIG. 8, compared with the output circuit 4103 in the first scan unit 41a, the output circuit 4103 in the second scan unit 41b may not be provided with the fourth transistor M4 therein, and may not be electrically connected to the shift signal terminal CR<N> and the first clock signal terminal CLKD_1.

For example, as shown in FIG. 8, the control circuit 4104 in the second scan unit 41b may be electrically connected to a sixth voltage signal terminal VDD_B, which replaces the third voltage signal terminal VDD_A. In the frame display phase, the third voltage signal transmitted by the third voltage signal terminal VDD_A and a sixth voltage signal transmitted by the sixth voltage signal terminal VDD_B are inverted signals.

For example, as shown in FIG. 8, compared with the fourth reset circuit 4108 in first scan unit 41a, the fourth reset circuit 4108 in the second scan unit 41b may not be provided with the seventeenth transistor M17 therein.

Based on this, in order to describe the structure of the shift register group more clearly, the pull-up node Q<N> in the first scan unit 41a may be referred to as a first pull-up node Q<N>, and the pull-up node Q<N> in the second scan unit 41b may be referred to as a second pull-up node Q<N+1>. The pull-down node QB_A<N> in the first scan unit 41a may be referred to as a first pull-down node QB_A<N>, and the pull-down node QB_A<N> in the second scan unit 41b may be referred to as a second pull-down node QB_B<N>. The leakage prevention node OFF<N> in the first scan unit 41a may be referred to as a first leakage prevention node OFF<N>, and the leakage prevention node OFF<N> in the second scan unit 41b may be referred to as a second leakage prevention node OFF<N+1>. The second clock signal terminal CLKE_1 in the second scan unit 41b may be referred to as a fourth clock signal terminal CLKE_2. The fifth clock signal terminal CLKF_1 in the second scan unit 41b may be referred to as a sixth clock signal terminal CLKF_2. The first output signal terminal Oput1<N> in the first scan unit 41a may be referred to as a first output signal sub-terminal Oput1<N>, and the first output signal terminal Oput1<N> in the second scan unit 41b may be referred to as a second output signal sub-terminal Oput1<N+1>. The second output signal terminal Oput2<N> in the first scan unit 41a may be referred to as a third output signal sub-terminal Oput2<N>, and the second output signal terminal Oput2<N> in the second scan unit 41b may be referred to as a fourth output signal sub-terminal Oput2<N+1>.

For a description of first reset circuits 4105 in the first scan unit 41a and the second scan unit 41b, reference may be made to the description of the first reset circuits 4105 in the first scan unit 41a and the second scan unit 41b in the examples shown in FIG. 6, which will not be repeated here.

For example, as shown in FIG. 8, the fourth reset circuit 4108 in the first scan unit 41a may further be electrically connected to the second pull-down node QB_B<N>. The fourth reset circuit 4108 in the first scan unit 41*a* is further configured to pull down the shift signal terminal CR<N>, the first output signal sub-terminal Oput1<N> and the third output signal sub-terminal Oput2<N> under control of a voltage of the second pull-down node QB_B<N>.

For example, in a case where the voltage of the second pull-down node QB_B<N> is at a high level, the fourth reset circuit 4108 in the first scan unit 41*a* may be turned on due to an action of the voltage of the second pull-down node QB_B<N>, transmit the fourth voltage signal that is transmitted by the fourth voltage signal terminal VGL1 to the shift signal terminal CR<N> to pull down the shift signal terminal CR<N> and reset the shift signal terminal CR<N>, transmit the fifth voltage signal that is transmitted by the fifth voltage signal terminal VGL2 to the first output signal sub-terminal Oput1<N> to pull down the first output signal sub-terminal Oput1<N> and reset the first output signal sub-terminal Oput1<N>, and transmit the fifth voltage signal that is transmitted by the fifth voltage signal terminal VGL2 to the third output signal sub-terminal Oput2<N> to pull down the third output signal sub-terminal Oput2<N> and reset the third output signal sub-terminal Oput2<N>.

Optionally, as shown in FIG. 8, the fourth reset circuit 4108 in the first scan unit 41*a* may further include: a thirty-first transistor M31, a thirty-second transistor M32 and a thirty-third transistor M33.

For example, as shown in FIG. 8, a control electrode of the thirty-first transistor M31 is electrically connected to the second pull-down node QB_B<N>, a first electrode of the thirty-first transistor M31 is electrically connected to the shift signal terminal CR<N>, and a second electrode of the thirty-first transistor M31 is electrically connected to the fourth voltage signal terminal VGL1.

In the case where the voltage of the second pull-down node QB_B<N> is at the high level, the thirty-first transistor M31 may be turned on due to the action of the voltage of the second pull-down node QB_B<N>, and transmit the fourth voltage signal that is transmitted by the fourth voltage signal terminal VGL1 to the shift signal terminal CR<N>, so as to pull down the shift signal terminal CR<N> and reset the shift signal terminal CR<N>.

For example, as shown in FIG. 8, a control electrode of the thirty-second transistor M32 is electrically connected to the second pull-down node QB_B<N>, a first electrode of the thirty-second transistor M32 is electrically connected to the first output signal sub-terminal Oput1<N>, and a second electrode of the thirty-second transistor M32 is electrically connected to the fifth voltage signal terminal VGL2.

In the case where the voltage of the second pull-down node QB_B<N> is at the high level, the thirty-second transistor M32 may be turned on due to the action of the voltage of the second pull-down node QB_B<N>, and transmit the fifth voltage signal that is transmitted by the fifth voltage signal terminal VGL2 to the first output signal sub-terminal Oput1<N>, so as to pull down the first output signal sub-terminal Oput1<N> and reset the first output signal sub-terminal Oput1<N>.

For example, as shown in FIG. 8, a control electrode of the thirty-third transistor M33 is electrically connected to the second pull-down node QB_B<N>, a first electrode of the thirty-third transistor M33 is electrically connected to the third output signal sub-terminal Oput2<N>, and a second electrode of the thirty-third transistor M33 is electrically connected to the fifth voltage signal terminal VGL2.

In the case where the voltage of the second pull-down node QB_B<N> is at the high level, the thirty-third transistor M33 may be turned on due to the action of the voltage of the second pull-down node QB_B<N>, transmit the fifth voltage signal that is transmitted by the fifth voltage signal terminal VGL2 to the third output signal sub-terminal Oput2<N>, so as to pull down the third output signal sub-terminal Oput2<N> and reset the third output signal sub-terminal Oput2<N>.

For example, as shown in FIG. 8, the fourth reset circuit 4108 in the second scan unit 41*b* may further be electrically connected to the first pull-down node QB_A<N>. The fourth reset circuit 4108 in the second scan unit 41*b* is further configured to reset the second output signal sub-terminal Oput1<N+1> and the fourth output signal sub-terminal Oput2<N+1> under control of a voltage of the first pull-down node QB_A<N>.

For example, in a case where the voltage of the first pull-down node QB_A<N> is at a high level, the fourth reset circuit 4108 in the second scan unit 41*b* may be turned on due to an action of the voltage of the first pull-down node QB_A<N>, transmit the fifth voltage signal that is transmitted by the fifth voltage signal terminal VGL2 to the second output signal sub-terminal Oput1<N+1> to pull down the second output signal sub-terminal Oput1<N+1> and reset the second output signal sub-terminal Oput1<N+1>, and transmit the fifth voltage signal transmitted by the fifth voltage signal terminal VGL2 to the fourth output signal sub-terminal Oput2<N+1> to pull down the fourth output signal sub-terminal Oput2<N+1> and reset the fourth output signal sub-terminal Oput2<N+1>.

Optionally, as shown in FIG. 8, the fourth reset circuit 4108 in the second scan unit 41*b* may further include a thirty-second transistor M32 and a thirty-third transistor M33.

For example, as shown in FIG. 8, a control electrode of the thirty-second transistor M32 is electrically connected to the first pull-down node QB_A<N>, a first electrode of the thirty-second transistor M32 is electrically connected to the second output signal sub-terminal Oput1<N+1>, and a second electrode of the thirty-second transistor M32 is electrically connected to the fifth voltage signal terminal VGL2.

In the case where the voltage of the first pull-down node QB_A<N> is at the high level, the thirty-second transistor M32 may be turned on due to the action of the voltage of the first pull-down node QB_A<N>, and transmit the fifth voltage signal that is transmitted by the fifth voltage signal terminal VGL2 to the second output signal sub-terminal Oput1<N+1>, so as to pull down the second output signal sub-terminal Oput1<N+1> and reset the second output signal sub-terminal Oput1<N+1>.

For example, as shown in FIG. 8, a control electrode of the thirty-third transistor M33 is electrically connected to the first pull-down node QB_A<N>, a first electrode of the thirty-third transistor M33 is electrically connected to the fourth output signal sub-terminal Oput2<N+1>, and a second electrode of the thirty-third transistor M33 is electrically connected to the fifth voltage signal terminal VGL2.

In the case where the voltage of the first pull-down node QB_A<N> is at the high level, the thirty-third transistor M33 may be turned on due to the action of the voltage of the first pull-down node QB_A<N>, and transmit the fifth voltage signal that is transmitted by the fifth voltage signal terminal VGL2 to the fourth output signal sub-terminal Oput2<N+1>, so as to pull down the fourth output signal sub-terminal Oput2<N+1> and reset the fourth output signal sub-terminal Oput2<N+1>.

The structure of the scan driving circuit 4 will be further schematically described below by taking an example of the structure of the shift register group as shown in FIG. 6.

Figure 9:
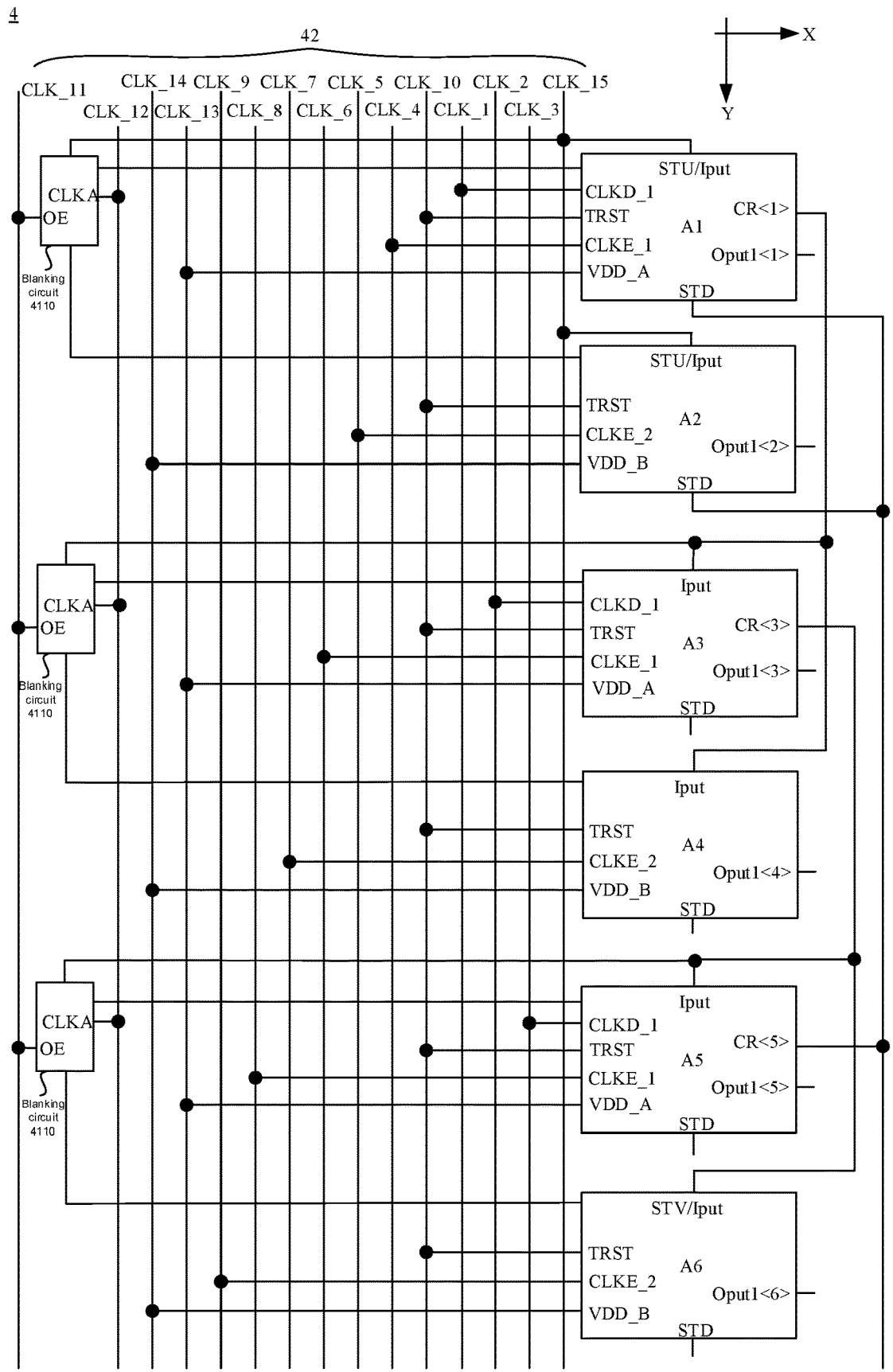
FIG. 9 is a structural diagram of a gate driving circuit, in accordance with some embodiments of the present disclosure.

In some examples, as shown in FIG. 9, the scan driving circuit 4 may further include a plurality of clock signal lines 42 that extend along the second direction Y A clock signal line 42 may be electrically connected to at least one shift register 41, and a shift register 41 may be electrically connected to at least one clock signal line 42.

For example, A1 and A2 shown in FIG. 9 respectively represent the first scan unit 41a and the second scan unit 41b in a first shift register group, and are respectively electrically connected to pixel driving circuits 21 in a first row of sub-pixels 2 and pixel driving circuits 21 in a second row of sub-pixels 2 in the display panel 100. A3 and A4 shown in FIG. 9 respectively represent the first scan unit 41a and the second scan unit 41b in a second shift register group, and are respectively electrically connected to pixel driving circuits 21 in a third row of sub-pixels 2 and pixel driving circuits 21 in a fourth row of sub-pixels 2 in the display panel 100. A5 and A6 shown in FIG. 9 respectively represent the first scan unit 41a and the second scan unit 41b in a third shift register group, and are respectively electrically connected to pixel driving circuits 21 in a fifth row of sub-pixels 2 and pixel driving circuits 21 in a sixth row of sub-pixels 2 in the display panel 100.

For example, as shown in FIG. 9, the plurality of clock signal lines 42 may include a first clock signal sub-line CLK_1, a second clock signal sub-line CLK_2 and a third clock signal sub-line CLK_3.

The first clock signal terminal CLKD_1 in the first scan unit 41a in a (3M−2)-th shift register group is electrically connected to the first clock signal sub-line CLK_1, so as to receive the first clock signal. The first clock signal terminal CLKD_1 in the first scan unit 41a in a (3M−1)-th shift register group is electrically connected to the second clock signal sub-line CLK_2, so as to receive the first clock signal. The first clock signal terminal CLKD_1 in the first scan unit 41a in a 3M-th shift register group is electrically connected to the third clock signal sub-line CLK_3, so as to receive the first clock signal.

For example, as shown in FIG. 9, the plurality of clock signal lines 42 may further include: a fourth clock signal sub-line CLK_4, a fifth clock signal sub-line CLK_5, a sixth clock signal sub-line CLK_6, a seventh clock signal sub-line CLK_7, an eighth clock signal sub-line CLK_8 and a ninth clock signal sub-line CLK_9.

The second clock signal terminal CLKE_1 in the first scan unit 41a in the (3M−2)-th shift register group is electrically connected to the fourth clock signal sub-line CLK_4, so as to receive the second clock signal; and the fourth clock signal terminal CLKE_2 in the second scan unit 41b in the (3M−2)-th shift register group is electrically connected to the fifth clock signal sub-line CLK_5, so as to receive a fourth clock signal.

The second clock signal terminal CLKE_1 in the first scan unit 41a in the (3M−1)-th shift register group is electrically connected to the sixth clock signal sub-line CLK_6, so as to receive the second clock signal; and the fourth clock signal terminal CLKE_2 in the second scan unit 41b in the (3M−1)-th shift register group is electrically connected to the seventh clock signal sub-line CLK_7, so as to receive the fourth clock signal.

The second clock signal terminal CLKE_1 in the first scan unit 41a in the 3M-th shift register group is electrically connected to the eighth clock signal sub-line CLK_8, so as to receive the second clock signal; and the fourth clock signal terminal CLKE_2 in the second scan unit 41b in the 3M-th shift register group is electrically connected to the ninth clock signal sub-line CLK_9, so as to receive the fourth clock signal.

For example, as shown in FIG. 9, the plurality of clock signal lines 42 may further include a tenth clock signal sub-line CLK_10.

The global reset signal terminal TRST in the first scan unit 41a and the global reset signal terminal TRST in the second scan unit 41b in each shift register group may be electrically connected to the tenth clock signal sub-line CLK_10, so as to receive the global reset signal.

For example, as shown in FIG. 9, the plurality of clock signal lines 42 may further include an eleventh clock signal sub-line CLK_11 and a twelfth clock signal sub-line CLK_12.

The selection control signal terminal OE of the blanking circuit 4110 in each shift register group may be electrically connected to the eleventh clock signal sub-line CLK_11, so as to receive the selection control signal.

The third clock signal terminal CLKA of the blanking circuit 4110 in each shift register group may be electrically connected to the twelfth clock signal sub-line CLK_12, so as to receive the third clock signal.

For example, as shown in FIG. 9, the plurality of clock signal lines 42 may further include a thirteenth clock signal sub-line CLK_13 and a fourteenth clock signal sub-line CLK_14.

The third voltage signal terminal VDD_A in the first scan unit 41a in each shift register group may be electrically connected to the thirteenth clock signal sub-line CLK_13, so as to receive the third voltage signal. The sixth voltage signal terminal VDD_B in the second scan unit 41b in each shift register group is electrically connected to the fourteenth clock signal sub-line CLK_14, so as to receive the sixth voltage signal.

For example, as shown in FIG. 9, the plurality of clock signal lines 42 may further include a fifteenth clock signal sub-line CLK_15.

Both the input signal terminal Iput in the first scan unit 41a and the input signal terminal Iput in the second scan unit 41b in the first shift register group may be electrically connected to the fifteenth clock signal sub-line CLK_15, so as to receive the start signal as the input signal.

As shown in FIG. 9, except for the first shift register group, the input signal terminals Iput in the first scan unit 41a and the second scan unit 41b in any other shift register group are electrically connected to the shift signal terminal CR<N> in the first scan unit 41a in a previous shift register group. Except for the last two shift register groups, display reset signal terminals STD in the first scan unit 41a and the second scan unit 41b in any other shift register group are electrically connected to the shift signal terminal CR<N> in the first scan unit 41a in a second shift register group after it.

It will be noted that, the cascaded relationship shown in FIG. 9 is only an example, and other cascaded manners may be adopted according to actual situations.

Figure 10:
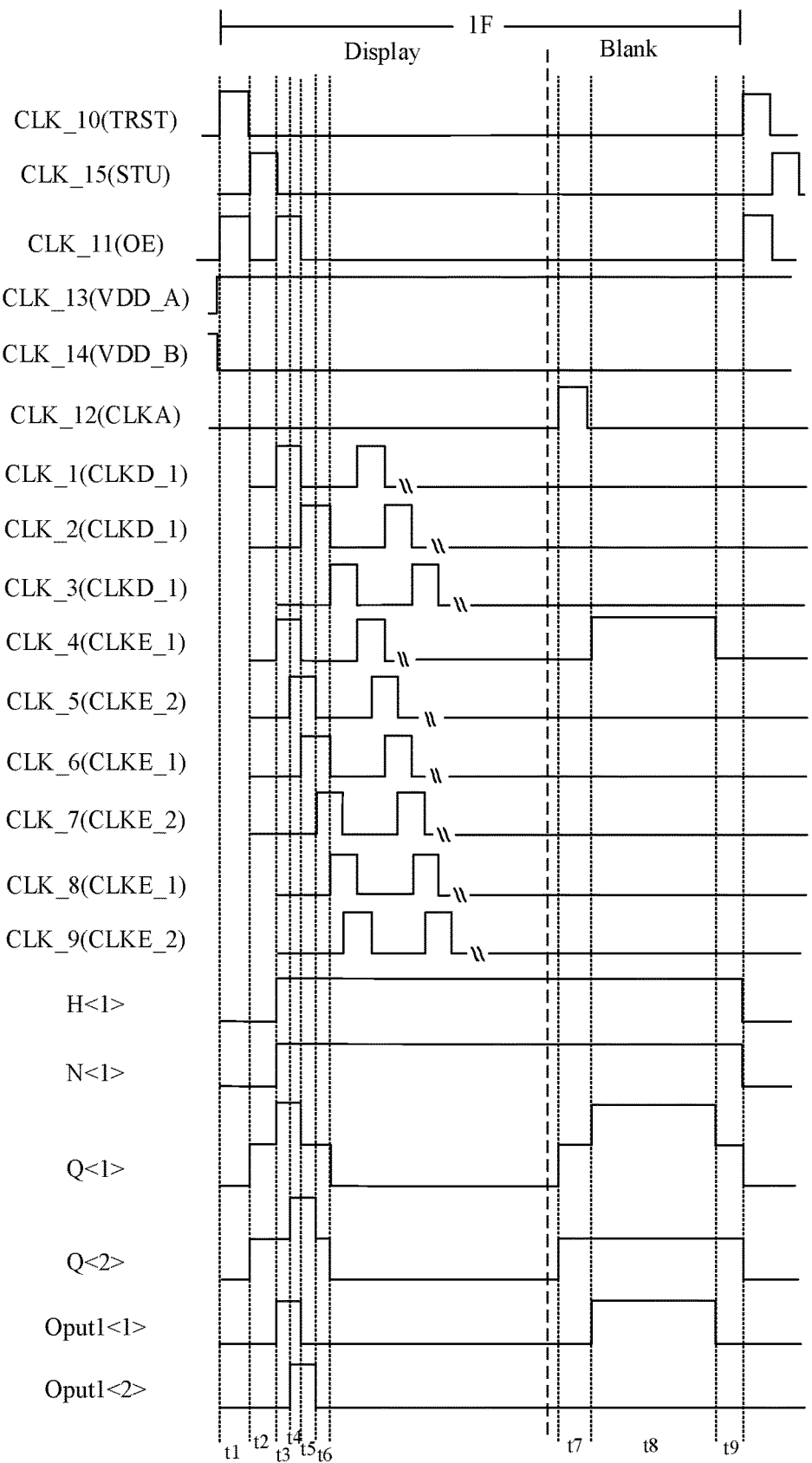
FIG. 10 is a timing diagram for controlling the shift register shown in the FIG. 6, in accordance with some embodiments of the present disclosure.

FIG. 10 is a diagram showing a working timing of the shift register 41 shown in FIG. 6. In FIG. 10, Q<1> and Q<2> represent the first pull-up node Q<N> and the second pull-up node Q<N+1> in the first shift register group, respectively. The number in angle brackets represents a serial number of a row of sub-pixels 2 of the display panel 100 corresponding to the node (the same below). Oput1<1> and Oput1<2> represent the first output signal sub-terminal Oput1<N> and the second output signal sub-terminal Oput1<N+1> in the first shift register group, respectively.

H<1> represents the first blanking node H in the first shift register group. N<1> represents the second blanking node N in the first shift register group. 1F represents a frame. Display represents the display period of the frame display phase. Blank represents the blanking period of the frame display phase.

With reference to FIGS. 9 and 10, a method for driving the shift register 41 shown in FIG. 6 in the display phase of the frame will be schematically described.

At a beginning of the frame display phase, in a first period t1, the global reset signal provided by the tenth clock signal sub-line CLK_10 is at a high level, the fifteenth transistor M15 and the sixteenth transistor M16 in the third reset circuit 4107 in each shift register 41 are turned on, and the fourth voltage signal that is transmitted by the fourth voltage signal terminal VGL1 is transmitted to the first pull-up node Q<N> and the second pull-up node Q<N+1>, so that the first pull-up node Q<N> and the second pull-up node Q<N+1> in each shift register group are reset.

The selection control signal provided by the eleventh clock signal sub-line CLK_11 is at a high level, the twenty-first transistor M21 and the twenty-second transistor M22 in the selection control circuit 41101 in each shift register group are turned on. Since the shift signal output from each shift register group is at a low level, the low-level shift signal may be transmitted to the first blanking node H to reset the first blanking node H in each shift register 41. Therefore, the global reset is achieved.

A working process of the first shift register group (corresponding to the first row of sub-pixels 2 and the second row of sub-pixels 2 in the display panel 100) in the display period of the frame display phase is described below.

In a second period t2, the start signal transmitted by the fifteenth clock signal sub-line CLK_15 is at a high level. That is, the signal transmitted to the input signal terminals Iput in the first shift register group and the input signal transmitted by the input signal terminals Iput are at high levels. In the first shift register group, the first transistor M1 and the second transistor M2 in each of the first input circuits 4101 are turned on due to the action of the input signal, so that the high-level input signal charges the first pull-up node Q<1> to pull up the first pull-up node Q<1> to be at a high level, and charges the second pull-up node Q<2> to pull up the second pull-up node Q<2> to be at the high level.

In the first scan unit 41a in the first shift register group, the fourth transistor M4 in the output circuit 4103 is turned on under control of the voltage of the first pull-up node Q<1>. However, since the first clock signal provide by the first clock signal sub-line CLK_1 is at a low level, the shift signal output from the shift signal terminal CR<1> is at a low level. The fifth transistor M5 in the output circuit 4130 is turned on under the control of the voltage of the first pull-up node Q<1>. However, since the second clock signal provided by the fourth clock signal sub-line CLK_4 is at a low level, the first output signal output from the first output signal sub-terminal Oput1<1> in the first scan unit 41a in the first shift register group is at a low level.

In the second scan unit 41b in the first shift register group, the fifth transistor M5 in the output circuit 4103 is turned on under control of the voltage of the second pull-up node Q<2>. However, since the fourth clock signal provided by the fifth clock signal sub-line CLK_5 is at a low level, the second output signal output from the second output signal sub-terminal Oput1<2> in the second scan unit 41b in the first shift register group is at a low level.

In a third period t3, the level of the first clock signal provided by the first clock signal sub-line CLK_1 changes to a high level, and the level of the second clock signal provided by the fourth clock signal sub-line CLK_4 changes to a high level. In the first scan unit 41a, the voltage of the first pull-up node Q<1> is further raised due to a bootstrap action of the first capacitor C1, so that the fourth transistor M4 and the fifth transistor M5 remain in turned-on states. As a result, in the first shift register group, the level of the shift signal output from the shift signal terminal CR<1> changes to a high level, and the level of the first output signal output from the first output signal sub-terminal Oput1<1> changes to a high level. However, since the fourth clock signal provided by the fifth clock signal sub-line CLK_5 is still at the low level, the second output signal output from the second output signal sub-terminal Oput1<2> in the second scan unit 41b is still at the low level.

The selection control signal provided by the eleventh clock signal sub-line CLK_11 and the shift signal output from the shift signal terminal CR<1> are the same. In this case, the selection control signal is at the high level, the twenty-first transistor M21 and the twenty-second transistor M22 in the selection control circuit 41101 are turned on under control of the selection control signal, so that the first blanking node H<1> is charged by using the high-level shift signal.

In a fourth period t4, the level of the fourth clock signal provided by the fifth clock signal sub-line CLK_5 changes to a high level, and the voltage of the second pull-up node Q<2> in the second scan unit 41b is further raised due to the bootstrap action of the first capacitor C1, so that the fifth transistor M5 remains in the turned-on state. As a result, in the first shift register group, the level of the second output signal output from the second output signal sub-terminal Oput1<2> changes to a high level.

In a fifth period t5, the first pull-up node Q<1> is still at the high level due to a holding action of the first capacitor C1 in the first scan unit 41a, so that the fifth transistor M5 remains in the turned-on state. However, since the level of the second clock signal provided by the fourth clock signal sub-line CLK_4 changes to the low level, the level of the first output signal output from the first output signal sub-terminal Oput1<1> in the first scan unit 41a changes to the low level. In addition, due to the bootstrap action of the first capacitor C1, the voltage of the first pull-up node Q<1> will also decrease.

In a sixth period t6, the second pull-up node Q<2> is still at the high level due to the holding action of the first capacitor C1 in the second scan unit 41b, so that the fifth transistor M5 remains in the turned-on state. However, since the level of the fourth clock signal provided by the fifth clock signal sub-line CLK_5 changes to the low level, the level of the second output signal output from the second output signal sub-terminal Oput1<2> in the second scan unit 41b changes to the low level. In addition, due to the bootstrap action of the first capacitor C1, the voltage of the second pull-up node Q<2> will also decrease.

Since the voltage of the first pull-up node Q<1> in the first scan unit 41a is always maintained at the high level from the second period t2 to the sixth period t6, the third transistor M3 continuously transmits the second voltage signal to the first leakage prevention node OFF<1>. Since the voltage of the second pull-up node Q<2> in the second scan unit 41b is always maintained at the high level from the second period t2 to the sixth period t6, the third transistor M3 continuously transmits the second voltage signal to the second leakage prevention node OFF<2>.

After the first shift register group drives the first row of sub-pixels 2 and the second row of sub-pixels 2 in the display panel 100 to complete display, the second shift register group, the third shift register group, etc. sequentially drive the sub-pixels 2 in the display panel 100 row by row, so as to complete display driving of the frame. At this time, the display period of the frame display phase ends.

The working process of the first shift register group (corresponding to the first row of sub-pixels 2 and the second row of sub-pixels 2 in the display panel 100) in the blanking period of the frame display phase is described below.

The first blanking node H<1> is charged in the third period t3, so that the third capacitor C3 may discharge after the voltage of the first blanking node H<1> is raised. As a result, the first blanking node H<1> is maintained at the high level in the display period of the frame display phase. The second input circuit 41102 may remain in the turned-on state due to the action of the voltage of the first blanking node H<1>, and input the second voltage signal to the second blanking node N<1>, so that the second blanking node N<1> is maintained at the high level in the display period of the frame display phase.

In a seventh period t7, the third clock signal provided by the twelfth clock signal sub-line CLK_12 is at a high level. The twenty-fifth transistor M25 in the transmission circuit 41103 may be turned on under control of the high-level third clock signal, and transmit the second voltage signal from the second blanking node N<1> to the first pull-up node Q<1> and the second pull-up node Q<2>, so as to charge the first pull-up node Q<1> and the second pull-up node Q<2>. As a result, voltages of the first pull-up node Q<1> and the second pull-up node Q<2> are pulled up.

In an eighth period t8, the level of the second clock signal provided by the fourth clock signal sub-line CLK_4 changes to the high level, and the voltage of the first pull-up node Q<1> is further raised due to the bootstrap action of the first capacitor C1, so that the fifth transistor M5 remains in the turned-on state, and the level of the first output signal (i.e., the second scan signal) output from the first output signal sub-terminal Oput1<1> in the first scan unit 41a changes to the high level.

Since the fourth clock signal provided by the fifth clock signal sub-line CLK_5 is still at the low level, the second output signal (i.e., the second scan signal) output from the second output signal sub-terminal Oput1<2> in the second scan unit 41b is at the low level.

Here, the first output signal output in the eighth period t8 may be used to drive sensing transistors T3 in a corresponding row of sub-pixels 2 in the display panel 100, so as to implement external compensation.

In a ninth period t9, the first pull-up node Q<1> is still at the high level due to the holding action of the first capacitor C1, so that the fifth transistor M5 remains in the turned-on state. Since the level of the second clock signal provided by the fourth clock signal sub-line CLK_4 changes to the low level, the level of the first output signal (i.e., the second scan signal) output from the first output signal sub-terminal Oput1<1> in the first scan unit 41a changes to the low level.

In addition, the voltage of the first pull-up node Q<1> will also decrease due to the bootstrap action of the first capacitor C1.

At this time, the blanking period of the frame display phase ends.

In a subsequent frame display phase, a process for driving the scan driving circuit 4 may refer to the above descriptions, which will not be repeated here.

In an implementation, as shown in FIG. 1, the display panel generally has the display area A and the bezel area B surrounding the display area A. The sub-pixels P of the display panel are generally disposed in the display area A, and the scan driving circuit electrically connected to the sub-pixels P is generally disposed in the bezel area B.

As resolution of the display panel becomes higher and higher, narrow-bezel display panels or even bezel-less display panels have become a current development trend. In the field of display, and especially in the field of display of large-size OLEDs, it is difficult to achieve the narrow-bezel display panel or even the bezel-less display panel by arranging the scan driving circuit in the bezel area B of the display panel. In addition, at present, display panels are mostly designed to be in a non-rectangular shape, which makes it more difficult to achieve the narrow-bezel display panel or even the bezel-less display panel by arranging the scan driving circuit in the above manner.

Based on this, as shown in FIG. 3, the plurality of shift registers 41 and the plurality of clock signal lines 42 included in the scan driving circuit 4 may be located in the display area A. Each shift register 41 may include a plurality of device groups 411. The device group 411 may be located in a region between two adjacent sub-pixels 2 in a corresponding at least one row of sub-pixels 2.

For example, as shown in FIGS. 3 and 11, the device group 411 may include at least one transistor and/or at least one capacitor. The plurality of device groups 411 shown in FIGS. 3 and 11 are only part of transistors and part of capacitors in a corresponding shift register 41.

Here, a way of dividing the transistors and capacitors included in the shift register 41 may be set according to actual needs, as long as space occupation of the divided device groups 411 is relatively small, and complexity of a connection relationship between the device groups 411 is relatively low.

For example, as shown in FIG. 11, the device group 411 may include the first transistor M1 and the second transistor M2 in the first input circuit 4101.

As another example, as shown in FIG. 11, the device group 411 may include the third transistor M3 in the leakage prevention circuit 4102.

As another example, as shown in FIG. 11, the device group 411 may include the third capacitor C3 in the selection control circuit 41101.

It will be noted that, some circuits in an actual product each include transistors connected in parallel, and only one of the transistors is shown in the circuit diagrams of the shift registers 41 shown in FIGS. 5 to 8 and 11.

For example, one first transistor M1 and one second transistor M2 included in the first input circuit 4101 are shown. In the actual product, the first input circuit 4101 may include first transistors M1 connected in parallel and second transistors M2 connected in parallel. Each first transistor M1 and a respective second transistor M2 may constitute one device group 411, which is disposed in a region between two adjacent sub-pixels 2 in a corresponding row of sub-pixels 2.

For example, as shown in FIG. 11, an arrangement of the device group 411 in the region between the two adjacent sub-pixels 2 in the corresponding at least one row of sub-pixels 2 may be as follows. In a case where a region between two adjacent sub-pixels 2 in the at least one row of sub-pixels 2 is provided with a device group 411 therein, only one device group 411 is arranged in the region. That is, the plurality of device groups 411 included in the shift register 41 are located in different regions, and at least one sub-pixel 2 is disposed between two adjacent device groups 411. The corresponding at least one row of sub-pixels refers to at least one row of sub-pixels 2 electrically connected to the shift register 41, and an output signal output from the shift register 41 is transmitted to the at least one row of sub-pixels 2. The region between the two adjacent sub-pixels 2 in the corresponding at least one row of sub-pixels 2 refers to a region between two adjacent sub-pixels 2 arranged in the first direction X in the at least one row of sub-pixels 2.

By arranging the plurality of device groups 411 included in the shift register 41 in regions each between two adjacent sub-pixels 2 in the corresponding at least one row of sub-pixels 2, it may be possible to effectively reduce space occupation of a portion of the scan driving circuit 4 located in the bezel area B, which helps achieve the narrow-bezel or even bezel-less design for the display panel 100.

For example, as shown in FIGS. 3 and 11, the clock signal line 42 is located between two adjacent columns of sub-pixels 2.

For example, as shown in FIGS. 3 and 11, a region between two adjacent columns of sub-pixels 2 is a first gap region. For example, an arrangement of the clock signal line 42 in the first gap region may be that the first gap region is provided with one clock signal line 42 therein, and at least one column of sub-pixels 2 may be disposed between two adjacent clock signal lines 42.

Since a dimension of the clock signal line 42 in the first direction X is relatively large, by arranging only one clock signal line 42 in the first gap region, it may be possible to avoid increasing a dimension of the first gap region in the first direction X. Therefore, it is possible to avoid affecting distribution uniformity of the sub-pixels 2 of the display panel 100 and reducing a pixel per inch (PPI) of the display panel 100.

In addition, by arranging the clock signal line 42 in the first gap region, it may be possible to effectively reduce the space occupation of the portion of the scan driving circuit 4 located in the bezel area B, which helps achieve the narrow-bezel or even bezel-less design for the display panel 100.

In some examples, as shown in FIG. 3, the bezel area B of the display panel 100 may include a fan-out region B1. The fan-out region B1 may be located on a side of the display area A. For example, the fan-out region B1 and the display area A may have a space therebetween.

Of course, an arrangement of the fan-out region B1 and the display area A is not limited thereto.

Optionally, as shown in FIG. 3, in the second direction Y, the display area A and the fan-out region B1 are arranged in sequence. For example, a centerline of the display area A in the second direction Y coincides with a centerline of the fan-out region B1 in the second direction Y, and a dimension of the fan-out region B1 in the first direction X is less than a dimension of the display area A in the first direction X.

In some examples, as shown in FIG. 3, the display panel 100 may further include a power supply voltage bus 5 disposed in the fan-out region B1. The power supply voltage bus 5 may extend along the first direction X.

For example, as shown in FIGS. 3, 16, 19 and 21, the power supply voltage bus 5 may be electrically connected to at least part of the plurality of power supply voltage signal lines EL. Since each power supply voltage signal line EL extends along the second direction Y, an end of the power supply voltage signal line EL may, for example, extend into the fan-out region B1 and be electrically connected to the power supply voltage bus 5 through a corresponding via hole.

In this way, in the display process of the display panel 100, the power supply voltage bus 5 may simultaneously transmit the power supply voltage signal to the at least part of the plurality of power supply voltage signal lines EL, and then transmit the power supply voltage signal to the pixel driving circuits 21 in the sub-pixels 2. In this way, it helps improve transmission efficiency of the power supply voltage signal and reduce the wiring difficulty of the display panel 100.

In some examples, as shown in FIG. 3, the display panel 100 may further include a plurality of connection lines 6. The plurality of connection lines 6 may be located on the same side of the substrate 1 as the plurality of sub-pixels 2, the plurality of signal transmission lines 3, the scan driving circuit 4 and the power supply voltage bus 5.

For example, as shown in FIG. 3, the plurality of connection lines 6 may extend along the second direction Y and be located closer to a side of the fan-out region B1 away from the display area A than the power supply voltage bus 5. That is, the plurality of connection lines 6 are farther away from the display area A than the power supply voltage bus 5. In this way, it facilitates an arrangement of the plurality of connection lines 6.

For example, the connection line 6 may be electrically connected to the signal line (e.g., the data line DL, the sensing line SL, or the clock signal line 42) located in the display area A. In a case where the display panel 100 is applied to the display apparatus 1000, the connection line 6 may also be electrically connected to the display driver integrated circuit (IC) or other electronic element in the display apparatus 1000, so as to transmit an electrical signal to the corresponding signal line located in the display area A.

In some examples, as shown in FIG. 3, the plurality of connection lines 6 may include a plurality of first connection sub-lines 61. A first connection sub-line 61 may be electrically connected to one signal transmission line 3.

Here, as shown in FIG. 3, the plurality of signal transmission lines 3 include the plurality of data lines DL and the plurality of sensing lines SL, the plurality of first connection sub-lines 61 may include a plurality of data connection lines 611 and a plurality of sensing connection lines 612. For example, a data connection line 611 may be electrically connected to one data line DL. For example, a sensing connection line 612 may be electrically connected to one sensing line SL.

Figure 24:
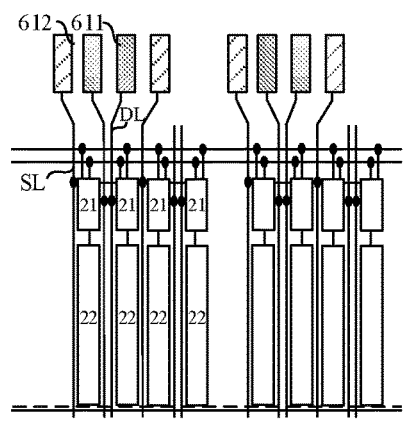
FIG. 24 is a partial structural diagram of a display panel, in accordance with some embodiments of the present disclosure.

There are many arrangements of the data connection lines 611 and the sensing connection lines 612, which may be set according to the arrangement of the data lines DL and the sensing lines SL in the display area A. For example, as shown in FIG. 24, at least two data lines DL may be disposed between any two adjacent sensing lines SL, and at least two data connection lines 611 may be disposed between any two adjacent sensing connection lines 612.

For example, as shown in FIGS. 3 and 11, four data lines DL may be disposed between any two adjacent sensing lines SL. That is, four columns of sub-pixels 2 share the same sensing line SL. Correspondingly, four data connection lines 611 may be disposed between any two adjacent sensing connection lines 612, and the four data connection lines 611 are electrically connected to the four data lines DL disposed between the two adjacent sensing lines SL, respectively.

In this way, it may be possible to avoid lines that extend along a same direction being crossed, and thereby prevent a short circuit or a capacitance being formed between the lines that extend along the same direction.

For example, an end of the data line DL proximate to the fan-out region B1 may extend into the fan-out region B1 and be electrically connected to a corresponding data connection line 611. An end of the sensing line SL proximate to the fan-out region B1 may extend into the fan-out region B1 and be electrically connected to a corresponding sensing connection line 612.

In this way, in the display process of the display panel 100, the plurality of data connection lines 611 may transmit the data signals to respective data lines DL, and further transmit the data signals to pixel driving circuits 21 in respective sub-pixels 2. The plurality of sensing connection lines 612 may transmit the reset signals to respective sensing lines SL, and further transmit the reset signals to pixel driving circuits 21 in respective sub-pixels 2. Alternatively, the plurality of sensing connection lines 612 may obtain the sensing signals from the pixel driving circuits 21 in the respective sub-pixels 2 and the respective sensing lines SL.

For example, as shown in FIGS. 3, 16, 19 and 21, an orthographic projection of the data connection line 611 on the substrate 1 may be in a rectangular shape or a substantially rectangular shape. A dimension of the data connection line 611 in the first direction X is greater than a dimension of the data line DL in the first direction X. Resistances of two adjacent data connection lines 611 may be equal or unequal.

It will be noted that, as shown in FIGS. 3, 16, 19 and 21, since the dimension of the fan-out region B1 in the first direction X is less than the dimension of the display area A in the first direction X, in a case where ends of the data lines DL in the display area A extend into the fan-out region B1, lengths of the data lines DL are different. As a result, resistances of the data lines DL are different. Alternatively, since the display area A is in a shape of an irregular rectangle, the lengths of the data lines DL in the display area A are different. In the case where the ends of the data lines DL extend into the fan-out region B1, the lengths of the data lines DL are further prone to differences. As a result, the resistances of the data lines DL are different.

By arranging each data line DL to be electrically connected to the respective data connection line 611 and determining a resistance of the data connection line 611 according to a length or a resistance of the data line DL, it may be possible to adjust a total resistance of each data line DL and the respective data connection line 611, so that the total resistance of each data line DL and the respective data connection line 611 is equal or substantially equal. In this way, it helps ensure a consistency of data signals transmitted to different positions in the display area A, so that the display panel 100 has a good display effect.

For example, areas of orthographic projections of two adjacent data connection lines 611 on the substrate 1 may be equal or unequal. Optionally, dimensions of the two adjacent data connection lines 611 in the first direction X may be equal or unequal, and dimensions of the two adjacent data connection lines 611 in the second direction Y may be equal or unequal. Dimensions of each data connection line 611 in the first direction X and in the second direction Y may be set according to actual needs.

For example, as shown in FIGS. 3, 16, 19 and 21, an orthographic projection of the sensing connection line 612 on the substrate 1 may be in a rectangular shape or a substantially rectangular shape. A dimension of the sensing connection line 612 in the first direction X is greater than a dimension of the sensing line SL in the first direction X. Resistances of two adjacent sensing connection lines 612 may be equal or unequal.

It will be noted that, as shown in FIGS. 3, 16, 19 and 21, since the dimension of the fan-out region B1 in the first direction X is less than the dimension of the display area A in the first direction X, in a case where ends of the sensing lines SL in the display area A extend into the fan-out region B1, lengths of the sensing lines SL are different. As a result, resistances of the sensing lines SL are different. Alternatively, since the display area A is in the shape of the irregular rectangle, the lengths of the sensing lines SL in the display area A are different. In the case where the ends of the sensing lines SL extend into the fan-out region B1, the lengths of the sensing lines SL are further prone to differences. As a result, the resistances of the sensing lines SL are different.

By arranging each sensing line SL to be electrically connected to the respective sensing connection line 612 and determining a resistance of the sensing connection line 612 according to a length or a resistance of the sensing line SL, it may be possible to adjust a total resistance of each sensing line SL and the respective sensing connection line 612, so that the total resistance of each sensing line SL and the respective sensing connection line 612 is equal or substantially equal. In this way, it helps ensure a consistency of sensing signals transmitted to different positions in the display area A, so that the display panel 100 has a good display effect.

For example, areas of orthographic projections of two adjacent sensing connection lines 612 on the substrate 1 may be equal or unequal. Optionally, dimensions of the two adjacent sensing connection lines 612 in the first direction X may be equal or unequal, and dimensions of the two adjacent sensing connection lines 612 in the second direction Y may be equal or unequal. Dimensions of each sensing connection line 612 in the first direction X and in the second direction Y may be set according to actual needs.

In some examples, as shown in FIG. 3, the plurality of connection lines 6 may further include a plurality of second connection sub-lines 62. A second connection sub-line 62 may be electrically connected to the power supply voltage bus 5.

For example, as shown in FIG. 3, there is one power supply voltage bus 5. In this case, the power supply voltage bus 5 may be electrically connected to the plurality of second connection sub-lines 62.

In this way, in the display process of the display panel 100, the plurality of second connection sub-lines 62 may transmit the power supply voltage signal to the power supply voltage bus 5, so that the power supply voltage signal is transmitted to the plurality of power supply voltage signal lines EL in the display area A through the power supply voltage bus 5, and then transmitted to pixel driving circuits 21 in respective sub-pixels 2.

For example, as shown in FIG. 3, the number of the second connection sub-lines 62 is less than the number of the first connection sub-lines 61, and a dimension of the second connection sub-line 62 in the first direction X is greater than a dimension of the first connection sub-line 61 in the first direction X.

Since the second connection sub-lines 62 are used for transmitting the power supply voltage signal, and the number of the second connection sub-lines is relatively small, by setting the dimension of the second connection sub-line 62 in the first direction X to be relatively large, it may be possible to prevent the second connection sub-lines 62 from being damaged, so as to prevent the display effect of the display panel 100 from being affected.

In some examples, as shown in FIG. 3, the plurality of connection lines 6 may further include a plurality of third connection sub-lines 63. A third connection sub-line 63 may be electrically connected to one clock signal line 42. For example, the plurality of third connection sub-lines 63 and the plurality of clock signal lines 42 may be electrically connected in a one-to-one correspondence.

For example, the clock signal line 42 electrically connected to the third connection sub-line 63 may be the first clock signal sub-line CLK_1, the second clock signal sub-line CLK_2, the third clock signal sub-line CLK_3, the fourth clock signal sub-line CLK_4, the fifth clock signal sub-line CLK_5, the sixth clock signal sub-line CLK_6 or the seventh clock signal sub-line CLK_7.

In this way, in the display process of the display panel 100, the plurality of third connection sub-lines 63 may transmit clock signals to the respective clock signal lines 42 in the display area A, and then transmit the clock signals to respective shift registers 41.

For example, as shown in FIG. 3, the number of the third connection sub-lines 63 is less than the number of the first connection sub-lines 61, and a dimension of the third connection sub-line 63 in the first direction X is greater than the dimension of the first connection sub-line 61 in the first direction X.

Here, the positional relationship of the first connection sub-lines 61, the second connection sub-lines 62 and the third connection sub-lines 63 in the plurality of connection lines 6 may vary, which may be set according to actual needs.

In order to describe the positional relationship of the first connection sub-lines 61, the second connection sub-lines 62 and the third connection sub-lines 63 clearly and briefly, a relationship of film layers in the display panel 100 will be schematically described below with reference to structures as shown in FIGS. 12, 13, 16, 17, and 19 to 22. Of course, the relationship of the film layers in the display panel 100 is not limited to the relationship shown in the drawings.

Figure 13:
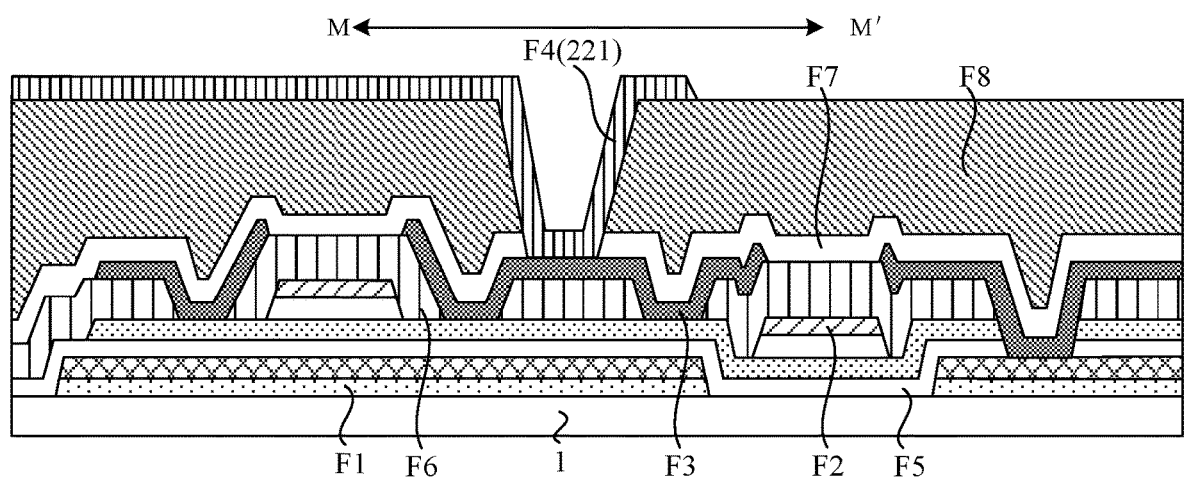
FIG. 13 is a sectional view of the structure shown in FIG. 12 taken along the line M-M'.

In some embodiments, as shown in FIG. 13, the display panel 100 includes: a first light-transmissive layer F1, a first metal layer F2, a second metal layer F3 and a second light-transmissive layer F4 that are stacked in sequence. The first light-transmissive layer F1 is closer to the substrate 1 than the second light-transmissive layer F4.

For example, a material of the first light-transmissive layer F1 may include indium tin oxide (ITO), indium zinc oxide (IZO) or indium gallium zinc oxide (IGZO). A material of the first metal layer F2 may include aluminum, copper, molybdenum, titanium, or aluminum-neodymium alloy. A material of the second metal layer F3 may include aluminum, copper, molybdenum, titanium, or aluminum-neodymium alloy. A material of the second light-transmissive layer F4 may include ITO, IZO, or IGZO.

It will be noted that, the first light-transmissive layer F1 includes a plurality of patterns (for example, the patterns may be formed in a patterning process), the first metal layer F2 includes a plurality of patterns (for example, the patterns may be formed in a patterning process), the second metal layer includes a plurality of patterns (for example, the patterns may be formed in a patterning process), and the second light-transmissive layer F4 includes a plurality of patterns (for example, the patterns may be formed in a patterning process). For the first light-transmissive layer F1, the first metal layer F2, the second metal layer F3 and the second light-transmissive layer F4, patterns included in any two adjacent film layers are different. Patterns included in the film layers may constitute, for example, the pixel driving circuits 21 in the sub-pixels 2, the signal transmission lines 3, the scan driving circuit 4, the power supply voltage bus 5 and the connection lines 6.

Figure 12:
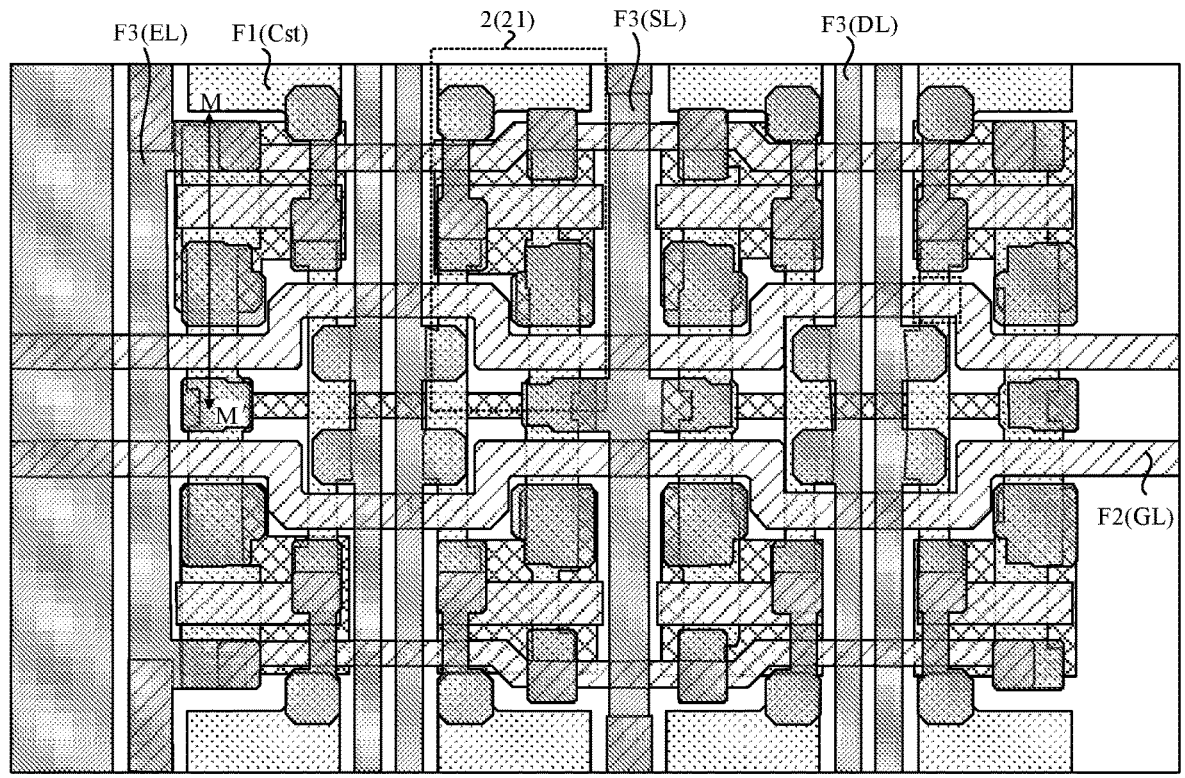
FIG. 12 is a partial enlarged view of sub-pixels, in accordance with some embodiments of the present disclosure.

In some examples, as shown in FIGS. 12 and 13, the first light-transmissive layer F1 may include first terminals of storage capacitors Cst in the plurality of sub-pixels 2 in the display panel 100. The second light-transmissive layer F4 may include anodes 221 or cathodes of light-emitting devices 22 in the plurality of sub-pixels 2.

Here, as shown in FIG. 12, the storage capacitors Cst are the storage capacitors Cst in the pixel driving circuits 21 in the sub-pixels 2. For example, second terminals of the storage capacitors Cst may be disposed in the same layer as active layers of the transistors in the pixel driving circuit 21.

For example, an area of an orthographic projection of the storage capacitor Cst on the substrate 1 is relatively large, an area of an orthographic projection of the light-emitting device 22 on the substrate 1 is relatively large, and the orthographic projection of the storage capacitor Cst on the substrate 1 may at least partially overlap with the orthographic projection of the light-emitting device 22 on the substrate 1. In this way, it may reduce an occupied area of the sub-pixel 2 on the substrate 1, so as to achieve a high PPI.

The first terminals of the storage capacitors Cst are located in the first light-transmissive layer F1, which means that the storage capacitors Cst may have a high light transmittance. In this way, in a case where the light-emitting device 22 in the sub-pixel 2 emits light toward the substrate 1, it may be possible to prevent the storage capacitor Cst from shielding the light emitted from the light-emitting device 22.

In some examples, as shown in FIGS. 12, 13, 16, 17, and 19 to 22, the first metal layer F2 may include: control electrodes of transistors in the plurality of sub-pixels 2, the power supply voltage bus 5, control electrodes of transistors in the plurality of shift registers 41 of the scan driving circuit 4 and at least one first connection sub-line 61. The second metal layer F3 may include: first electrodes and second electrodes of the transistors in the plurality of sub-pixels 2, the plurality of signal transmission lines 3, first electrodes and second electrodes of the transistors in the plurality of shift registers 41 of the scan driving circuit 4 and another at least one first connection sub-line 61.

For example, the first metal layer F2 may further include the plurality of gate lines GL electrically connected to the pixel driving circuits 21 in the sub-pixels 2.

Since the gate lines GL and the power supply voltage bus 5 all extend along the first direction X, by arranging the gate lines GL and the power supply voltage bus 5 in the same layer, it may be possible not only to simplify a manufacturing process of the display panel 100, but also to avoid increasing a thickness of the display panel 100.

For example, the control electrodes of the transistors in the plurality of sub-pixels 2 may refer to control electrodes of the switching transistor T1, the driving transistor T2 and the sensing transistor T3 in the pixel driving circuit 21 in each of the sub-pixels 2. The first electrodes and second electrodes of the transistors in the plurality of sub-pixels 2 may refer to the first electrode and second electrode of the switching transistor T1, the first electrode and second electrode of the driving transistor T2, and the first electrode and second electrode of the sensing transistor T3 in the pixel driving circuit 21 in each of the sub-pixels 2.

For example, the control electrodes of the transistors in the plurality of shift registers 41 may refer to control electrodes of transistors included in each of the shift registers 41, such as control electrodes of the first transistor M1 and the second transistor M2 in the first input circuit 4101. The first electrodes and second electrodes of the transistors in the plurality of shift registers 41 may refer to first electrodes and second electrodes of the transistors included in each of the shift registers 41, such as the first electrode and second electrode of the first transistor M1, and the first electrode and second electrode of the second transistor M2 in the first input circuit 4101.

Here, in the plurality of first connection sub-lines 61 included in the display panel 100, at least one first connection sub-line 61 is located in the first metal layer F2, and another at least one first connection sub-line 61 is located in the second metal layer F3. In a case where the display panel 100 includes the first metal layer F2 and the second metal layer F3, part of the plurality of first connection sub-lines 61 may be located in the first metal layer F2, and another part of the plurality of first connection sub-lines 61 may be located in the second metal layer F3. Of course, in a case where the display panel 100 further includes other metal layer(s), at least one first connection sub-lines 61 in the plurality of first connection sub-lines 61 except the at least one first connection sub-line 61 in the first metal layer F2 and the another at least one first connection sub-line 61 in the second metal layer F3 may also be located in the other metal layer(s), which is not limited in the embodiments.

In a case where two adjacent first connection sub-lines 61 are located in the same layer, the two adjacent first connection sub-lines 61 need to have a relatively large distance therebetween, so as to avoid a short circuit. However, an area occupied by the first connection sub-lines 61 as a whole will be increased.

By arranging the plurality of first connection sub-lines 61 in different layers in the embodiments of the present disclosure, it may be possible to reduce the distance between two adjacent first connection sub-lines 61 located in different layers, and thus help reduce the area occupied by the plurality of first connection sub-lines 61 as the whole. As a result, it helps reduce the dimension of the fan-out region B1 in the first direction X.

In some examples, as shown in FIGS. 16, 17 and 19 to 22, the display panel 100 includes the first metal layer F2 and the second metal layer F3. The plurality of first connection sub-lines 61 may be arranged as follows. First connection sub-lines 61 located in the first metal layer F2 and first connection sub-lines 61 located in the second metal layer F3 are alternately arranged in sequence in the first direction X.

For example, a difference between the number of the first connection sub-lines 61 located in the first metal layer F2 and the number of the first connection sub-lines 61 located in the second metal layer F3 are large. In this case, two adjacent first connection sub-lines 61 in some of the first connection sub-lines 61 may be located in different layers, and two adjacent first connection sub-lines 61 in the other first connection sub-lines 61 are located in the same layer.

In this way, it helps reduce the area occupied by the plurality of first connection sub-lines 61 as the whole, and thus helps reduce the dimension of the fan-out region B1 in the first direction X.

As another example, the difference between the number of the first connection sub-lines 61 located in the first metal layer F2 and the number of the first connection sub-lines 61 located in the second metal layer F3 is zero or one. In this case, as shown in FIGS. 16, 17 and 19 to 22, any two adjacent first connection sub-lines 61 may be located in different layers.

In this way, it helps reduce the distance between any two adjacent first connection sub-lines 61, and further helps reduce the area occupied by of the plurality of first connection sub-lines 61 as the whole. As a result, it further reduces the dimension of the fan-out region B1 in the first direction X.

For example, as shown in FIGS. 16, 17 and 19 to 22, orthographic projections of any two adjacent first connection sub-lines 61 on the substrate 1 do not overlap with each other. That is, a distance between the orthographic projections of any two adjacent first connection sub-lines 61 on the substrate 1 may equal to zero, or greater than zero.

An insulating layer is provided between the first metal layer F2 and the second metal layer F3. In a case where any two adjacent first connection sub-lines 61 are located in different layers, the two adjacent first connection sub-lines 61 are likely to form a storage capacitor structure. As a result, signal crosstalk is likely to occur in a process of transmitting the data signal or sensing signal.

In the embodiments of the present disclosure, the orthographic projections of any two adjacent first connection sub-lines 61 on the substrate 1 do not overlap with each other, which helps prevent the two adjacent first connection sub-lines 61 from forming the storage capacitor structure, helps ameliorate the signal crosstalk, and thus ensures the accuracy of the transmitted data signal or sensing signal.

Here, in the case where the distance exists between the orthographic projections of any two adjacent first connection sub-lines 61 on the substrate 1, the distance may be set according to actual needs, as long as the area occupied by the plurality of first connection sub-lines 61 as the whole is small, and any two adjacent first connection sub-lines 61 are prevented from forming the storage capacitor structure.

Optionally, the distance between the orthographic projections of any two adjacent first connection sub-lines 61 on the substrate 1 may be greater than or equal to 1 μm. For example, the distance between the orthographic projections of any two adjacent first connection sub-lines 61 on the substrate 1 may be 1 μm, 1.1 μm, 1.3 μm, 1.35 μm, or 1.5 μm, etc.

The position and arrangement of the plurality of second connection sub-lines 62 may vary, which may be set according to actual needs.

In some examples, as shown in FIGS. 16, 17 and 19 to 22, the second metal layer F3 further includes at least one second connection sub-line 62. That is, at least part of the plurality of second connection sub-lines 62 and part of the first connection sub-lines 61 that are included in the display panel 100 are located in the same layer.

For example, the second metal layer F3 may include one second connection sub-line 62, two second connection sub-lines 62 or all the second connection sub-lines 62.

Since the number of the second connection sub-lines 62 is less than the number of the first connection sub-lines 61, the second connection sub-line 62 located in the second metal layer F3 may be adjacent to one or two first connection sub-lines 61. The first connection sub-line(s) 61 adjacent to the second connection sub-line 62 may be located in the first metal layer F2 or in the second metal layer F3.

For example, as shown in FIGS. 16, 17 and 19 to 22, an orthographic projection of the second connection sub-line 62 on the substrate 1 does not overlap with an orthographic projection of the first connection sub-line 61 on the substrate 1, and a distance exists between the orthographic projection of the second connection sub-line 62 on the substrate 1 and an orthographic projection of an adjacent first connection sub-line 61 on the substrate 1.

In this way, it may be possible to prevent the second connection sub-line 62 and the adjacent first connection sub-line 61 from being short-circuited, or prevent the second connection sub-line 62 and the adjacent first connection sub-line 61 from forming the storage capacitor structure. As a result, it helps ameliorate the signal crosstalk, and ensures the accuracy of the data signal or the sensing signal transmitted by the first connection sub-lines 61 and the accuracy of the power supply voltage signal transmitted by the second connection sub-line 62.

It will be understood that, in a direction perpendicular to the thickness direction of the substrate 1 and the second direction, the distance between the second connection sub-line 62 and the adjacent first connection sub-line 61 that is located in the second metal layer F3 (i.e., the distance between orthographic projections of the two on the substrate 1) is greater than the distance between the second connection sub-line 62 and the adjacent first connection sub-line 61 that is located in the first metal layer F2 (i.e. the distance between orthographic projections of the two on the substrate 1).

Optionally, in the direction perpendicular to the thickness direction of the substrate 1 and the second direction, the distance between the second connection sub-line 62 and the adjacent first connection sub-line 61 that is located in the second metal layer F3 may be greater than or equal to 4 μm. For example, the distance may be 4 μm, 4.15 μm, 4.25 μm, 4.5 μm, or 5 μm, etc.

Optionally, in the direction perpendicular to the thickness direction of the substrate 1 and the second direction, the distance between the second connection sub-line 62 and the adjacent first connection sub-line 61 that is located in the first metal layer F2 may be greater than or equal to 1 μm. For example, the distance may be 1 μm, 1.15 μm, 1.25 μm, 1.5 μm, or 2 μm, etc.

In some other examples, the display panel 100 may further include other metal layer disposed between the second metal layer F3 and the second light-transmissive layer F5, so as to increase the wiring space of the display panel 100 and reduce the wiring difficulty.

In this case, at least part of the second connection sub-lines 62 included in the display panel 100 may be located in the other metal layer. For the positional relationship between the second connection sub-line 62 located in the other metal layer and the first connection sub-line 61, reference may be made to the descriptions in the above examples.

The position and arrangement of the plurality of third connection sub-lines 63 may vary, which may be set according to actual needs.

In some examples, as shown in FIGS. 16, 17, 19 and 20, in the direction perpendicular to the thickness direction of the substrate 1 and the second direction, at least a portion of the third connection sub-line 63 is located in a gap between two adjacent first connection sub-lines 61.

For example, at least part of the plurality of first connection sub-lines 61 included in the display panel 100 may be divided into at least one first connection sub-line group. Each first connection sub-line group includes two adjacent first connection sub-lines 61, and the gap exists between the two adjacent first connection sub-lines 61. A dimension of the gap in the first direction X is much greater than 1 μm.

For example, a first connection sub-line group may correspond to one third connection sub-line 63. In the direction perpendicular to the thickness direction of the substrate 1 and the second direction, the portion of the third connection sub-line 63 or the entire third connection sub-line 63 is located in the gap of the first connection sub-line group. That is, an orthographic projection of the third connection sub-line 63 on the substrate 1 may not overlap or partially overlap with orthographic projections of the first connection sub-lines 61 in the first connection sub-line group on the substrate 1.

In this way, it may be possible to effectively reduce an area of the third connection sub-line 63 facing the first connection sub-line group, and thereby effectively reduce a capacitance of a storage capacitor structure formed by the third connection sub-line 63 and the first connection sub-line group; or it may be possible to prevent the storage capacitor structure from being formed by the third connection sub-line 63 and the first connection sub-line group.

Here, the number of first connection sub-line groups may be equal to the number of the clock signal lines 42.

Figure 16:
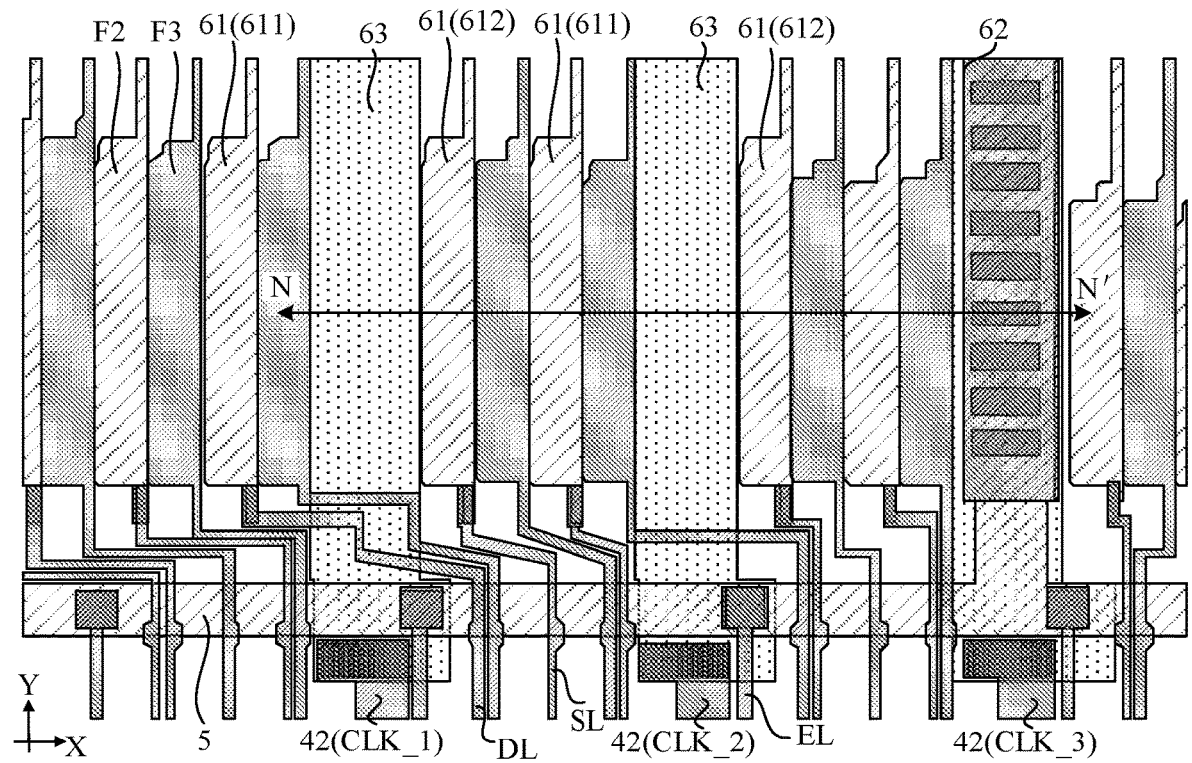
FIG. 16 is a structural diagram of connection lines, in accordance with some embodiments of the present disclosure.

For example, as shown in FIG. 16, the clock signal lines 42 may include the first clock signal sub-line CLK_1, the second clock signal sub-line CLK_2 and the third clock signal sub-line CLK_3. Correspondingly, the number of the first connection sub-line groups may be three.

As another example, the clock signal lines 42 may further include: the fourth clock signal sub-line CLK_4, the fifth clock signal sub-line CLK_5, the sixth clock signal sub-line CLK_6, the seventh clock signal sub-line CLK_7, the eighth clock signal sub-line CLK_8 and the ninth clock signal sub-line CLK_9. Correspondingly, the number of the first connection sub-line groups may be nine.

Figure 15:
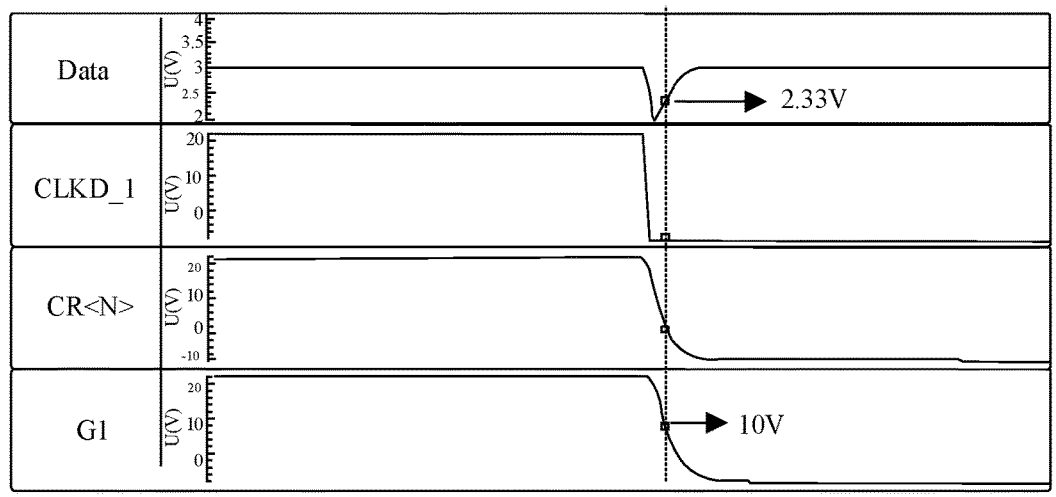
FIG. 15 is a timing diagram corresponding to the connection lines shown in FIG. 14.

For example, the clock signal line 42 is the first clock signal sub-line CLK_1, but it is not limited to the first clock signal sub-line CLK_1. It will be noted that, as shown in FIG. 15, in the data writing period of the pixel driving circuit 21 in the sub-pixel 2, the first scan signal transmitted by the first scan signal terminal G1 is at the high level, and the display data signal transmitted by the data signal terminal Data is at the high level. The first scan signal is the first output signal output from a corresponding shift register 41. According to the timing diagram as shown in FIG. 10, in the third period t3 and the fourth period t4, the first clock signal (which is from a corresponding third connection sub-line 63) transmitted by the first clock signal sub-line CLK_1 and the second clock signal (which is from a corresponding third connection sub-line 63) transmitted by the fourth clock signal sub-line CLK_4 are both at high levels. In a process of data writing, the level of the first clock signal changes from the high level to the low level earlier than the level of the data signal.

Figure 14:
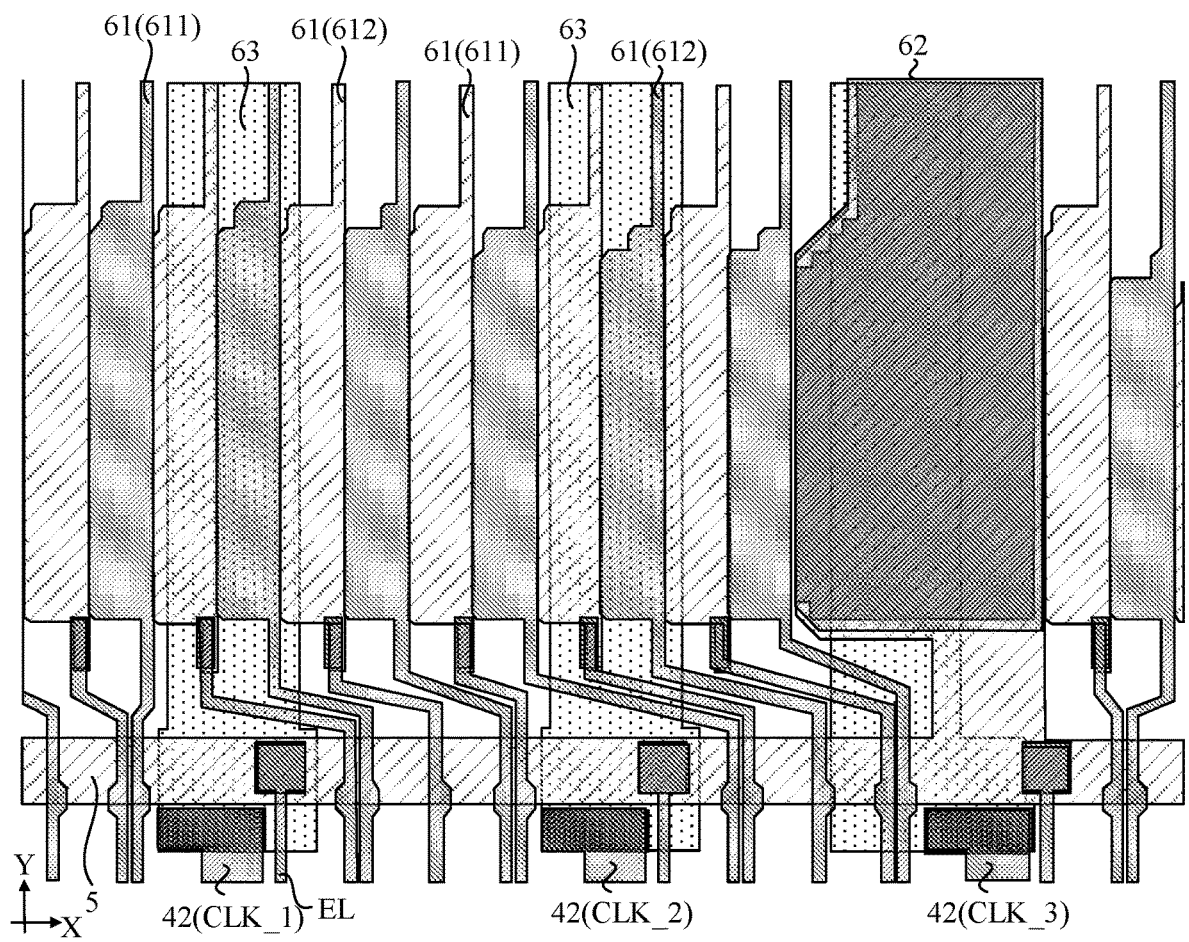
FIG. 14 is a structural diagram of connection lines, in accordance with an implementation.

As shown in FIG. 14, in a case where the distance between the orthographic projections of any two adjacent first connection sub-lines 61 on the substrate 1 is small, the area of the third connection sub-line 63 facing the adjacent first connection sub-line 61 is large, so that the capacitance of the storage capacitor formed by the third connection sub-line 63 and the adjacent first connection sub-line 61 is large. As a result, in a process where the level of the first scan signal changes from the high level to the low level, based on the bootstrap action of the storage capacitor, a voltage value of the data signal transmitted from the first connection sub-line 61 to a corresponding data line DL, data signal terminal Data and first node G will be reduced. For example, as shown in FIG. 15, in a case where the level of the first scan signal drops to 10 V, the voltage value of the data signal written into the first node G is changed from 3 V to 2.33 V. In this way, it is likely to cause poor display of vertical dark spots.

In light of this, in some embodiments of the present disclosure, the third connection sub-line 63 corresponds to the first connection sub-line group, the distance between the two adjacent first connection sub-lines 61 in the first connection sub-line group is increased, and at least the portion of the third connection sub-line 63 is located in the gap between the two adjacent first connection sub-lines 61 in the direction perpendicular to the thickness direction of the substrate 1 and the second direction, which may be possible to effectively reduce the area of the third connection sub-line 63 facing the two adjacent first connection sub-lines 61, and thereby effectively reduce the capacitance of the storage capacitor structure formed by the third connection sub-line 63 and the two adjacent first connection sub-lines 61, or prevent the storage capacitor structure from being formed by the third connection sub-line 63 and the two adjacent first connection sub-lines 61. In this way, it may be possible to ameliorate the phenomenon that the voltage value of the data signal written into the first node G is reduced due to the drop of the level of the first clock signal in the data writing period of the pixel driving circuit 21, or even eliminate the phenomenon. As a result, it is possible to ameliorate or even eliminate the poor display of vertical dark spots, which improves the display effect of the display panel 100.

Figure 18:
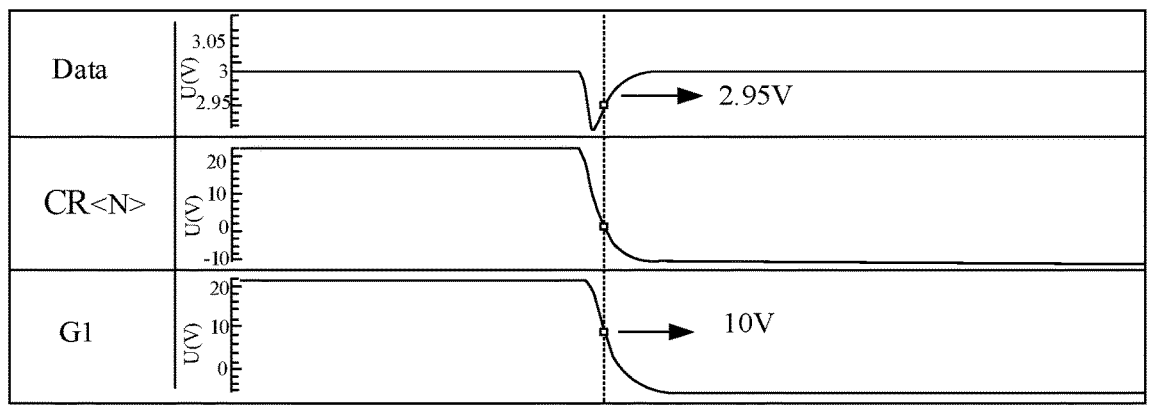
FIG. 18 is a timing diagram corresponding to the connection lines shown in FIG. 16.

It has been verified that, as shown in FIG. 18, in the examples, in the data writing period of the pixel driving circuit 21, in the case where the level of the first scan signal drops to 10 V, the voltage value of the data signal written into the first node G of the pixel driving circuit 21 is 2.95 V. That is, the voltage value of the data signal may be written normally. In this case, it may be possible to effectively ameliorate or even eliminate the poor display of vertical dark spots.

In the examples, the position of the third connection sub-line 63 may vary, which may be set according to actual needs.

Figure 17:
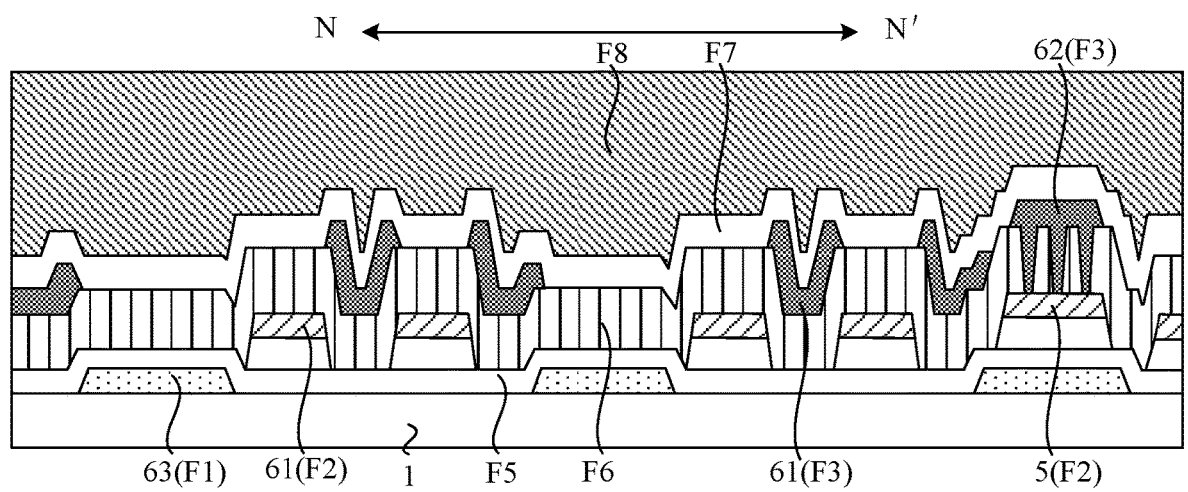
FIG. 17 is a sectional view of the structure shown in FIG. 16 taken along the line N-N'.

For example, as shown in FIGS. 16 and 17, in a case where the display panel 100 includes the first light-transmissive layer F1, the first light-transmissive layer F1 may further include at least one third connection sub-line 63. That is, part of the plurality of third connection sub-lines 63 or all of the plurality of third connection sub-lines 63 may be located in the first light-transmissive layer F1.

Since the first light-transmissive layer F1 and the first metal layer F2 are insulated from each other, the first light-transmissive layer F1 and the second metal layer F3 are also insulated from each other. In this case, in the direction perpendicular to the thickness direction of the substrate 1 and the second direction, the entire third connection sub-line 63 may be located in the gap of a corresponding first connection sub-line group; or the portion of the third connection sub-line 63 may be located in the gap of the corresponding first connection sub-line group.

Here, in the case where the portion of the third connection sub-line 63 is located in the gap of the corresponding first connection sub-line group (i.e., the gap between the two adjacent first connection sub-lines 61), the orthographic projection of the third connection sub-line 63 on the substrate 1 may partially overlap with orthographic projection (s) of at least one first connection sub-line 61 in the two adjacent first connection sub-lines 61 on the substrate 1.

For example, the orthographic projection of the third connection sub-line 63 on the substrate 1 may partially overlap with an orthographic projection of each of the two adjacent first connection sub-lines 61 on the substrate 1. In this case, the area of the third connection sub-line 63 facing any one first connection sub-line 61 in the two adjacent first connection sub-lines 61 is small, and the capacitance of the formed storage capacitor structure is small, so that the poor display of vertical dark spots may be effectively ameliorated.

As another example, the orthographic projection of the third connection sub-line 63 on the substrate 1 may partially overlap with an orthographic projection of one first connection sub-line 61 in the two adjacent first connection sub-lines 61 on the substrate 1. Therefore, an area of the third connection sub-line 63 facing the one first connection sub-line 61 is reduced, and the capacitance of the formed storage capacitor structure is reduced, which may effectively ameliorate the poor display of vertical dark spots.

The orthographic projection of the third connection sub-line 63 on the substrate 1 and an orthographic projection of the other first connection sub-line 61 in the two adjacent first connection sub-lines 61 on the substrate 1 do not overlap and have a distance therebetween. In this way, it may be possible to prevent the third connection sub-line 63 and the other first connection sub-line 61 from forming the storage capacitor structure, which may effectively ameliorate the poor display of vertical dark spots.

Optionally, a dimension of an overlapping portion, in the first direction X, of the orthographic projection of the third connection sub-line 63 on the substrate 1 and the orthographic projection of one of the two adjacent first connection sub-lines 61 on the substrate 1 is less than or equal to ⅕ of a dimension, in the first direction X, of the orthographic projection of the one first connection sub-line 61 on the substrate 1. That is, a dimension, in the first direction X, of a portion of the first connection sub-line 61 facing the third connection sub-line 63 is less than or equal to ⅕ of the dimension, in the first direction X, of the first connection sub-line 61.

In this way, it may be possible to effectively reduce the capacitance of the storage capacitor structure formed by the third connection sub-line 63 and the adjacent first connection sub-line 61, and thereby effectively ameliorate or even eliminate the poor display of vertical dark spots. In addition, it may be possible to avoid excessively increasing the distance between the adjacent two first connection sub-lines 61, so that the fan-out region B1 still has a small size.

Figure 19:
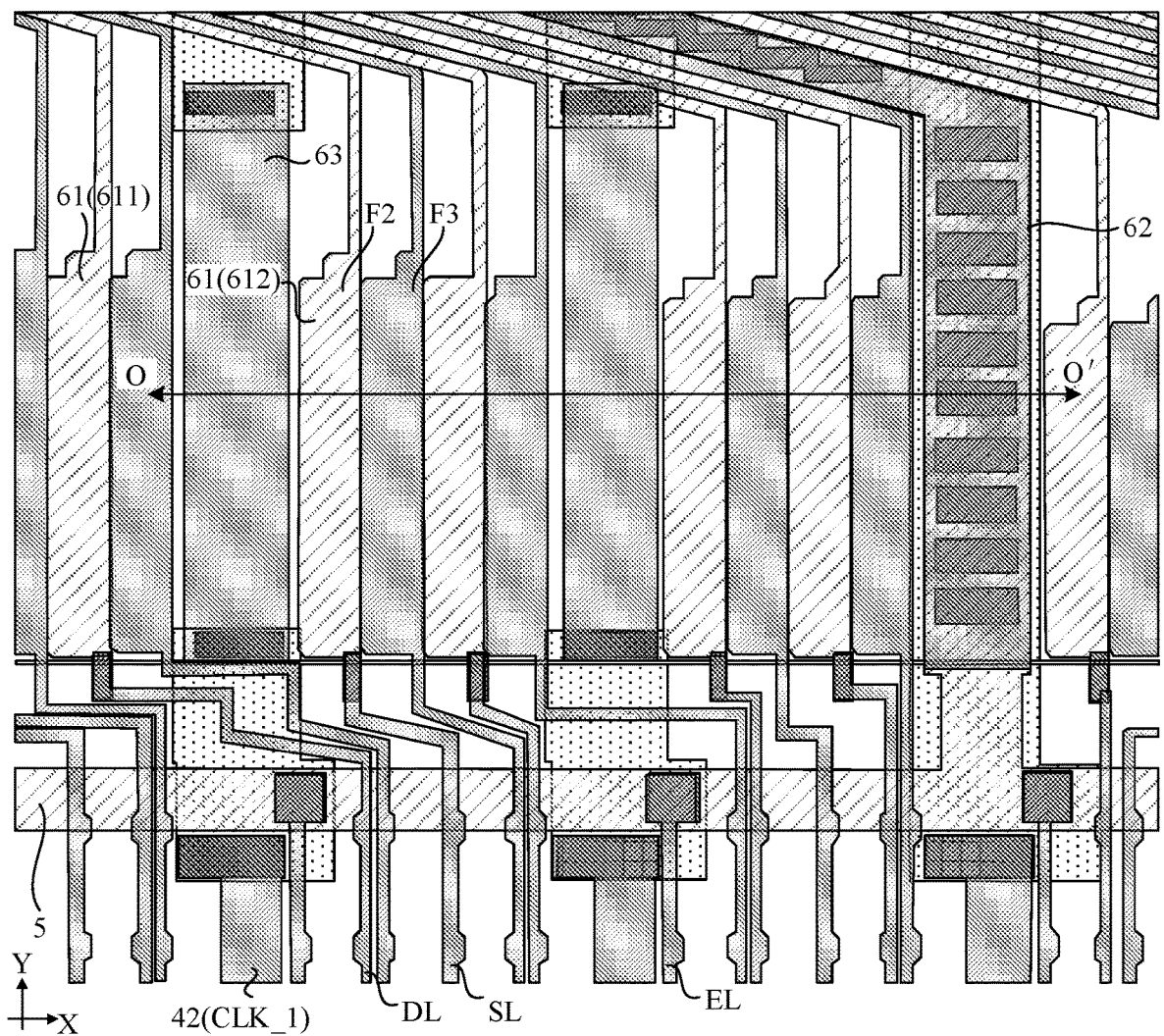
FIG. 19 is another structural diagram of connection lines, in accordance with some embodiments of the present disclosure.
Figure 20:
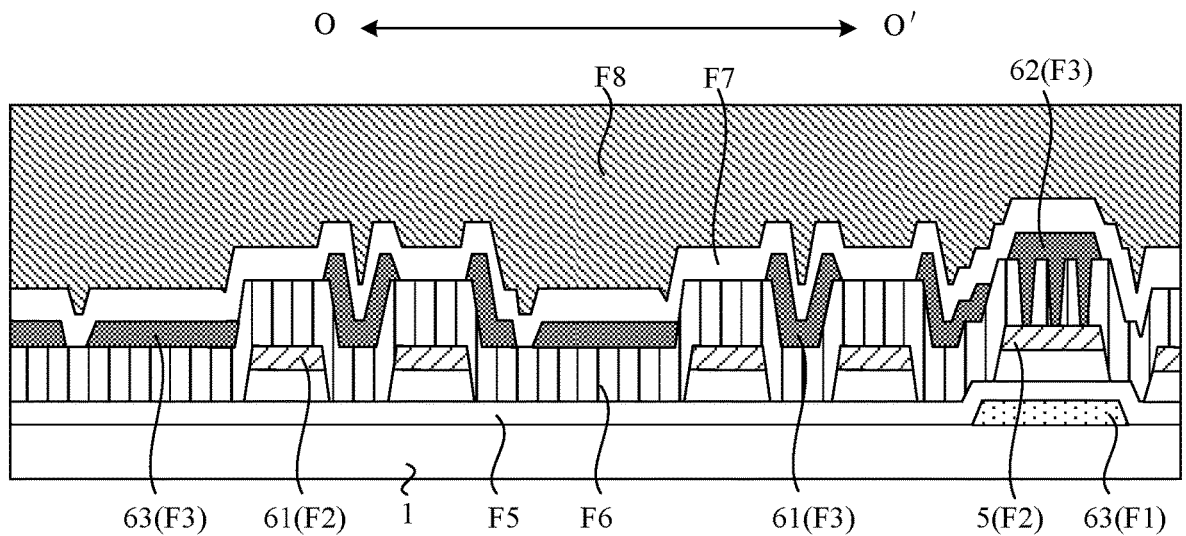
FIG. 20 is a sectional view of the structure shown in FIG. 19 taken along the line O-O'.

For example, as shown in FIGS. 19 and 20, in a case where the display panel 100 includes the second metal layer F3, the second metal layer F3 may further include at least one third connection sub-line 63. That is, part of the plurality of third connection sub-lines 63 or all of the plurality of third connection sub-lines 63 may be located in the second metal layer F3. In a case where the part of the plurality of third connection sub-lines 63 are located in the second metal layer F3, as shown in FIGS. 19 and 20, remaining third connection sub-line(s) 63 may still be located in the first light-transmissive layer F1.

Since a resistance of the material of the second metal layer F3 is less than a resistance of the material of the first light-transmissive layer F1, by arranging the third connection sub-line 63 in the second metal layer F3, it may be possible to reduce the dimension of the third connection sub-line 63 in the first direction X. That is, the dimension, in the first direction X, of the third connection sub-line 63 located in the second metal layer F3 is less than the dimension, in the first direction X, of the third connection sub-line 63 located in the first light-transmissive layer F1.

In this way, it helps further reduce the area of the third connection sub-line 63 facing the adjacent first connection sub-line 61, and thus reduce the capacitance of the storage capacitor structure formed by the third connection sub-line 63 and the adjacent first connection sub-line 61; or it helps avoid the orthographic projection of the third connection sub-line 63 on the substrate 1 overlapping with the orthographic projection of the adjacent first connection sub-line 61 on the substrate 1, so as to prevent the third connection sub-line 63 and the adjacent first connection sub-line 61 from forming the storage capacitor structure. As a result, the poor display of vertical dark spots may be further ameliorated or even eliminated, and thus the display effect of the display panel 100 is improved.

For example, as shown in FIGS. 19 and 20, the orthographic projection of the third connection sub-line 63 located in the second metal layer F3 on the substrate 1 and the orthographic projection of each of the two adjacent first connection sub-lines 61 on the substrate 1 do not overlap and have a distance therebetween.

In this way, it may be possible to prevent a fringe field capacitance from being formed between the third connection sub-line 63 and the adjacent first connection sub-lines 61, and further ameliorate or even eliminate the poor display of vertical dark spots. As a result, the display effect of the display panel 100 is improved.

In addition, since the second metal layer F3 includes the first connection sub-line 61, by setting the positional relationship between the third connection sub-line 63 and the adjacent first connection sub-line 61, it may be possible to prevent the third connection sub-line 63 and the adjacent first connection sub-line 61 located in the second metal layer F3 from being short-circuited.

Here, as shown in FIGS. 19 and 20, in a case where the two first connection sub-lines 61 adjacent to the third connection sub-line 63 are respectively located in the first metal layer F2 and the second metal layer F3, the distance between the orthographic projection of the third connection sub-line 63 on the substrate 1 and the orthographic projection of the first connection sub-line 61 located in the second metal layer F3 on the substrate 1 may be, for example, greater than the distance between the orthographic projection of the third connection sub-line 63 on the substrate 1 and the orthographic projection of the first connection sub-line 61 located in the first metal layer F2 on the substrate 1.

In this way, it may be possible to ensure that the third connection sub-line 63 and the first connection sub-line 61 that is located in the first metal layer F2 are staggered, so that a certain distance exists between orthographic projections of the third connection sub-line and the first connection sub-line that is located in the first metal layer F2 on the substrate 1. As a result, it prevents the storage capacitor structure being formed by the third connection sub-line 63 and the first connection sub-line 61, which adversely affects the data signal transmitted by the first connection sub-line 61. In addition, it may be possible to ensure that a large distance exists between the orthographic projection of the third connection sub-line 63 on the substrate 1 and the orthographic projection of the first connection sub-line 61 located in the second metal layer F3 on the substrate 1. As a result, it prevents the third connection sub-line 63 and the first connection sub-line 61 from being short-circuited, and prevents the fringe field capacitor from being formed between the third connection sub-line 63 and the first connection sub-line 61, which affects the data signal transmitted by the first connection sub-line 61.

The distance between the orthographic projection of the third connection sub-line 63 on the substrate 1 and the orthographic projection of the first connection sub-line 61 located in the second metal layer F3 on the substrate 1 may be set according to actual needs. The distance between the orthographic projection of the third connection sub-line 63 on the substrate 1 and the orthographic projection of the first connection sub-line 61 located in the first metal layer F2 on the substrate 1 may be set according to actual needs.

Optionally, the distance between the orthographic projection of the third connection sub-line 63 on the substrate 1 and the orthographic projection of the first connection sub-line 61 located in the second metal layer F3 on the substrate 1 is greater than or equal to 4 µm. For example, the distance may be 4 µm, 4.11 µm, 4.24 µm, 4.78 µm, or 5.1 µm, etc.

Optionally, the distance between the orthographic projection of the third connection sub-line 63 on the substrate 1 and the orthographic projection of the first connection sub-line 61 located in the first metal layer F2 on the substrate 1 is greater than or equal to 1 µm. For example, the distance may be 1 µm, 1.11 µm, 1.24 µm, 1.78 µm, or 1.2 µm, etc.

In the examples, the dimension of the second connection sub-line 62 in the first direction X is 1.5 times to 2.5 times the dimension of the first connection sub-line 61 in the first direction X.

It will be noted that, in order to ensure a good transmission effect of the power supply voltage signal, a dimension of a second connection sub-line 62 in the first direction X is generally designed to be 3 times to 5 times a dimension of a first connection sub-line 61 in the first direction X.

By setting the dimension of the at least one second connection sub-line 62 in the first direction X to be 1.5 times to 2.5 times the dimension of the first connection sub-line 61 in the first direction X (i.e., by reducing the dimension of the at least one second connection sub-line 62 in the first direction X) in the embodiments of the present disclosure, it may be possible to reduce the area occupied by the plurality of second connection sub-lines 62 in the fan-out region B1, increase the distance between the two adjacent first connection sub-lines 61 in the at least one first connection sub-line group, and thereby reducing the area of the third connection sub-line 63 facing the two adjacent first connection sub-lines 61. In this way, it may be possible not only to avoid the dimension of the fan-out region B1 in the first direction X being increased, but also to avoid affecting the accuracy of data signals transmitted by the two first connection sub-lines 61 adjacent to the third connection sub-line 63, which ameliorates or even eliminates the poor display of vertical dark spots.

Figure 21:
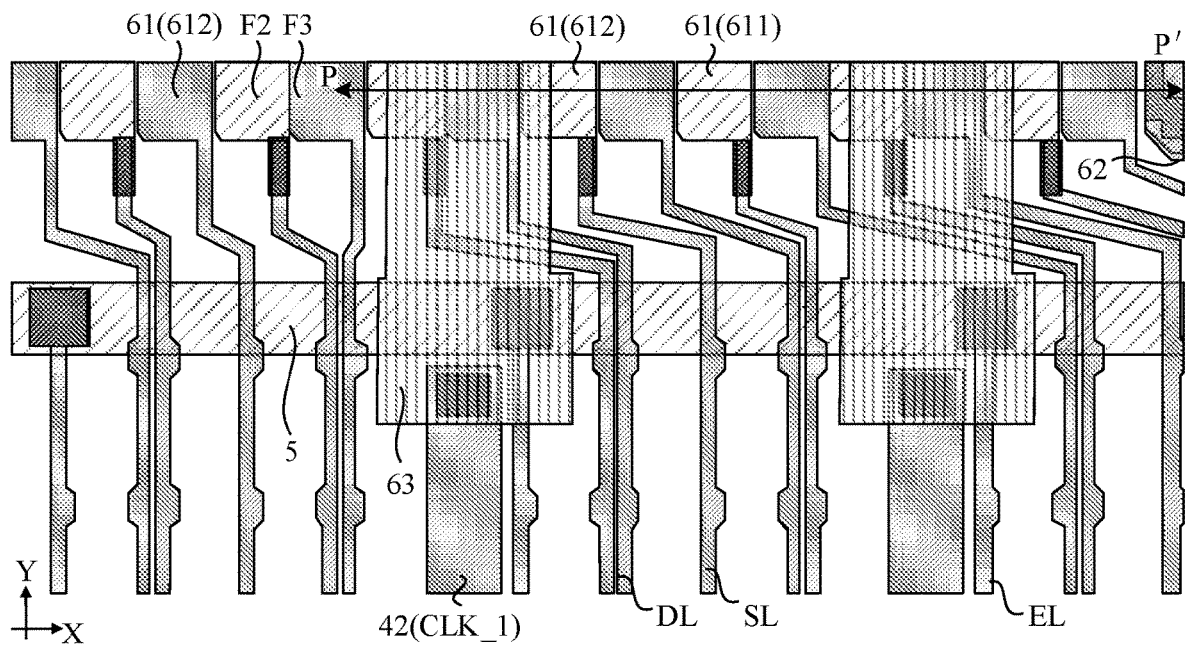
FIG. 21 is yet another structural diagram of connection lines, in accordance with some embodiments of the present disclosure.
Figure 22:
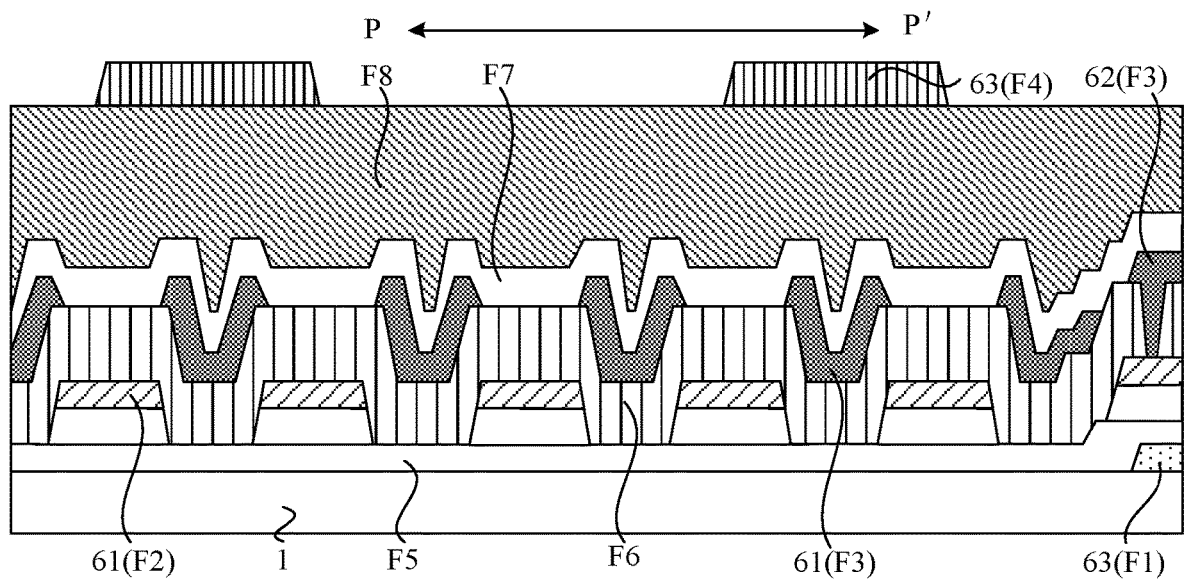
FIG. 22 is a sectional view of the structure shown in FIG. 21 taken along the line P-P'.

In some other examples, as shown in FIGS. 21 and 22, the second light-transmissive layer F4 may further include at least one third connection sub-line 63. That is, part of the plurality of third connection sub-lines 63 or all of the plurality of third connection sub-lines 63 may be located in the second light-transmissive layer F4. In a case where the part of the plurality of third connection sub-lines 63 are located in the second light-transmissive layer F4, remaining third connection sub-line(s) 63 may still be located in the first light-transmissive layer F1.

For example, as shown in FIG. 22, in the thickness direction of the substrate 1, a distance between the first light-transmissive layer F1 and the second metal layer F3 is less than a distance between the second metal layer F3 and the second light-transmissive layer F4.

Here, in the thickness direction of the substrate 1, patterns of the first metal layer F2 is arranged between a portion of the first light-transmissive layer F1 and a portion of the second metal layer F3, and another portion of the first light-transmissive layer F1 and another portion of the second metal layer F3 are not provided with any pattern of the first metal layer F2 therebetween. The distance between the first light-transmissive layer F1 and the second metal layer F3 may refer to a distance between the another portion of the first light-transmissive layer F1 and the another portion of the second metal layer F3.

By arranging the third connection sub-line(s) 63 in the second light-transmissive layer F4, it may be possible to increase a distance between the third connection sub-line 63 and the second metal layer F3. That is, a distance between the third connection sub-line 63 and the first connection sub-line 61 that is located in the second metal layer F3 may be increased. In this way, in a case where the third connection sub-line 63 and the first connection sub-line 61 that is located in the second metal layer F3 form the storage capacitor structure, the capacitance of the storage capacitor structure may be effectively reduced.

In addition, it will be understood that, the first metal layer F2 is located between the first light-transmissive layer F1 and the second metal layer F3, and a distance between the first light-transmissive layer F1 and the first metal layer F2 is less than a distance between the first metal layer F2 and the second light-transmissive layer F4. By arranging the third connection sub-line 63 in the second light-transmissive layer F4, it may be possible to increase a distance between the third connection sub-line 63 and the first metal layer F2. That is, a distance between the third connection sub-line 63 and the first connection sub-line 61 that is located in the first metal layer F2 may be increased. In this way, in a case where the third connection sub-line 63 and the first connection sub-line 61 that is located in the first metal layer F2 form the storage capacitor structure, the capacitance of the storage capacitor structure may be effectively reduced.

By arranging the third connection sub-line 63 in the second light-transmissive layer F4 in the embodiments of the present disclosure, it may be possible to effectively reduce the capacitance of the storage capacitor structure formed by the third connection sub-line 63 and the first connection sub-line 61 that is located in the first metal layer F2, and effectively reduce the capacitance of the storage capacitor structure formed by the third connection sub-line 63 and the first connection sub-line 61 that is located in the second metal layer F3. In this way, in the data writing period of the pixel driving circuit 21, it may be possible to weaken the influence of the storage capacitor structure on the transmission of the data signal, and ameliorate the phenomenon that the voltage value of the data signal written into the first node G is reduced due to the drop of the level of the first clock signal in the data writing period of the pixel driving circuit 21, or even eliminate the phenomenon. As a result, the poor display of vertical dark spots is ameliorated or even eliminated, which improves the display effect of the display panel 100.

Figure 23:
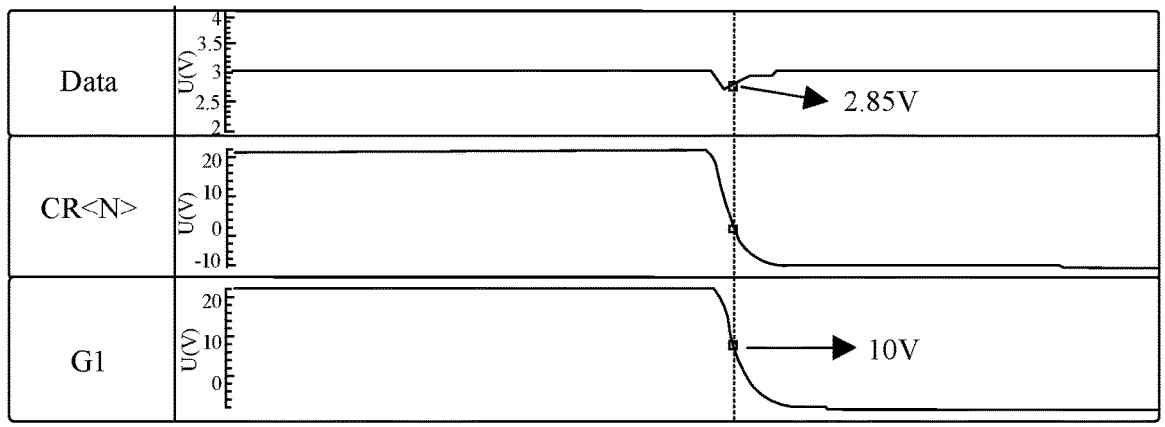
FIG. 23 is a timing diagram corresponding to the connection lines shown in FIG. 21.

It is verified that, as shown in FIG. 23, in the examples, in the data writing period of the pixel driving circuit 21, in the case where the level of the first scan signal drops to 10 V, the voltage value of the data signal written into the first node G of the pixel driving circuit 21 is 2.85 V. That is, the voltage value of the data signal may be written normally. In this case, it may be possible to ameliorate or even eliminate the poor display of vertical dark spots.

Insulating material(s) are provided between the first light-transmissive layer F1 and the second metal layer F3, and insulating material(s) are provided between the second metal layer F3 and the second light-transmissive layer F4. The distance between the first light-transmissive layer F1 and the second metal layer F3 may be determined according to the insulating material(s) between the first light-transmissive layer F1 and the second metal layer F3, and the distance between the second metal layer F3 and the second light-transmissive layer F4 may be determined according to the insulating material(s) between the second metal layer F3 and the second light-transmissive layer F4.

For example, as shown in FIG. 22, the display panel 100 further includes a buffer layer F5 and a gate insulating layer F6 that are disposed between the first light-transmissive layer F1 and the second metal layer F4 and stacked in sequence.

Patterns of the first metal layer F2 are arranged between a portion of the buffer layer F5 and a portion of the gate insulating layer F6, and another portion of the buffer layer F5 is in direct contact with another portion of the gate insulating layer F6. The distance between the first light-transmissive layer F1 and the second metal layer F3 is, for example, a sum of thicknesses of the another portion of the buffer layer F5 and the another portion of the gate insulating layer F6.

It will be noted that the buffer layer F5 is made of an inorganic material, such as silicon dioxide and/or silicon nitride. The gate insulating layer F6 is made of an inorganic material, such as silicon dioxide and/or silicon nitride. In a process of manufacturing the buffer layer F5 and the gate insulating layer F6, the buffer layer F5 and the gate insulating layer F6 each may be manufactured, for example, by using a plasma enhanced chemical vapor deposition (PECVD) process. Based on this, the buffer layer F5 and the gate insulating layer F6 each are a thin film with a relatively uniform thickness, and the thicknesses of both the buffer layer F5 and the gate insulating layer F6 are relatively small.

For example, as shown in FIG. 22, the display panel 100 further includes a passivation layer F7 and a planarization layer F8 that are disposed between the second metal layer F3 and the second light-transmissive layer F4.

It will be noted that, the passivation layer F7 is made of an inorganic material, such as silicon nitride. In a process of manufacturing the passivation layer F7, the passivation layer F7 may be manufactured, for example, by using the PECVD process. Based on this, the passivation layer F7 is a thin film with a relatively uniform thickness, and the thickness of the passivation layer F7 is small.

The planarization layer F8 is made of an organic material, such as polyimide or an organic resin material. In a process of manufacturing the planarization layer F8, the planarization layer F8 may be manufactured, for example, by using a coating process (e.g., a spin coating process, a spray coating process, or a spot coating process). Based on this, a surface of the planarization layer F8 away from the substrate 1 is a relatively flat surface, and the planarization layer F8 is a thin film with a non-uniform thickness. For example, a thickness of the planarization layer F8 may refer to an average thickness of the planarization layer F8. The thickness of the planarization layer F8 is relatively large, and the thickness of the planarization layer F8 is greater than a thickness of any one of the buffer layer F5, the gate insulating layer F6 and the passivation layer F7.

For example, a sum of thicknesses of the buffer layer F5 and the gate insulating layer F6 is less than a sum of thicknesses of the passivation layer F7 and the planarization layer F8. That is, the distance between the first light-transmissive layer F1 and the second metal layer F3 is less than the distance between the second metal layers F3 and the second light-transmissive layer F4.

In this way, in the case where the third connection sub-line(s) 63 are disposed in the second light-transmissive layer F4, the passivation layer F7 and the planarization layer F8 may be used to increase the distance between the third connection sub-line 63 and the second metal layer F3, and increase the distance between the third connection sub-line 63 and the first metal layer F2, which helps reduce the capacitance of the storage capacitor structure formed by the third connection sub-line 63 and the first connection sub-line 61 that is located in the second metal layer F3, and reduce the capacitance of the storage capacitor structure formed by the third connection sub-line 63 and the first connection sub-line 61 that is located in the first metal layer F2. As a result, it helps reduce the influence of the clock signal transmitted by the third connection sub-line 63 on the data signal transmitted by the first connection sub-line 61, and thus the poor display of vertical dark spots is ameliorated or even eliminated.

For example, the sum of the thicknesses of the passivation layer F7 and the planarization layer F8 is greater than or equal to twice the sum of the thicknesses of the buffer layer F5 and the gate insulating layer F6.

For example, in the case where the third connection sub-line 63 is arranged in the first light-transmissive layer F1, the capacitance of the storage capacitor structure formed by the third connection sub-line 63 and the first connection sub-line 61 that is located in the second metal layer F3 is $C_1$. In the case where the third connection sub-line 63 is arranged in the second light-transmissive layer F4, the capacitance of the storage capacitor structure formed by the third connection sub-line 63 and the first connection sub-line 61 that is located in the second metal layer F3 is $C_2$.

$$C_2 \leq \tfrac{1}{2} \times C_1.$$

That is, in the case where the third connection sub-line 63 is arranged in the second light-transmissive layer F4, the capacitance of the storage capacitor structure formed by the third connection sub-line 63 and the first connection sub-line 61 that is located in the second metal layer F3 may be reduced to at least ½ of an original capacitance (i.e., the capacitance $C_1$).

Since the first metal layer F2 is located between the first light-transmissive layer F1 and the second metal layer F3, in the case where the third connection sub-line 63 is arranged in the second light-transmissive layer F4, the capacitance of the storage capacitor structure formed by the third connection sub-line 63 and the first connection sub-line 61 that is located in the first metal layer F2 may be reduced even more.

In this way, it may be possible to effectively reduce the capacitance of the storage capacitor structure formed by the third connection sub-line 63 and the first connection sub-line 61, and thereby effectively weaken the influence of the clock signal transmitted by the third connection sub-line 63 on the data signal transmitted by the first connection sub-line 61. As a result, the poor display of vertical dark spots is ameliorated or even eliminated.

Optionally, the thickness of the buffer layer F5 may be within a range of 2500 Å to 3500 Å, inclusive. For example, the thickness of the buffer layer F5 may be 2500 Å, 2800 Å, 3000 Å, 3300 Å, or 3500 Å, etc.

Optionally, the thickness of the gate insulating layer F6 may be within a range of 7000 Å to 9000 Å, inclusive. For example, the thickness of the gate insulating layer F6 may be 7000 Å, 7800 Å, 8000 Å, 8500 Å, or 9000 Å, etc.

Optionally, the thickness of the passivation layer F7 may be within a range of 3700 Å to 4000 Å, inclusive. For example, the thickness of the passivation layer F7 may be 3700 Å, 3800 Å, 3900 Å, 3950 Å or 4000 Å, etc.

Optionally, the thickness of the planarization layer F8 is greater than or equal to 20000 Å, inclusive. For example, the thickness of the planarization layer F8 may be 20000 Å, 20100 Å, 20500 Å, 20900 Å or 21500 Å, etc.

In this example, the dimension of the second connection sub-line 62 in the first direction X is 3 times to 5 times the dimension of the first connection sub-line 61 in the first direction X.

In the case where the dimension of the second connection sub-line 62 in the first direction X is set to be 3 times to 5 times the dimension of the first connection sub-line 61 in the first direction X, the distance between the two adjacent first connection sub-lines 61 may not be adjusted, so as to make the distance between any two adjacent first connection sub-lines 61 equal or substantially equal. In this way, it may be possible not only to avoid increasing the dimension of the fan-out region B1 in the first direction X, and avoid increasing the difficulty of wiring design of the display panel 100, but also to ensure that the second connection sub-line 62 can transmit the power supply voltage signal well.

In this case, the third connection sub-line 63 may, for example, be arranged facing at least one first connection sub-line 61.

By arranging the third connection sub-line 63 in the second light-transmissive layer F4 in the embodiments of the present disclosure, it may be possible to effectively increase the distance between the third connection sub-line 63 and the first connection sub-line 61 facing the third connection sub-line 63. Therefore, the capacitance of the storage capacitor structure formed by the third connection sub-line and the first connection sub-line 61 facing the third connection sub-line 63 is effectively reduced, and the influence of the third connection sub-line 63 on the data signal transmission of the first connection sub-line 61 facing the third connection sub-line 63 is weakened. In this way, it may be possible not only to avoid an adjustment of the first connection sub-line 61 and the second connection sub-line 62, but also to ameliorate or even eliminate the poor display of vertical dark spots.

In some other examples, as shown in FIGS. 16, 17, 19 and 20, the at least one third connection sub-line 63 is not located in the second metal layer F3. The orthographic projection of the third connection sub-line 63 on the substrate 1 partially overlaps with an orthographic projection of a corresponding second connection sub-line 62 on the substrate 1.

For example, the third connection sub-lines 63 may be located in the first light-transmissive layer F1 or the second light-transmissive layer F4. The dimension of the third connection sub-line 63 in the first direction X and the dimension of the second connection sub-line 62 in the first direction X may be equal or not equal.

Here, the third connection sub-line 63 has little influence on the transmission of the power supply voltage signal of the second connection sub-line 62 during the transmission of the clock signal.

By setting the positional relationship between the third connection sub-lines 63 that are not located in the second metal layer F3 and respective second connection sub-lines 62, it may be possible not only to prevent the third connection sub-line 63 and the second connection sub-line 62 from being short-circuited, but also to arrange the third connection sub-line 63 and the second connection sub-line 62 in the gap of the same first connection sub-line group (which includes the two adjacent first connection sub-lines 61 having the gap therebetween), and to prevent the third connection sub-line 63 and more first connection sub-lines 61 from forming the storage capacitor structure.

The above are only specific embodiments of the present disclosure, but the protection scope of the present disclosure is not limited to this. Changes or replacements that any person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display panel having a display area and a fan-out region located on a side of the display area; the display panel comprising:
   a substrate;
   a plurality of sub-pixels and a plurality of signal transmission lines located in the display area, wherein the plurality of sub-pixels are arranged in a plurality of rows and a plurality of columns, sub-pixels in a row are arranged along a first direction, and sub-pixels in a column are arranged along a second direction, and a signal transmission line in the plurality of signal transmission lines is electrically connected to at least one column of sub-pixels;
   a scan driving circuit including a plurality of shift registers and a plurality of clock signal lines that are located in the display area;
   a power supply voltage bus located in the fan-out region and extending along the first direction; and
   a plurality of connection lines located in the fan-out region, wherein the plurality of connection lines, the plurality of sub-pixels, the plurality of signal transmission lines, the scan driving circuit and the power supply voltage bus are located on a same side of the substrate, and the plurality of connection lines extend along the second direction and are located closer to a side of the fan-out region away from the display area than the power supply voltage bus;
   wherein the plurality of connection lines include a plurality of first connection sub-lines, a plurality of second connection sub-lines and a plurality of third connection sub-lines; and
   a first connection sub-line in the plurality of first connection sub-lines is electrically connected to the signal transmission line in the plurality of signal transmission lines, a second connection sub-line in the plurality of second connection sub-lines is electrically connected to the power supply voltage bus, and a third connection sub-line in the plurality of third connection sub-lines is electrically connected to a clock signal line in the plurality of clock signal lines;
   wherein the display panel comprises: a first light-transmissive layer, a first metal layer, a second metal layer and a second light-transmissive layer that are stacked in sequence, wherein the first light-transmissive layer includes first terminals of storage capacitors in the plurality of sub-pixels;
   the first metal layer includes:
      control electrodes of transistors in the plurality of sub-pixels, the power supply voltage bus, control electrodes of transistors in the plurality of shift registers, and at least one first connection sub-line in the plurality of first connection sub-lines;
   the second metal layer includes:
      first electrodes and second electrodes of the transistors in the plurality of sub-pixels, the plurality of signal transmission lines, first electrodes and second electrodes of the transistors in the plurality of shift registers, and another at least one first connection sub-line in the plurality of first connection sub-lines; and
   the second light-transmissive layer includes anodes or cathodes of light-emitting devices in the plurality of sub-pixels.

2. The display panel according to claim 1, wherein in a direction perpendicular to a thickness direction of the substrate and the second direction, at least a portion of the third connection sub-line in the plurality of third connection sub-lines is located in a gap between two adjacent first connection sub-lines.

3. The display panel according to claim 2, wherein the first light-transmissive layer further includes at least one third connection sub-line in the plurality of third connection sub-lines, and the third connection sub-line in the plurality of third connection sub-lines is included in the at least one third connection sub-line.

4. The display panel according to claim 3, wherein the portion of the third connection sub-line in the plurality of third connection sub-lines is located in the gap between the two adjacent first connection sub-lines;
   an orthographic projection of the third connection sub-line in the plurality of third connection sub-lines on the substrate partially overlaps with at least one orthographic projection of at least one first connection sub-line in the two adjacent first connection sub-lines on the substrate.

5. The display panel according to claim 4, wherein a dimension of an overlapping portion, in the first direction, of the orthographic projection of the third connection sub-line in the plurality of third connection sub-lines on the substrate and an orthographic projection of one first connection sub-line of the two adjacent first connection sub-lines on the substrate is less than or equal to ⅕ of a dimension of the orthographic projection, in the first direction, of the one first connection sub-line on the substrate.

6. The display panel according to claim 2, wherein the second metal layer further includes at least one third connection sub-line in the plurality of third connection sub-lines, and the third connection sub-line in the plurality of third connection sub-lines is included in the at least one third connection sub-line; and
   an orthographic projection of the third connection sub-line in the plurality of third connection sub-lines on the substrate and an orthographic projection of each of the two adjacent first connection sub-lines on the substrate do not overlap and have a distance therebetween.

7. The display panel according to claim 6, wherein the two adjacent first connection sub-lines are respectively located in the first metal layer and the second metal layer;
   a distance between the orthographic projection of the third connection sub-line in the plurality of third connection sub-lines on the substrate and an orthographic projection of a first connection sub-line located in the second metal layer on the substrate is greater than a distance between the orthographic projection of the third connection sub-line in the plurality of third connection sub-lines on the substrate and an orthographic projection of a first connection sub-line located in the first metal layer on the substrate.

8. The display panel according to claim 7, wherein the distance between the orthographic projection of the third connection sub-line in the plurality of third connection sub-lines on the substrate and the orthographic projection of the first connection sub-line located in the second metal layer on the substrate is greater than or equal to 4 µm; and
   the distance between the orthographic projection of the third connection sub-line in the plurality of third connection sub-lines on the substrate and the orthographic projection of the first connection sub-line located in the first metal layer on the substrate is greater than or equal to 1 µm.

9. The display panel according to claim 1, wherein the second light-transmissive layer further includes at least one third connection sub-line in the plurality of third connection sub-lines;
- in a thickness direction of the substrate, a distance between the first light-transmissive layer and the second metal layer is less than a distance between the second metal layer and the second light-transmissive layer.

10. The display panel according to claim 9, further comprising:
- a buffer layer and a gate insulating layer that are disposed between the first light-transmissive layer and the second metal layer and stacked in sequence; and
- a passivation layer and a planarization layer that are disposed between the second metal layer and the second light-transmissive layer;
- wherein a sum of thicknesses of the buffer layer and the gate insulating layer is less than a sum of thicknesses of the passivation layer and the planarization layer; or
- the display panel further comprising:
  - the buffer layer and the gate insulating layer that are disposed between the first light-transmissive layer and the second metal layer and stacked in sequence; and
- the passivation layer and the planarization layer that are disposed between the second metal layer and the second light-transmissive layer;
- wherein the sum of the thicknesses of the passivation layer and the planarization layer is greater than or equal to twice the sum of the thicknesses of the buffer layer and the gate insulating layer.

11. The display panel according to claim 9, wherein a dimension of the second connection sub-line in the plurality of second connection sub-lines in the first direction is 3 times to 5 times a dimension of the first connection sub-line in the first direction.

12. The display panel according to claim 1, wherein in the first direction, the at least one first connection sub-line located in the first metal layer and the at least one first connection sub-line located in the second metal layer are alternately arranged in sequence; or
- in the first direction, the at least one first connection sub-line located in the first metal layer and the at least one first connection sub-line located in the second metal layer are alternately arranged in sequence; and
- orthographic projections of any two adjacent first connection sub-lines on the substrate do not overlap.

13. The display panel according to claim 12, wherein the second metal layer further includes at least one second connection sub-line in the plurality of second connection sub-lines;
- at least one orthographic projection of the at least one second connection sub-line on the substrate and orthographic projections of the plurality of first connection sub-lines on the substrate do not overlap, and a distance exists between an orthographic projection of a second connection sub-line in the at least one second connection sub-line on the substrate and an orthographic projection of an adjacent first connection sub-line on the substrate.

14. The display panel according to claim 13, wherein at least one third connection sub-line is not located in the second metal layer; and
- an orthographic projection of a third connection sub-line in the at least one third connection sub-line on the substrate partially overlaps with an orthographic projection of the second connection sub-line in the plurality of second connection sub-lines on the substrate.

15. The display panel according to claim 1, wherein the plurality of signal transmission lines include a plurality of data lines and a plurality of sensing lines, and the plurality of first connection sub-lines include a plurality of data connection lines and a plurality of sensing connection lines;
- a data connection line in the plurality of data connection lines is electrically connected to a data line in the plurality of data lines, and a sensing connection line in the plurality of sensing connection lines is electrically connected to a sensing line in the plurality of sensing lines; and
- at least two data connection lines in the plurality of data connection lines are disposed between any two adjacent sensing connection lines in the plurality of sensing connection lines.

16. The display panel according to claim 1, wherein a shift register in the plurality of shift registers is electrically connected to at least one row of sub-pixels;
- the shift register in the plurality of shift registers includes a plurality of device groups, a device group in the plurality of device groups is located in a region between two adjacent sub-pixels in the at least one row of sub-pixels, and the device group includes at least one transistor and/or at least one capacitor; and
- the clock signal line is electrically connected to at least one shift register, and the clock signal line is located between two adjacent columns of sub-pixels.

17. A display apparatus, comprising the display panel according to claim 1.

18. The display panel according to claim 1, wherein in a direction parallel to a plane where the substrate is located, at least a portion of the third connection sub-line in the plurality of third connection sub-lines is located in a gap between two adjacent first connection sub-lines.

19. The display panel according to claim 18, wherein a dimension of the second connection sub-line in the plurality of second connection sub-lines in the first direction is 1.5 times to 2.5 times a dimension of the first connection sub-line in the first direction.

20. A display panel having a display area and a fan-out region located on a side of the display area; the display panel comprising:
- a substrate;
- a plurality of sub-pixels and a plurality of signal transmission lines located in the display area, wherein the plurality of sub-pixels are arranged in a plurality of rows and a plurality of columns, sub-pixels in a row are arranged along a first direction, and sub-pixels in a column are arranged along a second direction, and a signal transmission line in the plurality of signal transmission lines is electrically connected to at least one column of sub-pixels;
- a scan driving circuit including a plurality of shift registers and a plurality of clock signal lines that are located in the display area;
- a power supply voltage bus located in the fan-out region and extending along the first direction; and
- a plurality of connection lines located in the fan-out region, wherein the plurality of connection lines, the plurality of sub-pixels, the plurality of signal transmission lines, the scan driving circuit and the power supply voltage bus are located on a same side of the substrate, and the plurality of connection lines extend along the second direction and are located closer to a side of the fan-out region away from the display area than the power supply voltage bus;

wherein the plurality of connection lines include a plurality of first connection sub-lines, a plurality of second connection sub-lines and a plurality of third connection sub-lines;

a first connection sub-line in the plurality of first connection sub-lines is electrically connected to the signal transmission line in the plurality of signal transmission lines, a second connection sub-line in the plurality of second connection sub-lines is electrically connected to the power supply voltage bus, and a third connection sub-line in the plurality of third connection sub-lines is electrically connected to a clock signal line in the plurality of clock signal lines; and in a direction parallel to a plane where the substrate is located, at least a portion of the third connection sub-line in the plurality of third connection sub-lines is located in a gap between two adjacent first connection sub-lines.

\* \* \* \* \*